(12) United States Patent
Toda

(10) Patent No.: US 9,368,197 B2
(45) Date of Patent: Jun. 14, 2016

(54) MEMORY SYSTEM

(71) Applicant: Kabushiki Kaisha Toshiba, Minato-ku (JP)

(72) Inventor: Haruki Toda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 95 days.

(21) Appl. No.: 14/203,889

(22) Filed: Mar. 11, 2014

(65) Prior Publication Data
US 2015/0213886 A1 Jul. 30, 2015

Related U.S. Application Data

(60) Provisional application No. 61/933,107, filed on Jan. 29, 2014.

(51) Int. Cl.
*G11C 11/409* (2006.01)
*G11C 13/00* (2006.01)
*G11C 11/56* (2006.01)
(Continued)

(52) U.S. Cl.
CPC .......... *G11C 13/0011* (2013.01); *G11C 7/1006* (2013.01); *G11C 11/56* (2013.01); *G11C 11/5614* (2013.01); *G11C 11/5678* (2013.01); *G11C 13/0004* (2013.01); *G11C 13/004* (2013.01); *G11C 13/0069* (2013.01); *G11C 13/025* (2013.01); *H01L 27/249* (2013.01); *H01L 27/2436* (2013.01); *H01L 27/2454* (2013.01); *H01L 45/04* (2013.01); *H01L 45/065* (2013.01); *H01L 45/1226* (2013.01); *H01L 45/1266* (2013.01); *H01L 45/149* (2013.01); *G11C 2013/0054* (2013.01); *G11C 2213/71* (2013.01)

(58) Field of Classification Search
CPC ...................................................... G11C 11/56
USPC ............................................................ 365/148
See application file for complete search history.

(56) References Cited

U.S. PATENT DOCUMENTS 7,989,789 B2   8/2011   Toda
8,023,313 B2   9/2011   Toda
(Continued)

FOREIGN PATENT DOCUMENTS

JP   2005-522045   7/2005
JP   2005-285161   10/2005
(Continued)

OTHER PUBLICATIONS

U.S. Appl. No. 14/480,951, filed Sep. 9, 2014, Toda.

*Primary Examiner* — Min Huang
(74) *Attorney, Agent, or Firm* — Oblon, McClelland, Maier & Neustadt, L.L.P

(57) ABSTRACT

A memory system according to the embodiment comprises a cell array of plural cells having three or more settable physical quantity levels and operative to store a code composed of symbols expressed by elements in a finite field Zp (p is a prime), wherein a set of two cells is defined as a pair cell and a combination of physical quantity levels of the two cells contained in the pair cell is defined as a pair cell level, wherein the pair cell uses a pair cell level of plural pair cell levels, which maximizes or minimizes a physical quantity level of one cell contained in the pair cell, to assign elements in the Zp to the pair cell levels, thereby storing symbols of the code.

6 Claims, 37 Drawing Sheets

(51) Int. Cl.
  *G11C 7/10*    (2006.01)
  *G11C 13/02*   (2006.01)
  *H01L 45/00*   (2006.01)
  *H01L 27/24*   (2006.01)

(56) References Cited

U.S. PATENT DOCUMENTS

| | | | |
|---|---|---|---|
| 8,448,051 B2 | 5/2013 | Toda | |
| 8,467,237 B2 | 6/2013 | Bedeschi et al. | |
| 8,595,592 B2 | 11/2013 | Toda | |
| 8,661,319 B2 | 2/2014 | Toda | |
| 2012/0079331 A1 | 3/2012 | Toda | |
| 2012/0151123 A1 | 6/2012 | Toda | |
| 2012/0261638 A1* | 10/2012 | Sills | H01L 27/2463 257/5 |
| 2013/0043455 A1* | 2/2013 | Bateman | H01L 27/2454 257/5 |
| 2013/0044531 A1* | 2/2013 | Baek | G11C 5/025 365/72 |
| 2013/0235648 A1* | 9/2013 | Kim | G11C 13/0064 365/148 |
| 2013/0250652 A1 | 9/2013 | Toda | |
| 2013/0294145 A1* | 11/2013 | Sandhu | H01L 45/08 365/148 |
| 2014/0009997 A1 | 1/2014 | Toda | |
| 2014/0050010 A1 | 2/2014 | Toda | |

FOREIGN PATENT DOCUMENTS

| | | |
|---|---|---|
| JP | 2010-55719 | 3/2010 |
| JP | 2011-198253 | 10/2011 |
| JP | 2012-68900 | 4/2012 |
| JP | 2012-68993 | 4/2012 |
| JP | 2012-94234 | 5/2012 |
| JP | 2012-123600 | 6/2012 |
| JP | 2012-203936 | 10/2012 |
| JP | 2013-122797 | 6/2013 |
| JP | 2013-200929 | 10/2013 |
| JP | 2013-200930 | 10/2013 |

* cited by examiner

FIG. 37
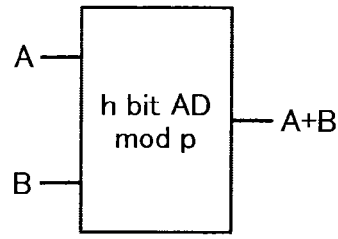
FIG. 38
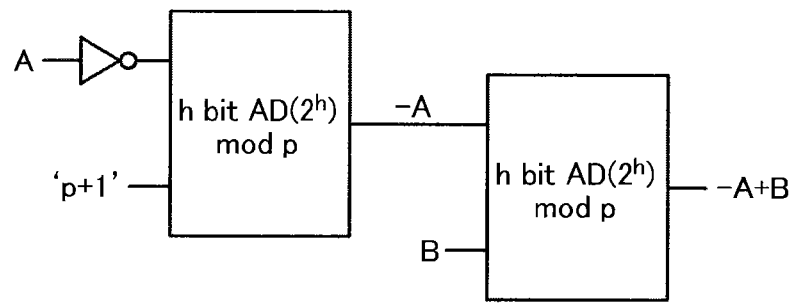
FIG. 39
| p=11 | ( )² | ( )³ | ( )⁴ | ( )⁵ | ( )⁶ | ( )⁷ | ( )⁸ | ( )⁹ |
|---|---|---|---|---|---|---|---|---|
| 2 | 4 | 8 | 5 | 10 | 9 | 7 | 3 | 6 |
| 3 | 9 | 5 | 4 | 1 | 3 | 9 | 5 | 4 |
| 4 | 5 | 9 | 3 | 1 | 4 | 5 | 9 | 3 |
| 5 | 3 | 4 | 9 | 1 | 5 | 3 | 4 | 9 |
| 6 | <u>3</u> | 7 | <u>9</u> | 10 | <u>5</u> | 8 | <u>4</u> | 2 |
| 7 | <u>5</u> | 2 | <u>3</u> | 10 | <u>4</u> | 6 | <u>9</u> | 8 |
| 8 | <u>9</u> | 6 | <u>4</u> | 10 | <u>3</u> | 2 | <u>5</u> | 7 |
| 9 | <u>4</u> | 3 | <u>5</u> | 1 | <u>9</u> | 4 | <u>3</u> | 5 |
| 10 | <u>1</u> | 10 | <u>1</u> | 10 | <u>1</u> | 10 | <u>1</u> | 10 |

FIG. 40

| p=13 | ( )² | ( )³ | ( )⁴ | ( )⁵ | ( )⁶ | ( )⁷ | ( )⁸ | ( )⁹ | ( )¹⁰ | ( )¹¹ |
|---|---|---|---|---|---|---|---|---|---|---|
| 2 | 4 | 8 | 3 | 6 | 12 | 11 | 9 | 5 | 10 | 7 |
| 3 | 9 | 1 | 3 | 9 | 1 | 3 | 9 | 1 | 3 | 9 |
| 4 | 3 | 12 | 9 | 10 | 1 | 4 | 3 | 12 | 9 | 10 |
| 5 | 12 | 8 | 1 | 5 | 12 | 8 | 1 | 5 | 12 | 8 |
| 6 | 10 | 8 | 9 | 2 | 12 | 7 | 3 | 5 | 4 | 11 |
| 7 | 10 | 5 | 9 | 11 | 12 | 6 | 3 | 8 | 4 | 2 |
| 8 | 12 | 5 | 1 | 8 | 12 | 4 | 1 | 8 | 12 | 5 |
| 9 | 3 | 1 | 9 | 3 | 1 | 8 | 3 | 1 | 9 | 3 |
| 10 | 9 | 12 | 3 | 4 | 1 | 10 | 9 | 12 | 3 | 4 |
| 11 | 4 | 5 | 3 | 7 | 12 | 2 | 9 | 7 | 10 | 6 |
| 12 | 1 | 12 | 1 | 12 | 1 | 12 | 1 | 12 | 1 | 12 |

FIG. 41

| p=17 | ( )² | ( )³ | ( )⁴ | ( )⁵ | ( )⁶ | ( )⁷ | ( )⁸ | ( )⁹ | ( )¹⁰ | ( )¹¹ | ( )¹² | ( )¹³ | ( )¹⁴ | ( )¹⁵ |
|---|---|---|---|---|---|---|---|---|---|---|---|---|---|---|
| 2 | 4 | 8 | 16 | 15 | 13 | 9 | 1 | 2 | 4 | 8 | 16 | 15 | 13 | 9 |
| 3 | 9 | 10 | 13 | 5 | 15 | 11 | 16 | 14 | 8 | 7 | 4 | 12 | 2 | 6 |
| 4 | 16 | 13 | 1 | 4 | 16 | 13 | 1 | 4 | 16 | 13 | 1 | 4 | 16 | 13 |
| 5 | 8 | 6 | 13 | 14 | 2 | 10 | 16 | 12 | 9 | 11 | 4 | 3 | 15 | 7 |
| 6 | 2 | 12 | 4 | 7 | 8 | 14 | 16 | 11 | 15 | 5 | 13 | 10 | 9 | 3 |
| 7 | 15 | 3 | 4 | 11 | 9 | 12 | 16 | 10 | 2 | 14 | 13 | 6 | 8 | 5 |
| 8 | 13 | 2 | 16 | 9 | 4 | 15 | 1 | 8 | 13 | 2 | 16 | 9 | 4 | 15 |
| 9 | 13 | 15 | 16 | 8 | 4 | 2 | 1 | 9 | 13 | 15 | 16 | 8 | 4 | 2 |
| 10 | 15 | 14 | 4 | 6 | 9 | 5 | 16 | 7 | 2 | 3 | 13 | 11 | 8 | 12 |
| 11 | 2 | 5 | 4 | 10 | 8 | 3 | 16 | 6 | 15 | 12 | 13 | 7 | 9 | 14 |
| 12 | 8 | 11 | 13 | 3 | 2 | 7 | 16 | 5 | 9 | 6 | 4 | 14 | 15 | 10 |
| 13 | 16 | 4 | 1 | 13 | 16 | 4 | 1 | 13 | 16 | 4 | 1 | 13 | 16 | 4 |
| 14 | 9 | 7 | 13 | 12 | 15 | 6 | 16 | 3 | 8 | 10 | 4 | 5 | 2 | 11 |
| 15 | 4 | 9 | 16 | 2 | 13 | 8 | 1 | 15 | 4 | 9 | 16 | 2 | 13 | 8 |
| 16 | 1 | 16 | 1 | 16 | 1 | 16 | 1 | 16 | 1 | 16 | 1 | 16 | 1 | 16 |

FIG. 42

| p=17 | $()^2$ | $()^3$ | $()^4$ | $()^5$ | $()^6$ | $()^7$ | $()^8$ | $()^9$ | $()^{10}$ | $()^{11}$ | $()^{12}$ | $()^{13}$ | $()^{14}$ | $()^{15}$ | $()^{16}$ | $()^{17}$ |
|---|---|---|---|---|---|---|---|---|---|---|---|---|---|---|---|---|
| 2  | 4  | 8  | 15 | 13 | 7  | 14 | 9  | 18 | 17 | 15 | 11 | 3  | 6  | 12 | 5  | 10 |
| 3  | 9  | 8  | 5  | 15 | 7  | 2  | 6  | 18 | 16 | 10 | 11 | 14 | 4  | 12 | 17 | 13 |
| 4  | 16 | 7  | 9  | 17 | 11 | 6  | 5  | 1  | 4  | 16 | 7  | 9  | 17 | 11 | 6  | 5  |
| 5  | 6  | 11 | 4  | 9  | 7  | 16 | 4  | 1  | 5  | 6  | 11 | 4  | 9  | 7  | 16 | 4  |
| 6  | 17 | 7  | 7  | 5  | 11 | 9  | 16 | 1  | 6  | 17 | 7  | 7  | 5  | 11 | 9  | 16 |
| 7  | 11 | 1  | 11 | 11 | 1  | 7  | 11 | 18 | 7  | 11 | 1  | 11 | 11 | 1  | 7  | 11 |
| 8  | 7  | 18 | 6  | 12 | 1  | 8  | 7  | 1  | 8  | 12 | 11 | 8  | 16 | 11 | 4  | 12 |
| 9  | 5  | 7  | 6  | 16 | 11 | 4  | 17 | 18 | 9  | 5  | 7  | 6  | 16 | 11 | 4  | 17 |
| 10 | 5  | 12 | 6  | 3  | 11 | 15 | 17 | 18 | 9  | 14 | 7  | 13 | 16 | 8  | 4  | 2  |
| 11 | 7  | 1  | 11 | 7  | 1  | 11 | 7  | 1  | 11 | 7  | 1  | 11 | 7  | 1  | 11 | 7  |
| 12 | 11 | 18 | 7  | 8  | 1  | 12 | 11 | 18 | 7  | 8  | 1  | 12 | 11 | 18 | 7  | 8  |
| 13 | 17 | 12 | 4  | 14 | 11 | 10 | 11 | 18 | 6  | 2  | 7  | 15 | 5  | 8  | 9  | 3  |
| 14 | 6  | 8  | 17 | 10 | 7  | 3  | 16 | 18 | 5  | 13 | 11 | 2  | 9  | 12 | 16 | 15 |
| 15 | 16 | 12 | 9  | 2  | 11 | 13 | 4  | 1  | 4  | 3  | 7  | 10 | 17 | 8  | 6  | 14 |
| 16 | 9  | 11 | 5  | 4  | 7  | 17 | 5  | 1  | 16 | 9  | 11 | 5  | 4  | 7  | 17 | 5  |
| 17 | 4  | 11 | 16 | 6  | 7  | 5  | 6  | 18 | 17 | 4  | 11 | 16 | 6  | 7  | 5  | 6  |
| 18 | 1  | 18 | 1  | 18 | 1  | 18 | 1  | 18 | 1  | 18 | 1  | 18 | 1  | 18 | 1  | 18 |

FIG. 45

| | | Case 1  $\Psi_2 \neq 0$  $\Psi_2 \neq \Psi_1^2$ | Case 2  $\Psi_2 \neq 0$  $\Psi_2 = \Psi_1^2$ | Case 3  $\Psi_1 \neq 0$  $\Psi_2 = 0$ |
|---|---|---|---|---|
| $S_0 \equiv 2$ | J+ | $\Psi_2 X^2 + \Psi_1 X + 1 = 0$ | $\Psi_2 X^2 + \Psi_1 X + 1 = 0$ | □ |
| | J− | □ | □ | □ |
| $S_0 \equiv 1$ | J+ | □ | □ | $\Psi_1 X + 1 = 0$ |
| | J− | □ | □ | □ |
| $S_0 \equiv 0$ | J+ | $(\Psi_1^2 - \Psi_2) X + \Psi_1 = 0$ | □ | □ |
| | J− | $X - \Psi_1 / \Psi_2 = 0$ | □ | □ |
| $S_0 \equiv -1$ | J+ | □ | □ | □ |
| | J− | □ | $X - \Psi_1 / \Psi_2 = 0$ | □ |
| $S_0 \equiv -2$ | J+ | □ | □ | □ |
| | J− | $X^2 - [\Psi_1 / (\Psi_1^2 - \Psi_2)] X + 1 / (\Psi_1^2 - \Psi_2) = 0$ | | $X^2 - (1/\Psi_1) X + 1/\Psi_1^2 = 0$ |

FIG. 46

| p=11 | ( )⁻¹ | ( )² | ( )^(1/2) |
|---|---|---|---|
| 1 | 1 | 1 | 1,10 |
| 2 | 6 | 4 | – |
| 3 | 4 | 9 | 5,6 |
| 4 | 3 | 5 | 2,9 |
| 5 | 9 | 3 | 4,7 |
| 6 | 2 | 3 | – |
| 7 | 8 | 5 | – |
| 8 | 7 | 9 | – |
| 9 | 5 | 4 | 3,8 |
| 10 | 10 | 1 | – |

FIG. 47

| p=13 | ( )⁻¹ | ( )² | ( )^(1/2) |
|---|---|---|---|
| 1 | 1 | 1 | 1,12 |
| 2 | 7 | 4 | – |
| 3 | 9 | 9 | 4,9 |
| 4 | 10 | 3 | 2,11 |
| 5 | 8 | 12 | – |
| 6 | 11 | 10 | – |
| 7 | 2 | 10 | – |
| 8 | 5 | 12 | – |
| 9 | 3 | 3 | 3,10 |
| 10 | 4 | 9 | 6,7 |
| 11 | 6 | 4 | – |
| 12 | 12 | 1 | 5,8 |

FIG. 48

| p=17 | ( )⁻¹ | ( )² | ( )^(1/2) |
|---|---|---|---|
| 1 | 1 | 1 | 1,16 |
| 2 | 9 | 4 | 6,11 |
| 3 | 6 | 9 | – |
| 4 | 13 | 16 | 2,15 |
| 5 | 7 | 8 | – |
| 6 | 3 | 2 | – |
| 7 | 5 | 15 | – |
| 8 | 15 | 13 | 5,12 |
| 9 | 2 | 13 | 3,14 |
| 10 | 12 | 15 | – |
| 11 | 14 | 2 | – |
| 12 | 10 | 8 | – |
| 13 | 4 | 16 | 8,9 |
| 14 | 11 | 9 | – |
| 15 | 8 | 4 | 7,10 |
| 16 | 16 | 1 | 4,13 |

FIG. 49

| p=19 | ( )⁻¹ | ( )² | ( )^(1/2) |
|---|---|---|---|
| 1 | 1 | 1 | 1,16 |
| 2 | 10 | 4 | – |
| 3 | 13 | 9 | – |
| 4 | 5 | 16 | 2,17 |
| 5 | 4 | 6 | 9,10 |
| 6 | 16 | 17 | 5,14 |
| 7 | 11 | 11 | 8,11 |
| 8 | 12 | 7 | – |
| 9 | 17 | 5 | 3,16 |
| 10 | 2 | 5 | – |
| 11 | 7 | 7 | 7,12 |
| 12 | 8 | 11 | – |
| 13 | 3 | 17 | – |
| 14 | 15 | 6 | – |
| 15 | 14 | 16 | – |
| 16 | 6 | 9 | 4,15 |
| 17 | 9 | 4 | 6,13 |
| 18 | 18 | 1 | – |

MEMORY SYSTEM

CROSS-REFERENCE TO RELATED APPLICATIONS

This application is based upon and claims the benefit of priority from the prior U.S. Provisional Application 61/933, 107, filed on Jan. 29, 2014, the entire contents of which are incorporated herein by reference.

BACKGROUND

1. Field

The embodiment of the present invention relates to a memory system.

2. Description of the Related Art

As memory systems capable of storing mass data for use, variable resistance memories including cell arrays easily formable in three dimensions, such as a ReRAM (Resistance RAM) and an ion memory, have received attention.

In these memory systems, as one of methods for raising the density of information storage, there is a method of fine pattering a cell array. The use of this method, however, requires higher technologies and causes a problem about cost rises. Another method includes multi-valuing a cell. This method is an effective method because it causes almost no cost rise. In the case of this method, however, physical quantity levels of a cell become unstable. Therefore, unprecedented different ideas are required for writing data to a cell, storing data by a cell and reading data from a cell.

BRIEF DESCRIPTION OF THE DRAWINGS

FIG. 37 is a diagram showing a block symbol of a circuit block in the memory system according to the embodiment.

FIG. 38 is a circuit diagram of a computation block in the memory system according to the embodiment.

FIG. 39 is a power correspondence table of elements in Zp in the memory system according to the embodiment.

FIG. 40 is a power correspondence table of elements in Zp in the memory system according to the embodiment.

FIG. 41 is a power correspondence table of elements in Zp in the memory system according to the embodiment.

FIG. 42 is a power correspondence table of elements in Zp in the memory system according to the embodiment.

FIG. 45 is a table showing divergences and syndromes of a searching equation of Zp in the memory system according to the embodiment.

FIG. 46 is a correspondence table of elements in Zp, and inverse elements, squares and square roots thereof in the memory system according to the embodiment.

FIG. 47 is a correspondence table of elements in Zp, and inverse elements, squares and square roots thereof in the memory system according to the embodiment.

FIG. 48 is a correspondence table of elements in Zp, and inverse elements, squares and square roots thereof in the memory system according to the embodiment.

FIG. 49 is a correspondence table of elements in Zp, and inverse elements, squares and square roots thereof in the memory system according to the embodiment.

DETAILED DESCRIPTION

Figure 1:
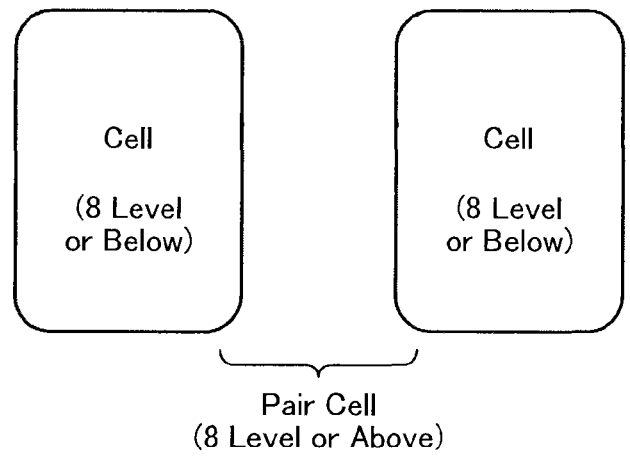
FIG. 1 is a diagram illustrative of an outline of a pair cell in a memory system according to the embodiment.

A memory system according to the embodiment comprises a cell array of plural cells having three or more settable physical quantity levels and operative to store a code composed of symbols expressed by elements in a finite field Zp (p is a prime), wherein a set of two cells is defined as a pair cell and a combination of physical quantity levels of the two cells contained in the pair cell is defined as a pair cell level, wherein the pair cell uses a pair cell level of plural pair cell levels, which maximizes or minimizes a physical quantity level of one cell contained in the pair cell, to assign elements in the Zp to the pair cell levels, thereby storing symbols of the code.

A memory system according to the embodiment is described below with reference to the drawings.

In multi-valuing a cell in a resistance variable memory, a problem arises because it is difficult to definitely write multi-values to a cell. This is because physical quantity levels or resistance values of the cell and voltage/current conditions are determined by indefinite statistical relations. In the case of a phase change memory of variable resistance memories, as a resistance value drift is large, a relative code is used in data reading for multi-valuing. In the case of a cell, in which the presence/absence of a metal filament is assigned to a storage state, the filament is unstable. Accordingly, the filament or retention is stabilized, thereby stabilizing the resistance value for multi-valuing. In the case of a memory, in which nanotubes (hereinafter also referred to as "NT"s) such as carbon nanotubes (hereinafter also referred to as "CNT"s) are stacked in a cell (hereinafter also referred to as a "NT stack cell"), the set resistance is maintained stable by the work of inter-molecular forces. Even in the case of the NT stack memory, however, it is difficult to set a definite resistance value as described above. Therefore, making practical a resistance variable memory including multi-valued cells requires studies of methods for ensuring the reliability of data. Hereinafter, the stacked NTs may also be referred to as a "NT stack", and a memory including NT stack cells as an "NT stack memory".

Then, in the embodiment, the NT stack memory is used as an example to handle methods of multi-value writing, which are effective in the overall memories including cells having indefinite resistance values and voltage/current conditions. In compensation for the indefiniteness of multi-value writing, this example applies a method of writing a Lee metric code (hereinafter also referred to as an "LMC"), which is a fast ECC (Error Correction Code), to a pair of cells (hereinafter referred to as a "pair cell"). This makes it possible to simplify verification and so forth at the time of resistance value setting and additionally suppress the number λ of cells per information bit. If λ<1 can be achieved, it is possible to exert an effect corresponding to a shrink equal to λ-times a memory chip size. This is not a shrink through processes and accordingly it can be realized without any increase in process step costs.

The memory system according to the embodiment will now be described below specifically.

First, an outline of a multi-valued pair cell is described.

FIG. 1 is a diagram illustrative of an outline of a pair cell in a memory system according to the embodiment.

For relatively stable setting of resistance values other than on/off to a cell in a resistance variable memory, the maximum number of levels assigned to resistance values can be considered equal to around eight. If more levels are assigned, statistical variations in cells allow no error in resistance values to be suppressed within one level. On the other hand, for increasing the quantity of information stored in a cell, it is desired to assign as many levels as possible to resistance values. Thus, it is required to assign eight levels or more at least. Then, in consideration of the magnitude of the burden on setting multi-levels to a cell alone, the embodiment uses a pair cell to reduce the burden. A method of setting resistance values is described, which increases the number of resistance value levels settable in a pair cell as a unit to increase the storage capacity of a memory while compensates for the increase in cell share caused by the use of the pair cell to raise the information density. In this method, resistance value levels are assigned to information values so that failed resistance value setting causes the minimum variation in information value, thereby utilizing the LMC efficiently. Specifically, a prime p is assigned to resistance value levels of a pair cell so that an error-caused variation in resistance value level of a pair cell falls within space between successive values of information.

The following description is given to assignments of information values to combinations of resistance value levels of a pair cell composed of 4-level/cell cells (hereinafter also simply referred to as "states of a pair cell" (pair cell levels)).

Figure 2:
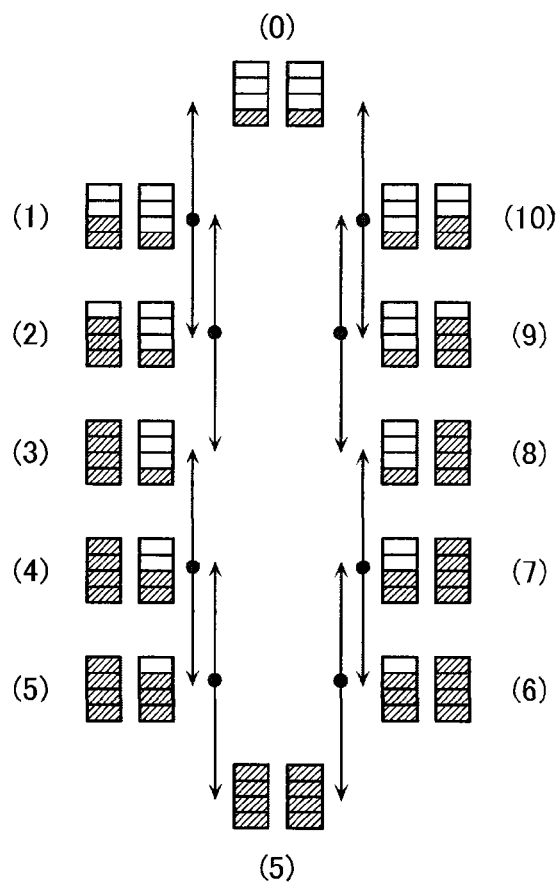
FIG. 2 is a diagram illustrative of assignments of information values to states of the pair cell in the memory system according to the embodiment.

FIG. 2 is a diagram illustrative of assignments of information values to states of a pair cell in the memory system according to the embodiment. A numeral in ( ) of FIG. 2 indicates the corresponding information value. A bar graph in FIG. 2 schematically indicates cell current flowing when a certain voltage is applied across a cell so that a larger hatched part indicates a larger flow of cell current. It is assumed that a high resistance state with the lowest cell current and a low resistance state with the highest cell current can be set without causing failed setting. On the precondition of this assumption, it is desired that failed setting is not caused simultaneously in resistance values of two cells contained in the pair cell. Therefore, one cell in the pair cell is always set to a high resistance state or a low resistance state that allows cell current to become the lowest or the highest.

In the case of 4-level/cell, states of a pair cell vary in 12 ways. As an LMC utilizes a residue field of a prime p, information values are assigned to states of the pair cell where p=11. At this time, the assignment is executed in such a manner that one level error in resistance value of a cell caused by failed setting of a state of the pair cell becomes an error falling within a range of an information value ±1. As shown in FIG. 2, an information value 5 is assigned to two states of the pair cell so that a residue field of p=11 is assigned to 12 states of the pair cell. In this case, the precondition prevents failed setting from arising in two cells of the pair cell simultaneously. Therefore, as shown with the arrows in FIG. 2, failed writing is only allowed to occur between successive information values.

The efficiency of assignments of information values in FIG. 2 is described here in relation to the LMC.

As an error in information value falls within a range of ±1, error correction is sufficient if it is ready for $\epsilon=1$ where $\epsilon$ is the maximum value of error correctable Lee metrics. In this example, however, error correction is made ready for $\epsilon=2$. This enables error correction when errors within a range of ±1 occur in two code symbols of a code having a length of p−1, and when an error within a range of ±2 occurs in one code symbol of the code.

An LMC ECC of p=11 and $\epsilon=2$ has a code length n=p−1=10 code symbols of which symbols usable as data are equal to k=n−($\epsilon$+1)=7 in number. In addition, the number of information bits storable in two cells is equal to $\log_2 11$. Therefore, the number of cells/bit becomes $\lambda=(2n)/(k \log_2 p)=0.826$.

In a word, according to the example of assignments of information values in FIG. 2, even if the reliability of data is maintained by ECC while using the pair cell, the cell occupation area can be shrunk by 0.826 times.

The following description is given to assignments of information values to states of a pair cell composed of 5-level/cell cells.

Figure 3:
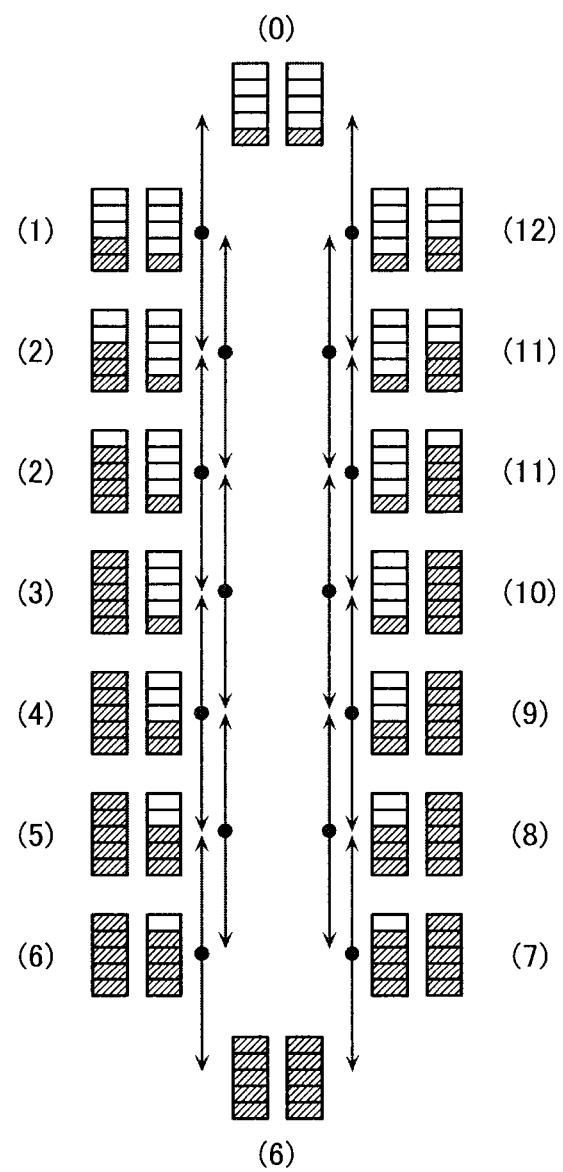
FIG. 3 is a diagram illustrative of assignments of information values to states of the pair cell in the memory system according to the embodiment.

FIG. 3 is a diagram illustrative of assignments of information values to states of a pair cell in the memory system according to the embodiment. The viewpoint, precondition and so forth in FIG. 3 are similar to those of FIG. 2.

In the case of 5-level/cell, states of a pair cell vary in 16 ways. As an LMC utilizes a residue field of a prime p, information values are assigned to states of the pair cell where p=13. At this time, the assignment is executed in such a manner that one level error in resistance value of a cell caused by failed setting of a state of the pair cell becomes an error falling within a range of an information value ±1. As shown in FIG. 3, information values 2, 6 and 11 are each assigned to two states of the pair cell so that a residue field of p=13 is assigned to 16 states of the pair cell. In this case, the precondition prevents failed setting from arising in two cells of the pair cell simultaneously. Therefore, as shown with the arrows in FIG. 3, failed writing is only allowed to occur between successive information values.

The efficiency of assignments of information values in FIG. 3 is described here in relation to the LMC.

As an error in information value falls within a range of ±1, error correction is sufficient if it is ready for $\epsilon=1$. In this example, however, error correction is made ready for $\epsilon=2$. This enables error correction when errors within a range of ±1 occur in two code symbols of a code having a length of p−1, and when an error within a range of ±2 occurs in one code symbol of the code.

An LMC ECC of p=13 and $\epsilon=2$ has a code length n=p−1=12 code symbols of which symbols usable as data are equal to k=n−($\epsilon$+1)=9 in number. In addition, the number of information bits storable in two cells is equal to $\log_2 13$. Therefore, the number of cells/bit becomes $\lambda=(2n)/(k \log_2 p)=0.721$.

In a word, according to the example of assignments of information values in FIG. 3, even if the reliability of data is maintained by ECC while using the pair cell, the cell occupation area can be shrunk by 0.721 times.

The following description is given to assignments of information values to states of a pair cell composed of 6-level/cell cells.

Figure 4:
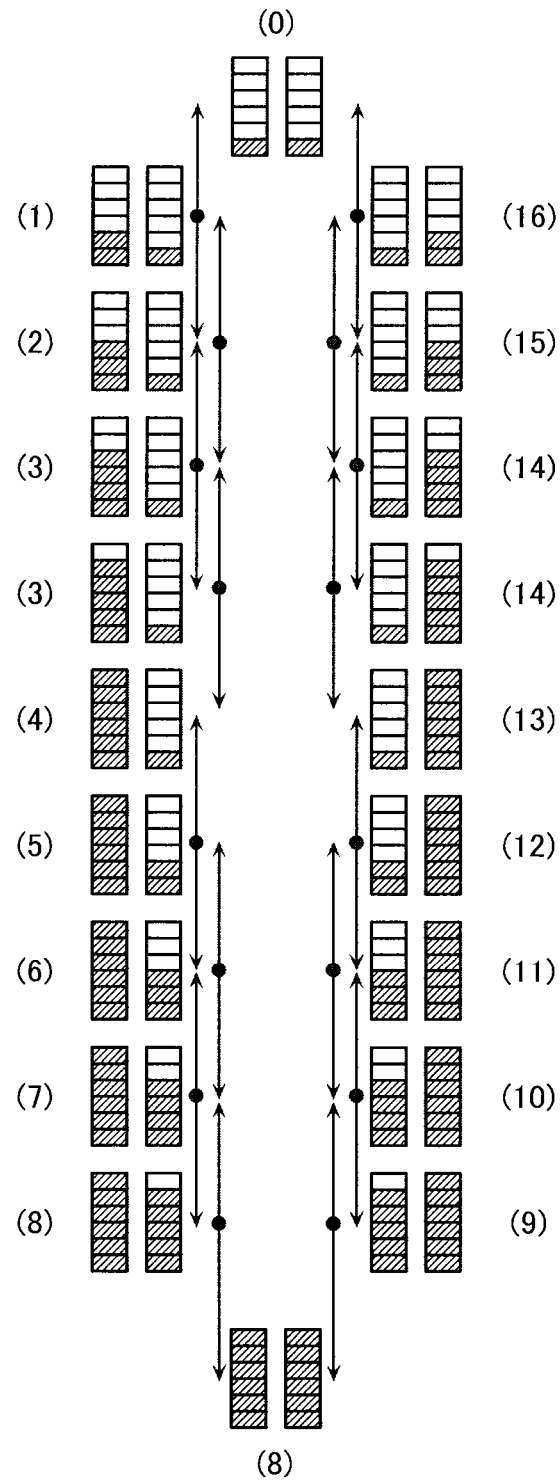
FIG. 4 is a diagram illustrative of assignments of information values to states of the pair cell in the memory system according to the embodiment.

FIG. 4 is a diagram illustrative of assignments of information values to states of the pair cell in the memory system according to the embodiment. The viewpoint, precondition and so forth in FIG. 4 are similar to those of FIG. 2.

In the case of 6-level/cell, states of a pair cell vary in 20 ways. As an LMC utilizes a residue field of a prime p, information values are assigned to states of the pair cell where p=17. At this time, the assignment is executed in such a manner that one level error in resistance value of a cell caused by failed setting of a state of the pair cell becomes an error falling within a range of an information value ±1. As shown in FIG. 4, information values 3, 8 and 14 are each assigned to two states of the pair cell so that a residue field of p=17 is assigned to 20 states of the pair cell. In this case, the precondition prevents failed setting from arising in two cells of the pair cell simultaneously. Therefore, as shown with the arrows in FIG. 4, failed writing is only allowed to occur between successive information values.

The efficiency of assignments of information values in FIG. 4 is described here in relation to the LMC.

As an error in information value falls within a range of ±1, error correction is sufficient if it is ready for $\epsilon=1$. In this example, however, error correction is made ready for $\epsilon=2$. In this case, error correction is possible when errors within a range of ±1 occur in two code symbols of a code having a length of p−1, and when an error within a range of ±2 occurs in one code symbol of the code.

An LMC ECC of p=17 and $\epsilon=2$ has a code length n=p−1=16 code symbols of which symbols usable as data are equal to k=n−($\epsilon$+1)=13 in number. In addition, the number of information bits expressible by symbols composed of two cells is equal to $\log_2 13$. Therefore, the number of cells/bit becomes $\lambda=(2n)/(k \log_2 p)=0.602$.

In a word, according to the example of assignments of information values in FIG. 4, even if the reliability of data is maintained by ECC while using the pair cell, the cell occupation area can be shrunk by 0.602 times.

The following description is given to other assignments of information values to states of a pair cell composed of 6-level/cell cells.

Figure 5:
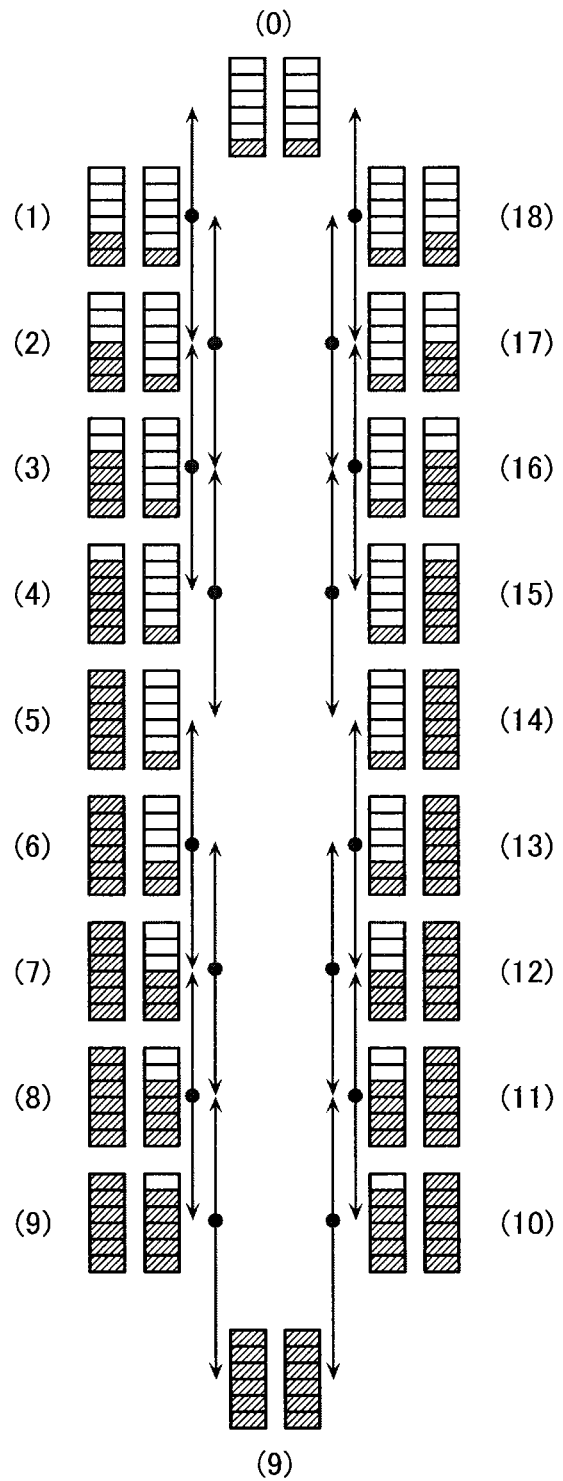
FIG. 5 is a diagram illustrative of assignments of information values to states of the pair cell in the memory system according to the embodiment.

FIG. 5 is a diagram illustrative of assignments of information values to states of the pair cell in the memory system according to the embodiment. FIG. 5 shows an instance of a prime p=19. The viewpoint, precondition and so forth in FIG. 5 are similar to those of FIG. 2.

In the case of 6-level/cell, states of a pair cell vary in 20 ways. As an LMC utilizes a residue field of a prime p, information values are assigned to states of the pair cell where p=19. At this time, the assignment is executed in such a manner that one level error in resistance value of a cell caused by failed setting of a state of the pair cell becomes an error falling within a range of an information value ±1. As shown in FIG. 5, an information value 9 is assigned to two states of the pair cell so that a residue field of p=19 is assigned to 20 states of the pair cell. In this case, the precondition prevents failed setting from arising in two cells of the pair cell simultaneously. Therefore, as shown with the arrows in FIG. 5, failed writing is only allowed to occur between successive information values.

The effect of assignments of information values in FIG. 5 is described here in relation to the LMC.

As an error in information value falls within a range of ±1, error correction is sufficient if it is ready for $\epsilon=1$. In this example, however, error correction is made ready for $\epsilon=2$. This enables error correction when errors within a range of ±1 occur in two code symbols of a code having a length of p−1, and when an error within a range of ±2 occurs in one code symbol of the code.

An LMC ECC of p=19 and $\epsilon=2$ has a code length n=p−1=18 code symbols of which symbols usable as data are equal to k=n−($\epsilon$+1)=15 in number. In addition, the number of information bits storable in two cells is equal to $\log_2 19$. Therefore, the number of cells/bit becomes $\lambda=(2n)/(k \log_2 p)=0.565$.

In a word, according to the example of assignments of information values in FIG. 5, even if the reliability of data is maintained by ECC while using the pair cell, the cell occupation area can be shrunk by 0.565 times.

The following description is given to multi-value writing to a cell in a variable resistance memory.

There are several types of variable resistance memory cells. They are though roughly divided into the type that causes a variation in resistance value in accordance with formation of a filament by metal ions and the type that causes a variation in resistance value in accordance with contacts between molecules such as CNTs. The latter type of those can be considered as an aggregation of micro-switches in a sense. Therefore, the latter type is such that the cell resistance value is stable, the retention property is excellent, and cell multi-valuing is relatively easy. On the other hand, the former type (hereinafter also referred to as the "filament type") is such that the filament itself is unstable and therefore the retention property is poor, and cell multi-valuing is relatively difficult.

Even a cell of the filament type, multi-valuing can be realized by thinking filament formation processes. Then, filament formation processes for realizing multi-valuing a cell are described with reference to FIG. 6.

Figure 6:
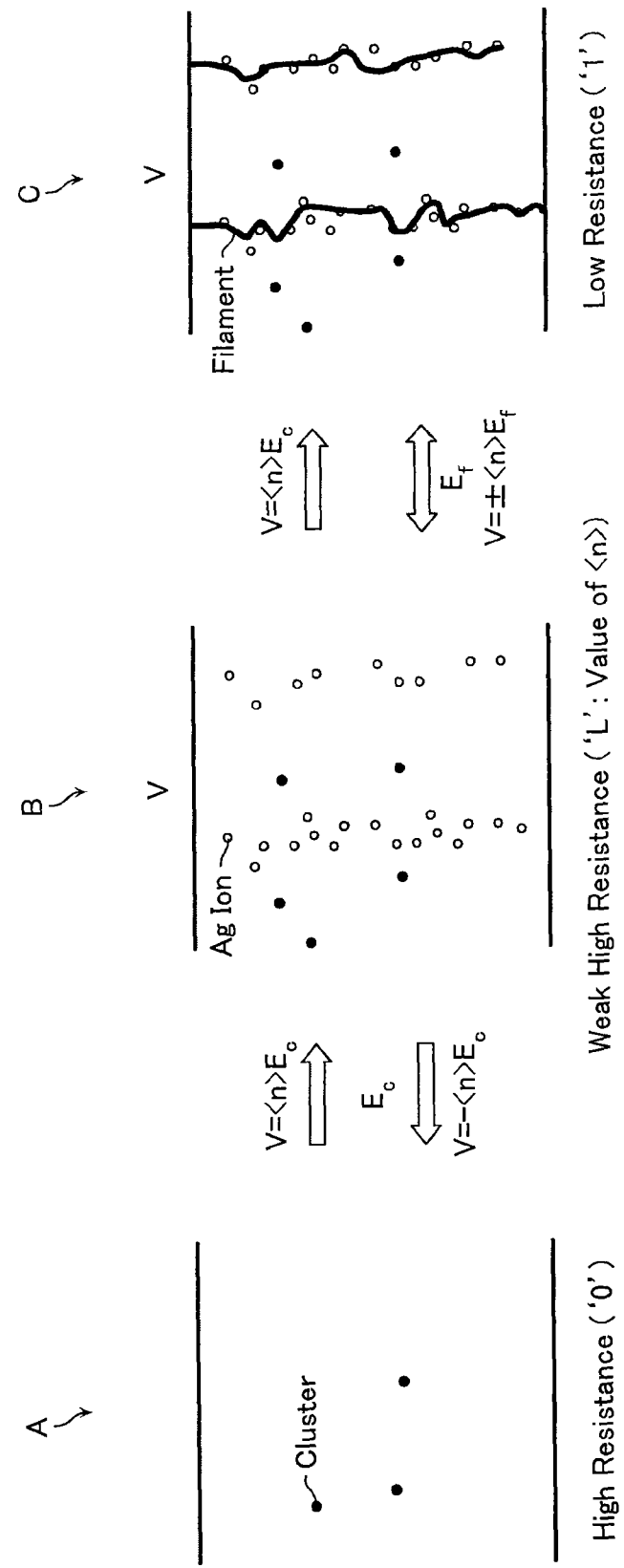
FIG. 6 is a diagram showing state variations of a cell in the memory system according to the embodiment.
Figure 7:
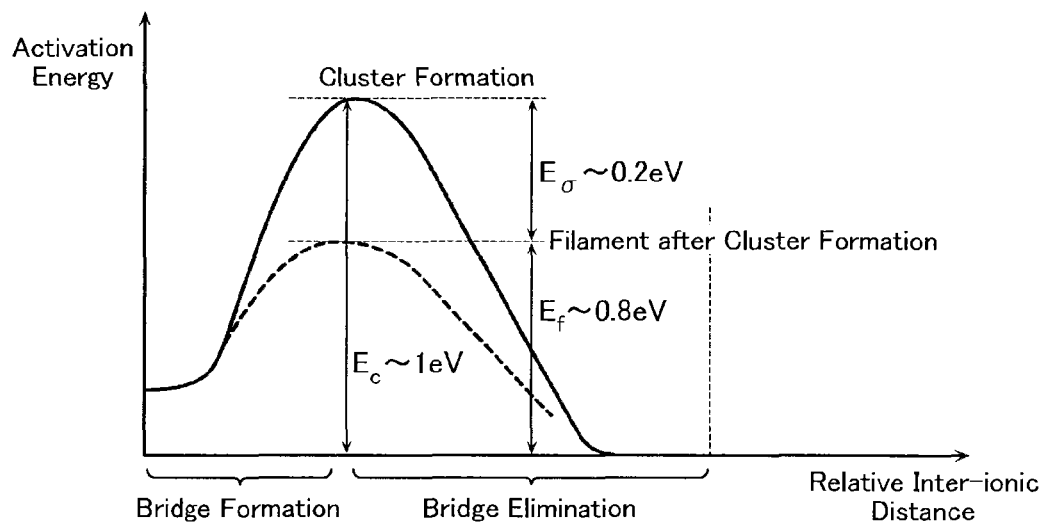
FIG. 7 is a diagram showing a relation between relative inter-ionic distances and activation energy in the cell in the memory system according to the embodiment.

FIG. 6 is a diagram showing state variations of a cell in the memory system according to the embodiment. The cell in FIG. 6 is of the filament type. It is a cell in an ion memory. FIG. 7 is a diagram showing a relation between relative inter-ionic distances and activation energy in the cell in the memory system according to the embodiment.

A filament can be formed in two stages. The first stage is a process of creating several clusters in an ion migrating medium while the second stage is a process of coupling these clusters by the filament. For realizing these filament formation processes, the solid medium is set so that a barrier potential Ec in the first stage becomes higher than a barrier potential Ef in the second stage. In the case of FIG. 7, the potential for cluster formation is Ec≈1 eV and the potential for filament formation between clusters is Ef≈0.8 eV. In a word, the difference between the potentials for cluster formation and filament formation is Eδ≈0.2 eV.

A variation in resistance value of the cell and a voltage V applied across the cell relate as follows. The medium in the reset cell contains isolated clusters remaining as shown with black circles in A of FIG. 6. Here, "reset" means turning the cell to a high resistance state. In this state, when the voltage V is applied between electrodes of the cell, Ag ions start to diffuse inside the medium as shown with white circles in B of FIG. 6. Then, when the potential on the center of the Ag ion exceeds the cluster formation potential Ec, clusters are formed between electrodes of the cell. The average number of clusters, $<n>$, formed at this time and the voltage V between electrodes establish a relation V=$<n>$Ec therebetween. Here, $<n>$ is a value on the assumption that clusters are formed at equal intervals between electrodes. When the voltage V between electrodes is further maintained continuously, as the potential between electrodes has already become equal to or higher than the filament formation potential Ef, formation of a filament starts as shown in C of FIG. 6. Then, formation of a conductive filament between electrodes sets the cell. Here, "set" means turning the cell to a low resistance state by formation of the conductive filament between electrodes. The average number of clusters, $<n>$, is determined by an initial voltage applied between electrodes, the number of application times and so forth. A multi-value level of the cell can be determined in accordance with $<n>$.

For ensuring the retention property at the average number of clusters, $<n>$, the medium of the cell may be designed appropriately to set the potential. This is because such the design prevents application of a large voltage between electrodes of the cell and avoids an occurrence of disturbance. As a result, cluster sites remain after the filament almost disappears. When a voltage is applied between electrodes so that a voltage exceeding the potential Ef is applied to each cluster site again, the cell is set and turned to a low resistance state. The voltage V applied between electrodes of the cell is considered almost inversely proportional to $<n>$. Accordingly, the voltage V can be used to discriminate multi-value levels while lowering the cell resistance. Namely, the voltage V at the time of setting again has a proportional relation with the cell current at that time. Therefore, the voltage V can be used to discriminate which one of the levels it has.

Raising the cell resistance requires activation energy exceeding the cluster formation potential Ec again so as to diffuse metal ions to the electrode. Therefore, such a reverse bias voltage V is applied between electrodes of the cell that allows every potential on $<n>$ clusters to exceed Ec. Thus, metal ions passing beyond the potential barrier for cluster formation are collected to the electrode.

The cell having a resistance value variable in accordance with filament formation operates on the basis of diffusion and collection of metal ions. Therefore, it is required to invert the voltage V applied between electrodes, resulting in bipolar operation.

In FIG. 6, a high resistance state is represented as '0' data, and a low resistance state is represented as '1' data. In addition, data corresponding to plural levels in a weak high resistance state, which is an intermediate state between the high resistance state and the low resistance state, is represented as 'L'.

Subsequently, as an example of the unipolar operable cell, a NT stack cell using CNT contact/noncontact is described. In the following description of the memory system according to the embodiment, the case of the use of a unipolar operating cell is exemplified. This point should be noted.

Figure 8:
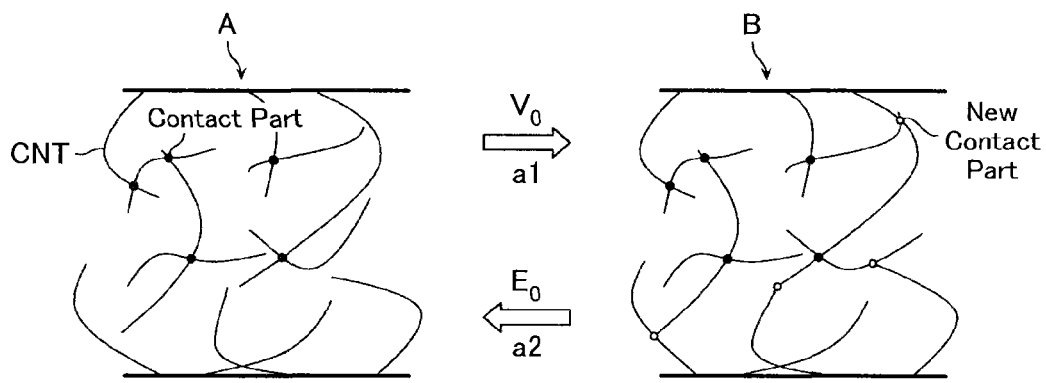
FIG. 8 is a diagram showing state variations of a cell in the memory system according to the embodiment.
Figure 9:
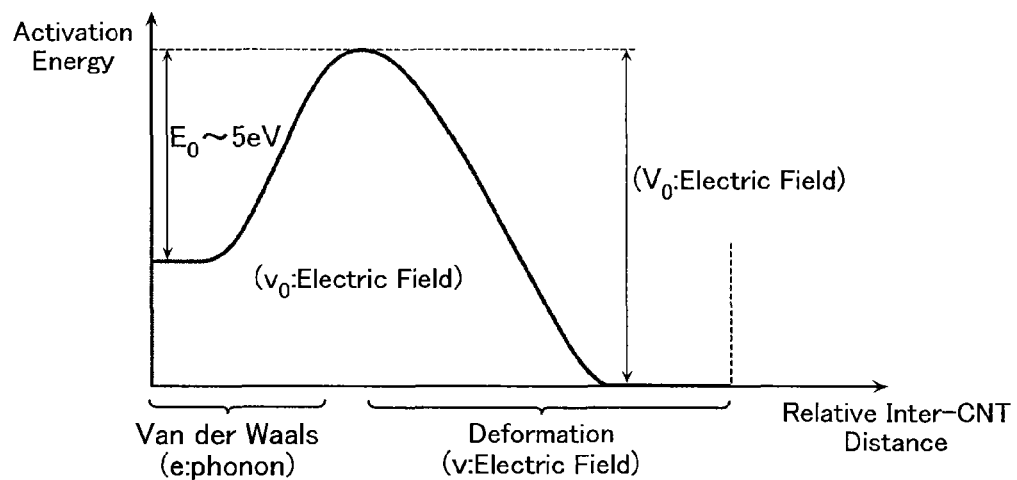
FIG. 9 is a diagram showing a relation between relative inter-CNT distances and activation energy in the cell in the memory system according to the embodiment.

FIG. 8 is a diagram showing state variations of a cell in the memory system according to the embodiment. The cell shown in FIG. 8 is a NT stack cell using CNTs. FIG. 9 is a diagram showing a relation between relative inter-CNT distances and activation energy in the cell in the memory system according to the embodiment.

A CNT has a nanoscale molecular structure excellent in electrical and physical properties, and applications thereof to resistance variable memories have been studied in the past.

The characteristics of the NT stack cell are described here.

If the CNT is compared to a straw, the NT stack is like a bed containing straws stacked disorderly. It has a structure of straws partly contacted and separated with/from each other. The contact between CNTs can be maintained by the Van der Waals force. The structure of the NT stack can be maintained by the stiffness of CNTs contacting by the Van der Waals force. When the NT stack is formed between electrodes to observe the electric resistance of the NT stack, the resistance value varies in accordance with the situation of contact between CNTs. NT stacks formed under similar conditions exhibit almost similar resistance variations. As shown in A of FIG. 8, a NT stack cell in a high resistance state has not only contact parts between CNTs (black circles in A of FIG. 8) but also many noncontact parts inside the NT stack. The contact/noncontact between CNTs can be maintained by the stiffness of CNTs and the Van der Waals force as described above. When a voltage is applied between electrodes of a NT stack cell in a high resistance state, an attractive electrostatic force acts between noncontact CNTs. When this attractive electrostatic force overcomes the stiffness held by CNTs, a relative distance between CNTs reduces. When the relative distance between CNTs reaches a certain distance, the Van der Waals force acts to make a contact between CNTs as shown in B of FIG. 8. A white circle in B of FIG. 8 is a new contact part between CNTs. As a result, the resistance value of the NT stack lowers.

The number of contact parts between CNTs varies along with the application time of the voltage between electrodes. The state of contact between CNTs can be maintained even after removing the voltage between electrodes. A difference in the number of contact parts between CNTs corresponds to the difference in level of the NT stack cell.

A return of the NT stack cell in a low resistance state to a high resistance state requires injection of phonons, that is, thermal oscillations into the NT stack. This makes it possible to oscillate CNTs intensively to separate contacted CNTs and return shapes of CNTs by the stiffness originally held by CNTs. For this purpose, a voltage for causing Joule heat easily in the NT stack cell is applied between electrodes of the NT stack to concentrate phonons on contact parts between CNTs.

In this connection, the potential of the Van der Waals force of the CNT is $E_0 \approx 5$ eV as shown in FIG. 9. Therefore, overcoming the stiffness to bend CNTs and make a contact between non-contacted CNTs requires a voltage having a larger potential than 5 eV to be applied between electrodes.

Hereinafter, the high resistance state of the NT stack cell may also be related to '0' data, and the low resistance state to 'L' data. In the case of a multi-valued NT stack cell, one or more natural numbers are related to 'L'.

The following description is given to a method of reversibly changing resistance states of a NT stack cell.

Figure 10:
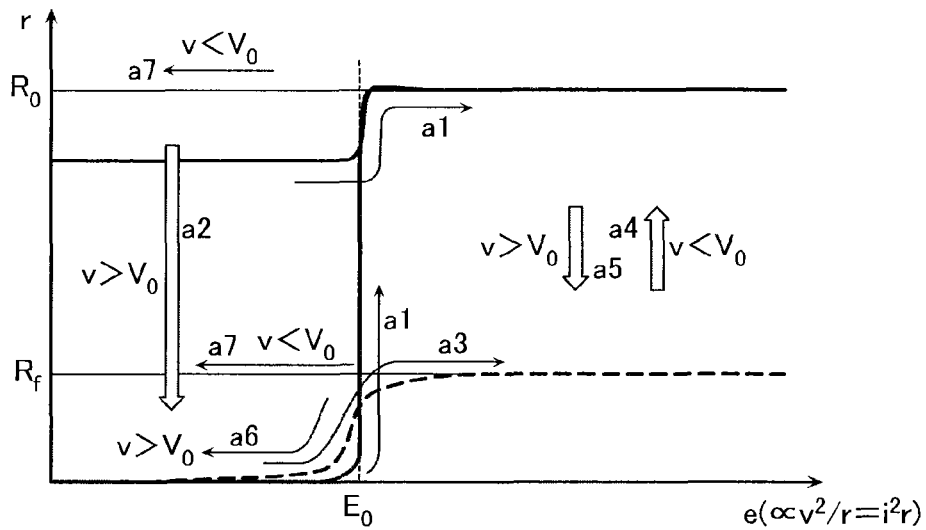
FIG. 10 is a graph showing relations among phonon energy within a NT stack, resistances of the NT stack, and potentials of the electric field within the NT stack in the memory system according to the embodiment.

FIG. 10 is a graph showing relations among phonon energy within a NT stack, resistances of the NT stack, and potentials of the electric field within the NT stack in the memory system according to the embodiment. The lateral axis in FIG. 10 indicates average phonon energy e that allows a CNT end to freely execute an oscillating motion. It is considered that the energy e is proportional to Joule heat caused by electric energy added to the NT stack. When the voltage between electrodes of the NT stack cell is defined as v, the current flowing in the NT stack as i, and the resistance of the NT stack as r, then the energy e is represented by $v^2/r$ or $i^2 r$. On the lateral axis, $e=E_0$ indicates the phonon energy corresponding to the Van der Waals force caused between CNTs. At this point, the contacted CNTs separate from each other, thereby increasing the resistance r of the NT stack. This variation is further affected by the situation of the electric field, or the voltage potential, placed between CNTs. FIG. 10 shows an instance of $v<V_0$ with the solid line and an instance of $v>V_0$ with the dashed line because the graph varies the situation greatly in accordance with the voltage v. The voltage $V_0$ is an average voltage when the oscillating motion of a CNT end bends the CNT against the stiffness held by the CNT so as to make contact with another CNT. Namely, as shown by the arrow a1 in FIG. 10, in the case of $v<V_0$, the phonon energy e rises even if the NT stack has any resistance r and, when $e>E_0$ is reached, the contact between CNTs can be eliminated. As a result, the NT stack resistance rises up to $r=R_0$. In addition, as shown by the arrow a2 in FIG. 10, even if the NT stack has any resistance r in the case of $v>V_0$, it is bent until the CNT end makes contact with another adjacent CNT when e is small. As a result, the NT stack resistance r falls down to the minimum value. Then, this NT stack resistance r is fixed by the Van der Waals force. When the phonon energy e is elevated, the oscillating motion eliminates the contact between CNTs. Then, when $e>E_0$ is reached, almost all contacts between CNTs can be eliminated. As a result, the NT stack resistance r becomes higher as shown by the arrow a3 in FIG. 10. As the bias of the electric field is large, however, the probability of contacts newly made between CNTs is also large. As a result, the NT stack resistance r has a value of around $R_f$ larger than the minimum value. In a state of high phonon energy e, the magnitude relation between the voltage v and the voltage $V_0$ makes the NT stack resistance r come and go between $R_f$ and $R_0$ as shown by the arrows a4 and a5 in FIG. 10. On the other hand, in a state of low phonon energy e, the NT stack makes only a change to a low resistance in the case of $v>V_0$ and no change to a high resistance as shown by the arrow a6 in FIG. 10.

In the state of high phonon energy e, even if $e \leq E_0$ is reached in the case of $v<V_0$, the NT stack maintains the same resistance $R_f$ as that in the case of $e>E_0$ as shown by the arrow a7 in FIG. 10.

In consideration of the above-described variations in the NT stack resistance r, a method of changing the NT stack resistance r is described next.

Initially, a description is given to raising the NT stack resistance.

Figure 11:
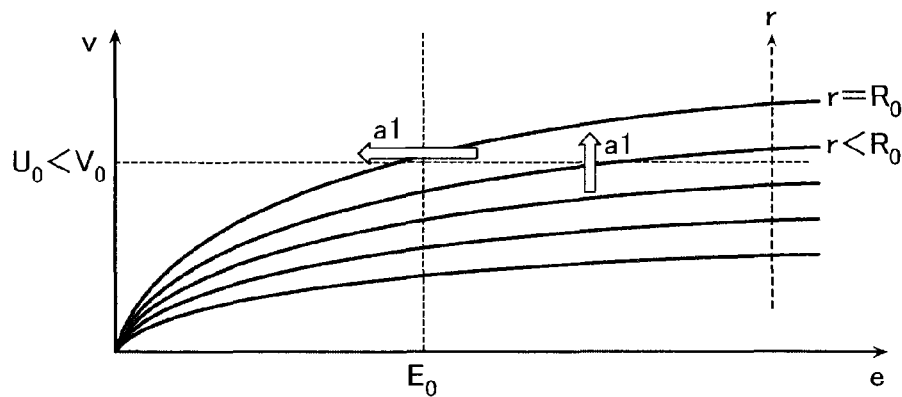
FIG. 11 is a graph showing a relation between phonon energy and voltages across electrodes of a NT stack cell when the NT stack resistance is made higher in the memory system according to the embodiment.

FIG. 11 is a graph showing a relation between phonon energy and voltages across electrodes of a NT stack cell when the NT stack resistance is made higher in the memory system according to the embodiment. FIG. 11 shows $V^2/r$ relative to the phonon energy e at every resistance.

In the case of $v<V_0$, the NT stack resistance becomes $r=R_0$ in a state of high energy e. When the energy e lowers, the NT stack resistance is maintained almost at $r=R_0$. This is utilized to raise the NT stack resistance.

With respect to the maximum resistance $r=R_0$ of the NT stack, the voltage v is made sufficiently smaller than the voltage $V_0$ so that $v^2/r$ becomes around $E_0$ or below. In addition, with respect to the minimum resistance r of the NT stack, the voltage between electrodes of the NT stack cell is set to $v=U_0$ so that it becomes larger than $E_0$. In this case, until the NT stack resistance r becomes the minimum resistance, the phonon energy keeps $e>E_0$. Thereafter, the voltage v between electrodes of the NT stack cell is gradually made larger so as to prevent the cell current i from increasing and make the voltage stay back from the voltage $V_0$. Further, even if the resistance r is high, the energy e can be controlled to exceed $E_0$. In this case, the NT stack resistance r can be made higher while the cell current i is maintained small. This corresponds to the instance in which the higher the resistance r, the larger the voltage v becomes in the case of constant energy e in FIG. 11. In this case, the state varies as the arrow a1 in FIG. 11.

In this connection, in read operation, the voltage v applied between electrodes of the NT stack cell is made equal to or lower than the voltage $U_0/3$ to achieve ⅒ or below the energy required for making a transition to the high resistance state. This is required to prevent the NT stack resistance from rising. Therefore, in read operation, the current sense is desirable because it can expect a larger cell current flowing at the time of a lower resistance compared to the voltage sense.

Subsequently, a description is given to lowering the NT stack resistance.

Figure 12:
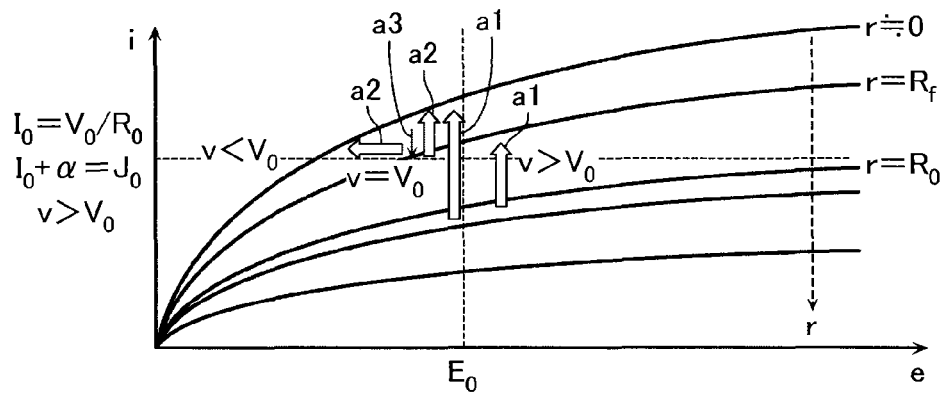
FIG. 12 is a graph showing a relation between phonon energy and cell current in the NT stack when the NT stack resistance is made lower in the memory system according to the embodiment.

FIG. 12 is a graph showing a relation between phonon energy and cell current in the NT stack when the NT stack resistance is made lower in the memory system according to the embodiment. FIG. 12 shows $i^2r$ relative to phonon energy e at every resistance.

Lowering the NT stack resistance utilizes the fact that the NT stack resistance r lowers one-sidedly if the voltage applied between electrodes of the NT stack cell satisfies $v>V_0$. In particular, it utilizes the fact that the NT stack resistance r becomes lowermost if the energy satisfies $e \leq E0$. When a voltage $v=V_0$ is applied between electrodes of the NT stack cell having the maximum resistance $r=R_0$, a current $i=I_0$ flows. A constant voltage $v>V_0$ is applied across the NT stack by limiting the current to a current $i \leq J_0$ ($>I_0$). At this time, in the case of $J_0^2R_0<E_0$, as the voltage $v>V_0$ is applied between electrodes of the NT stack cell, the NT stack resistance r lowers. In addition, as the current is limited by $i \leq J_0$, the voltage v sharply falls and the NT stack stabilizes at a low resistance. In addition, in the case of $J_0^2R_0>E_0$, the NT stack resistance lowers to $r=R_f$. At this time, if $J_0^2R_f<E_0$ and $J_0R_f>V_0$, then the phonon energy e is small and accordingly the resistance r lowers further. In other cases, the NT stack resistance stops at $r=R_f$ and does not become lowermost. In any case, the resistance lowers.

These variations in the resistance r correspond to the arrows a1 and a2 in FIG. 12. If resistance lowering stays at the resistance $r=R_f$, however, it is the case that the arrow a3 in FIG. 12 indicative of the voltage $v=V_0$ would locate rightward from the dashed line indicative of the energy $E_0$, different from the case shown in FIG. 12. This case corresponds to the case where it cannot be changed from the curve indicative of the resistance $r=R_f$.

When the NT stack resistance is made lower, in practice, it is not required to always maintain a constant current. It is sufficient to satisfy the conditions about the voltage $v>V_0$ and $iV_0<E_0$. Therefore, it is not required to thoughtlessly elevate the voltage v applied to the high-resistance NT stack for maintaining the constant current. If the lowered resistance increases the cell current i, the voltage v applied across the NT stack is lowered.

A method of accessing NT stack cells is described next.

The use of NT stack cells makes it possible to configure a cell array of the cross point type. In a word, the cell array of the cross point type is structured to include plural bit lines BL, plural word lines WL intersecting these plural bit lines BL, and NT stack cells provided at intersections of plural bit lines BL and plural word lines WL. Hereinafter, a cell provided in the cell array of the cross point type may also be referred to as a "CP cell" in particular. In addition, the cell array is divided in accordance with the size thereof into unit cell arrays each called a "MAT".

In the case of the cell array of the cross point type, normally, accessing plural CP cells can be realized by selecting plural bit lines BL and one word line WL. Accordingly, the burden on the word line WL becomes heavy. Therefore, the size of a MAT is determined in consideration of the magnitude of an allowable burden on a word line WL, that is, the length of the word line WL. If plural short-fault CP cells locate on the same word line WL in a cell array, disturbances caused by current sneaking and so forth may prevent normal data write. Then, the following description is given to a write sequence according to the embodiment for solving these problems. Hereinafter, the short-fault cell may also be simply referred to as a "fault cell".

The write sequence according to the embodiment includes an initial step, an all '0' write step, and an 'L' write step. This write sequence may also be referred to as a "2-step write sequence" because writing data to an actual cell is achieved at two steps including the all '0' write step and the 'L' write step.

At the start, the initial step in the write sequence is described.

Figure 13:
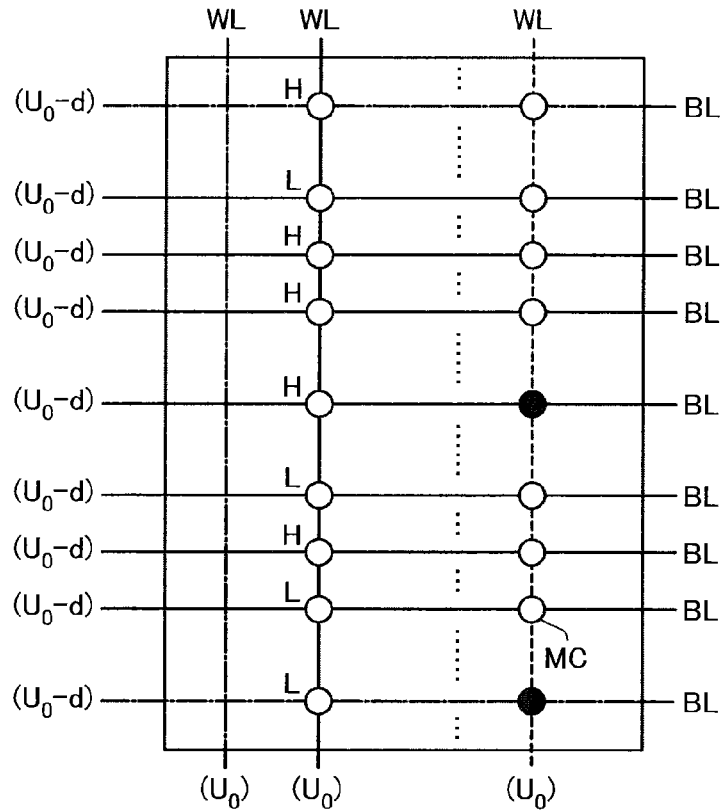
FIG. 13 is a diagram showing a bias state of a cell array at the initial step in a write sequence in the memory system according to the embodiment.

FIG. 13 is a diagram showing a bias state of a cell array at the initial step in the write sequence in the memory system according to the embodiment. In FIG. 13, a cell MC shown by a black circle is a fault cell, an 'L'-added cell MC is a cell MC in a low resistance state, and an 'H'-added cell MC is a cell in a high resistance state. In addition, a selection line shown by a chain line is a non-access selection line, and a word line WL shown by a dashed line is a fault word line WL. These expressions are similarly applied in FIGS. 14 and 15.

In the following description, a voltage for generating larger energy than phonon energy capable of eliminating the Van der Waals force in a NT stack cell is denoted with $U_0$, and a voltage slightly smaller than the voltage $U_0$ is denoted with $U_0-d$. In addition, a voltage for making a contact between NT stack cells against the stiffness of the NT stack cell is denoted with $V_0$, and a voltage slightly smaller than the voltage $V_0$ is denoted with $V_0-d$.

In the following description, word lines WL and bit lines BL may also be called "selection lines", the generic term thereof.

At the initial step, all bit lines BL are provided with the potential $U_0-d$ and all word lines WL with the potential $U_0$. A current is detected in a selection line connected to a fault cell. The current is larger than expected when a normal cell MC is reverse-biased. This can be used to specify a fault selection line. The specified fault word line WL is handled at the subsequent all '0' write step as a word line WL provided with the same fixed potential Vs as that on the access word line WL.

Subsequently, the all '0' write step in the write sequence is described.

Figure 14:
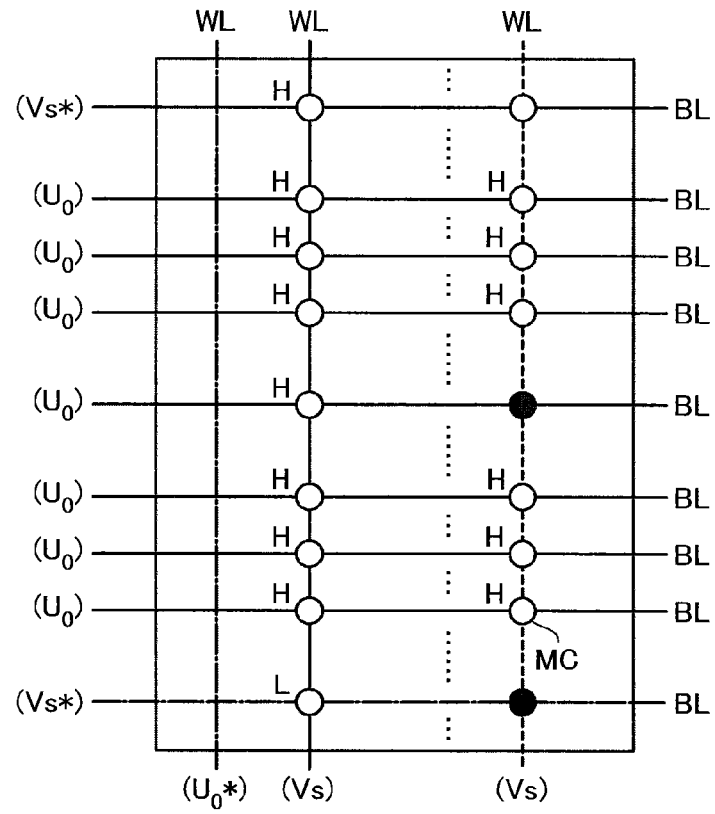
FIG. 14 is a diagram showing a bias state of a cell array at the all '0' write step in the write sequence in the memory system according to the embodiment.

FIG. 14 is a diagram showing a bias state of a cell array at the all '0' write step in the write sequence in the memory system according to the embodiment.

At the all '0' write step, the fault word line WL is provided with the potential Vs while non-access bit lines BL are brought into the floating state and non-access word lines WL other than the fault word line WL are also brought into the floating state.

On the other hand, all access bit lines BL targeted to simultaneous access are provided with the potential $U_0$. When a lower stationary voltage $U_0$ is applied to cells MC, phonons are injected into cells MC in a low resistance state as described before. Thus, the corresponding cells MC change to a high resistance state by the access word line WL and the fault word line WL. At this time, even if there are many cells MC in a low resistance state, the voltage $U_0$ is lower, and the cell current becomes smaller once the cells MC change to a high resistance state. Therefore, the electrical load on the word line WL provided with the potential Vs is light. To that extent, the number of access bit lines BL targeted to simultaneous access can be increased. In the cells connected to the fault word line WL except fault cells having faults in both a NT stack and a diode and fault cells including a NT stack of which resistance cannot be raised, resistances of cells MC are raised in order at every access. Therefore, current passing through these cells MC are reduced in order. As a result, at the subsequent '1' write step, a high voltage via the fault cell is not applied to non-access cells MC via cells MC in a low resistance state. Accordingly, the influence of disturbance exerted on normal cells MC can be reduced greatly. This effect becomes effective when a MAT is upsized.

At the all '0' write step, the current flowing in the access word line WL cannot be reduced. If all access cells MC cannot make a transition to a high resistance state, this access word line WL is regarded as connected to a fault cell that includes a normal diode but has a fault only in a NT stack. Then, this access word line WL is not accessed and the all '0' write step is interrupted. Thereafter, this access word line WL is excluded from access targets at the subsequent steps.

Subsequently, the 'L' write step in the write sequence is described.

Figure 15:
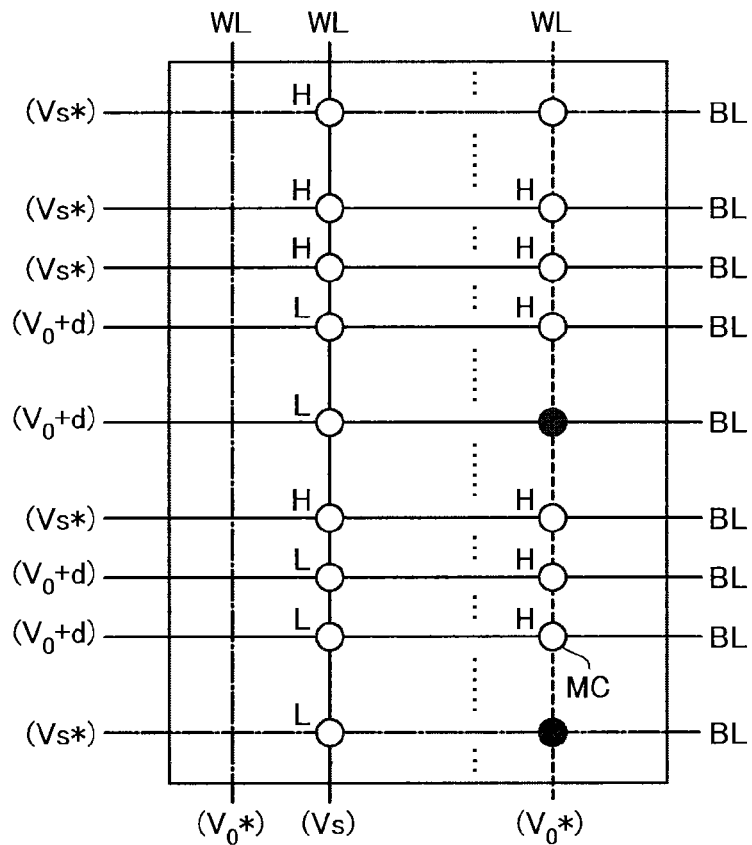
FIG. 15 is a diagram showing a bias state of a cell array at the 'L' write step in the write sequence in the memory system according to the embodiment.

FIG. 15 is a diagram showing a bias state of a cell array at the 'L' write step in the write sequence in the memory system according to the embodiment.

At the 'L' write step, an access cell MC targeted to 'L' write is provided with the voltage $V_0+d$, and all other non-access cells MC are brought into the floating state. In addition, only an access word line WL is provided with the potential Vs and other selection lines are brought into the floating state. As a result, the cell MC having electrodes provided with the voltage $V_0$ or above is only the access cell MC. Therefore, only the access cell MC changes to a low resistance state. Multi-values can be discriminated by controlling the time of applying the voltage to the access cell MC.

In the initial stage of setting the potential $V_0+d$ on bit lines BL, the access cell MC is in a high resistance state. Accordingly, no large current flows therein and no load is imposed on the word line WL. When the access cell MC starts to change to a low resistance state, current starts to flow in the access cell MC. In individual bit lines BL, current is limited because the later-described circuit executes high-impedance control. Therefore, the load on the word line WL is prevented from becoming extremely heavier.

The following description is given to potential variations on selection lines at the time of the write sequence.

Figure 16:
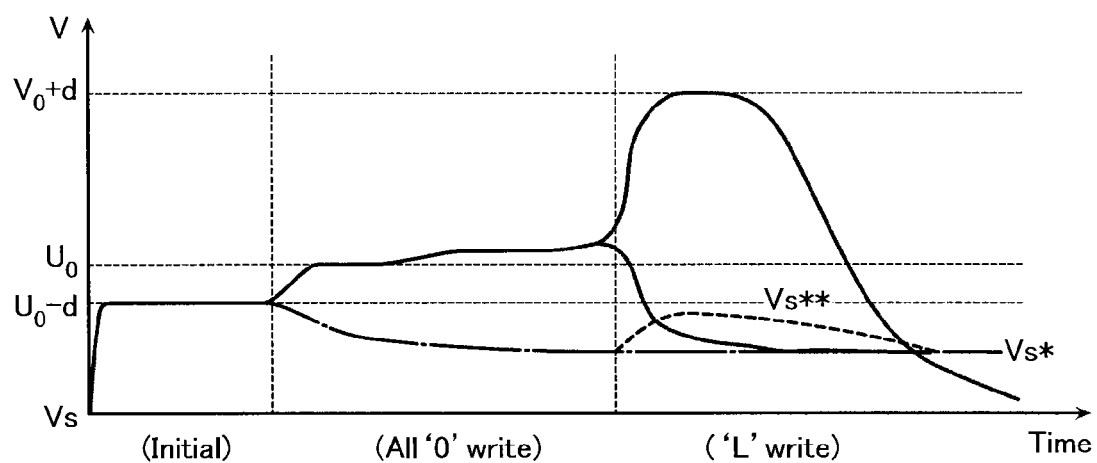
FIG. 16 is a diagram showing potential variations on bit lines at the time of the write sequence in the memory system according to the embodiment.
Figure 17:
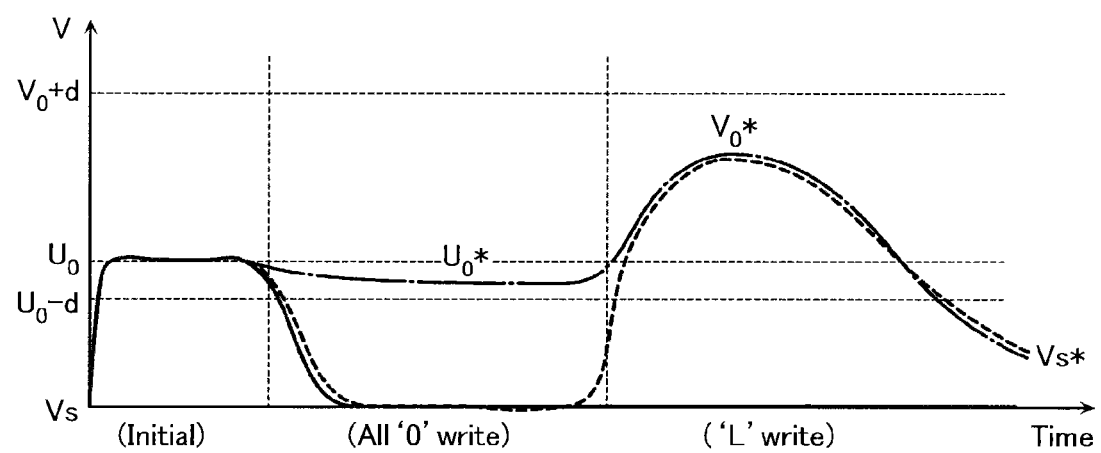
FIG. 17 is a diagram showing potential variations on word lines at the time of the write sequence in the memory system according to the embodiment.

FIGS. 16 and 17 are diagrams showing potential variations on selection lines at the time of the write sequence in the memory system according to the embodiment. FIG. 16 shows those on bit lines BL while FIG. 17 shows those on word lines WL. In FIGS. 16 and 17, a chain line shows a non-access selection line, and a dashed line shows a fault word line WL and a non-access bit line BL connected to a fault cell. The time on the lateral axis indicates the initial step, the all '0' write step and the 'L' write step dividedly. These three steps are not required to be continuous. A pause period may interpose between the steps, for example, at the time of accessing a cell MC. It is sufficient if the order of steps is kept. Namely, at the all '0' write step, it is possible to configure a sequence as an independent process at every word line WL.

At the start, at the initial step, all bit lines BL are provided with the potential $U_0-d$ and all word lines WL with the potential $U_0$ in a MAT. At this step, a fault word line WL is specified.

Subsequently, at the all '0' write step, both the access word line WL and the fault word line WL are provided with the potential Vs. Access bit lines BL are provided with the potential $U_0$, which is then pulled up little by little from the potential $U_0$ as the resistance of the access cell MC rises. FIG. 16 shows the situation of the potential on the access bit line BL, which is pulled up in two stages. The potential on the access bit line BL may vary continuously or in stages more than two. Non-access bit lines BL are set in the floating state and accordingly vary to the potential Vs* little by little. Non-access word lines WL are also set in the floating state and accordingly reach the potential $U_0^*$.

Subsequently, at the 'L' write step, among the access bit lines BL, the access bit line BL connected to the access cell MC targeted to 'L' write is provided with the potential $V_0+d$. Thereafter, the impedance of the power supply is raised so as to lower the potential on these access bit lines BL along with increases in cell current. Other access bit lines BL are set in the floating state and accordingly vary to the potential Vs* along with the lapse of time. The floating-state bit line BL connected to the fault cell varies to the potential Vs** as the access bit line BL is provided with the potential $V_0+d$ as described before. The access word line WL maintains at the setting of the potential Vs. In contrast, all non-access word lines WL including the fault word line WL are floating-set and accordingly vary to the potential $V_0^*$. They further vary to the potential Vs* along with the reduction in potential on the access bit line BL.

Setting of multi-value levels includes simultaneously activating individual multi-bit sense amps at every certain time and executing a comparison at every sense amp with a reference value set at every multi-value data to confirm the completion of write in the access cell MC individually. Then, connections with bit lines BL are closed in order beginning from the write-completed access cell MC.

Hereinafter, a memory system using 5-level/cell cells is described as an example of the memory system according to the embodiment using multi-level/cell.

In MAT access, multi-bit simultaneous access is effective. Then, as the precondition for multi-bit simultaneous access using reference cells, the following description is given to reference bit lines for generating multi-value reference values.

Figure 18:
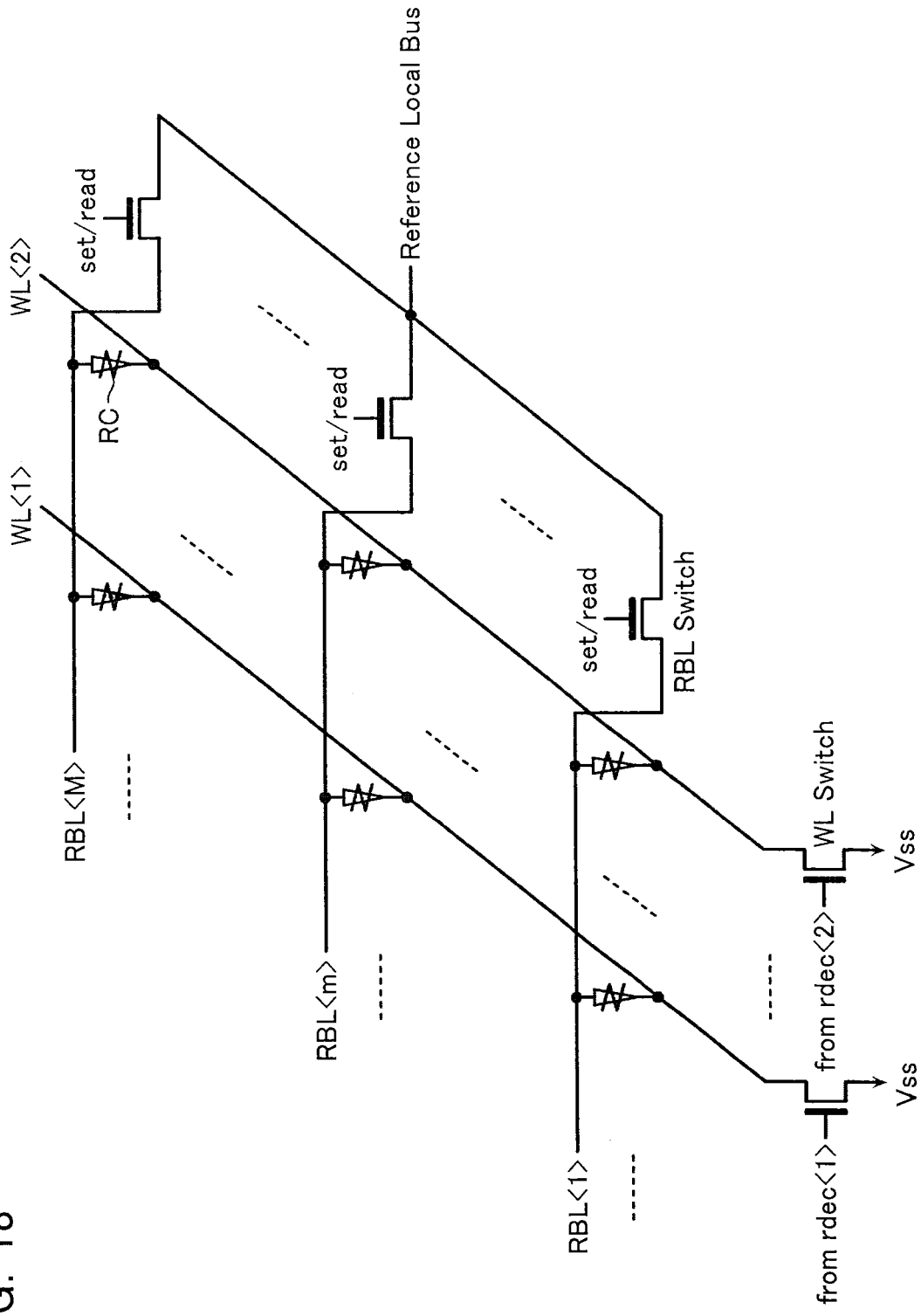
FIG. 18 is a schematic diagram of a configuration of reference bit lines in the memory system according to the embodiment.
Figure 19:
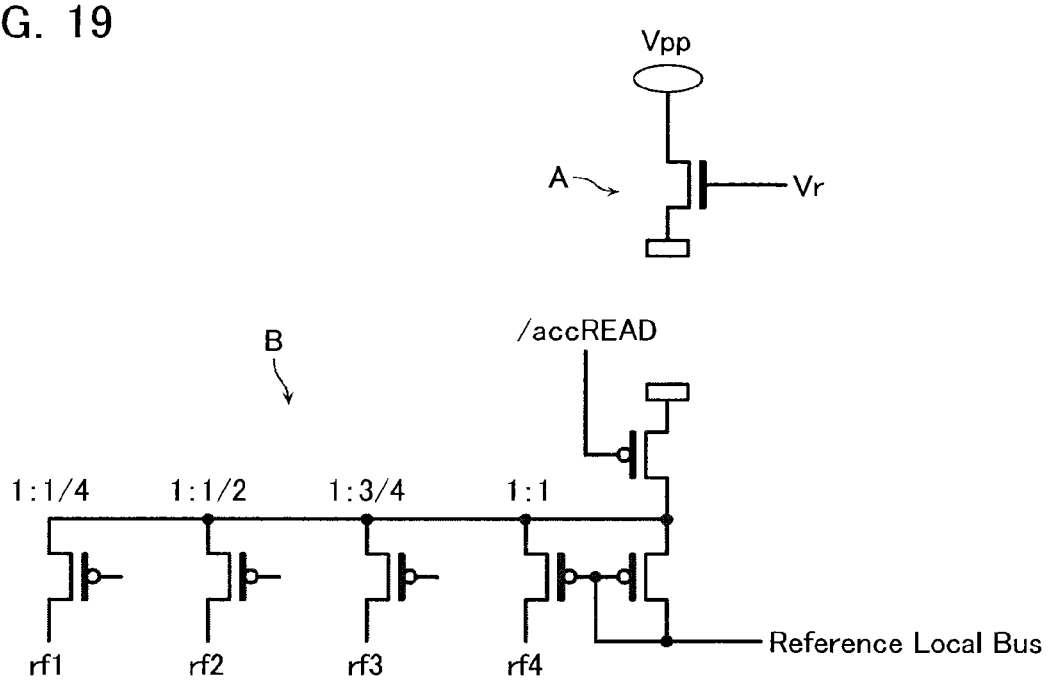
FIG. 19 is a circuit diagram of a current source for reference bit lines in the memory system according to the embodiment.

FIG. 18 is a schematic diagram of a configuration of reference bit lines in the memory system according to the embodiment. FIG. 19 is a circuit diagram of a current source for reference bit lines in the memory system according to the embodiment.

The memory system according to the embodiment uses a group of at least M bit lines BL as reference bit lines RBL<m> (m=1 to M) at every MAT to set a high resistance state in cells MC on all reference bit lines RBL (hereinafter also referred to as "reference cells"). Hereinafter, a group of M reference bit lines RBL may also be referred to as a "reference bit line group". These M reference bit lines RBL are connected via switch elements to one bus, that is, a reference local bus. Selection of the value of M and selection of the number of reference bit lines RBL simultaneously connected to the reference local bus are determined by the situation of reference bit lines RBL and the interval between resistances set at every multi-value. Selection of a large M for simultaneous selection of many bit lines BL corresponds to extension of intervals between the corresponding resistance distributions at multi-values.

A MAT of the cross point type is characterized in that reference bit lines RBL and access bit lines BL are always selected by a common word line WL. Therefore, a reference bit line group is provided on several parts of a long word line WL to arrange reference bit lines RBL and access bit lines BL in near environments desirably. In addition, a high resistance state is set in reference cells RC for the purpose of reducing current flowing in the access word line WL as low as possible and because a variable resistance memory cell is generally more stable in the high resistance state that in a low resistance state.

With reference to current in the reference local bus (standard current), a multi-value is written in an access cell. Comparison currents for deciding multi-value levels are generated in a circuit shown in FIG. 19 (hereinafter also referred to as a "comparison current generator circuit").

The comparison current generator circuit is a current source for supplying currents having 1:1, 1:¾, 1:½ and 1:¼ relations with the current drawn into the reference local bus, which are defined as comparison currents rf4, rf3, rf2 and rf1.

Individual circuit parts shown in FIGS. 18 and 19 are described below.

FIG. 18 shows only WL<1> and <2> as word lines for simple description.

The word line WL side of the reference bit line group is provided on a MAT end. An access word line WL is connected to the ground potential Vss via a WL switch controlled by a control signal, from rdec. On the other hand, on the bit line BL side of the reference bit line group, the reference bit lines RBL are connected to the reference local bus via a RBL switch controlled by a control signal, set/read.

The circuit serving as the current source for the reference local bus comprises a circuit indicated with A for supplying a power supply Vpp, and a circuit indicated with B for generating rf1-rf4 from the power supply Vpp fed from the former circuit. The circuit indicated with A includes an NMOS transistor controlled by a control signal Vr and utilizes operation of this transistor in the saturation region to feed the power supply Vpp to the circuit indicated with B. The circuit indicated with B includes a current mirror circuit composed of PMOS transistors controlled by the reference local bus. This current mirror circuit receives the power via a PMOS transistor controlled by a control signal, /accREAD, so that the current mirror circuit only operates as required.

The following description is given to the relation between the access bit lines BL and the comparison currents generated at M reference bit lines RBL.

The condition of a voltage applied to a cell at the time of read operation differs from that at the time of write operation. At the time of read operation, as low a voltage as possible is applied so as to cause no variation in cell state. At the time of write operation, a considerably high voltage is applied so as to cause a variation in cell state. Therefore, the comparison current is set to a value capable of discriminating the multi-value level of a cell in read operation using a low voltage. The comparison currents rf1-rf4 for 5-level/cell described above are converted at access bit lines BL into voltages in accordance with access operations.

Figure 20:
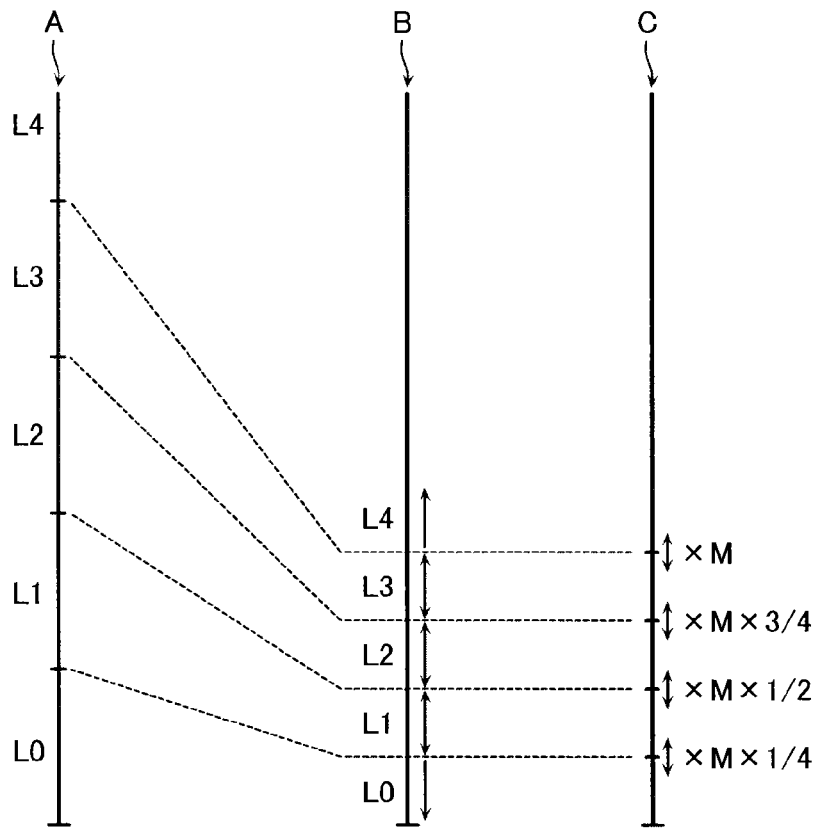
FIG. 20 is a diagram illustrative of relations among comparison currents at access operations in the memory system according to the embodiment.

FIG. 20 is a diagram illustrative of relations among comparison currents at access operations in the memory system according to the embodiment. A of FIG. 20 shows a comparison current at the time of write operation, B of FIG. 20 shows a comparison current at the time of read operation, and C of FIG. 20 shows a comparison current for the reference cell.

The group of reference cells is applied with such a voltage that does not change the high resistance state of a cell. Therefore, the comparison current to be generated becomes a reference level used at the time of read operation. The values shown in C of FIG. 20 are reference values corresponding to reference levels. These reference values are reference values that allow current to flow out at first from M simultaneously selected cells in high resistance states. This reference value is a value equal to M-times the value of current in the cell set in the high resistance state. The way for selecting M depends on the cell characteristics as described before. It should be noted that M is selected so as to cause no overlapped resistance distributions.

The values of reference levels are equal to M-times, M×¾-times, M×½-times and M×¼-times the average cell current of cells in high resistance states. Read operation decides the multi-value level of a cell by comparing the cell current with these comparison currents. In accordance with a cell current Iread when a read voltage Vread is applied, multi-value levels of a cell can be decided by 5 levels L0, L1, L2, L3 and L4 from the lower current value as shown in B of FIG. 20. The resistance value of the cell is the highest at the time of L0 and the lowest at the time of L4.

So as to obtain the cell current Iread corresponding to these read currents, the resistance of the cell is set in write operation. At the time of the all '0' write, a voltage is applied to change a cell from a high resistance state to a low resistance state. This voltage is defined as a program voltage Vpro. Based on a cell current Ipro flowing at the time of application of the program voltage Vpro, a comparison current is generated.

In the case of Vpro=α·Vread, the reference current at the time of programming also becomes Ipro=α·Iread. Here, Iread is a comparison current at the time of read operation. Reference values are converted at individual sense amps for bit lines BL and related to write of any multi-value levels. The circuit used here is described later.

Hereinafter, a sense amp SA is described.

Next, the circuitry of the sense amp SA is described.

The embodiment uses a sense amp of the current comparison type so that fine current comparison can be applied at the time of read operation or write operation to monitor the state of a cell at a high speed. In the embodiment, however, for the purpose of further elevating the sensitivity of the sense amp SA, the quantity of current flowing into a current mirror circuit on the cell current input side is made equal to that on the reference current side so that the resistance value of the cell can be reflected more. The following description is given to the sense amp SA operative to compare the cell current flowing in a bit line BL with the reference current flowing in a reference bit line RBL.

Figure 21:
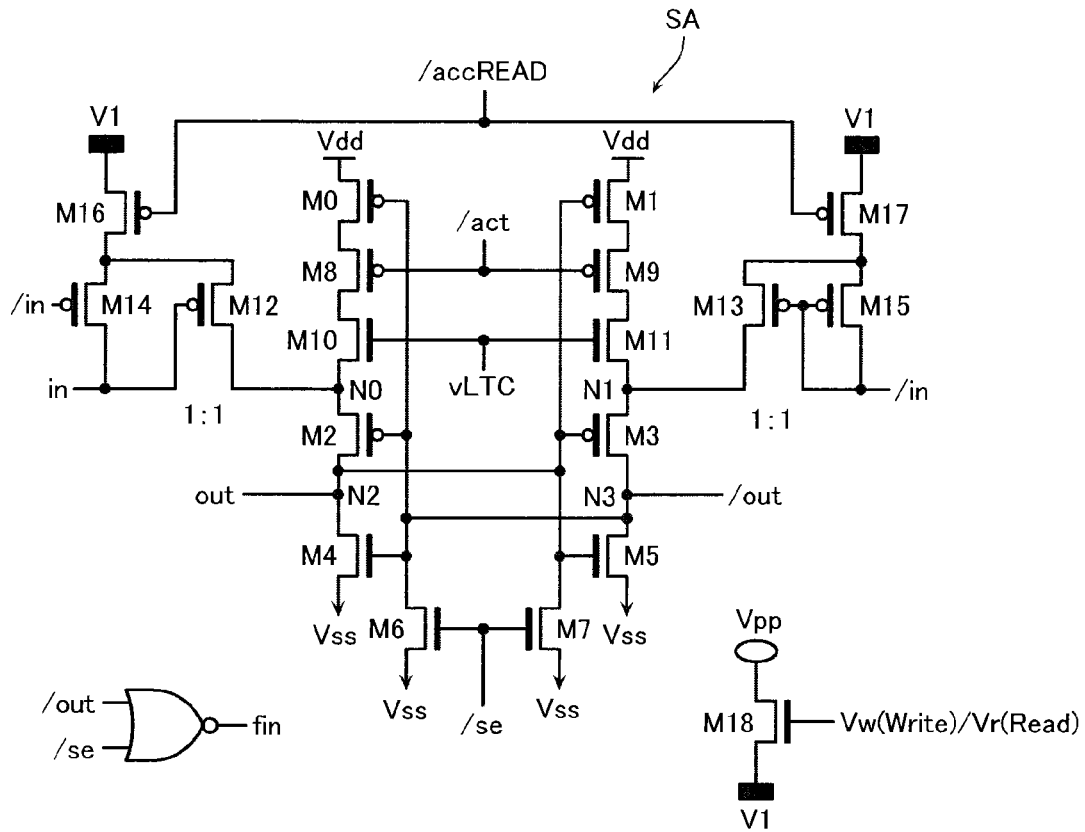
FIG. 21 is a circuit diagram of a sense amp in the memory system according to the embodiment.

FIG. 21 is a circuit diagram of a sense amp in the memory system according to the embodiment.

The sense amp SA includes PMOS transistors M0-M3, M8, M9, M12-M17 and NMOS transistors M4-M7, M10, M11 and M18. The transistors M0, M8, M10, M2 and M4 are serially connected between a certain supply potential Vdd and the ground potential Vss. The transistor M6 has a source connected to the gates of the transistors M0, M2 and M4, and a drain connected to the ground potential Vss. The transistors M1, M9, M11, M3 and M5 are serially connected between the supply potential Vdd and the ground potential Vss. The transistor M7 has a source connected to the gates of the transistors M1, M3 and M5, and a drain connected to the ground potential Vss. The transistors M8 and M9 have gates, which receive a control signal, /act. The transistors M10 and M11 have gates, which receive a control signal, vLTC. The transistors M6 and M7 have gates, which receive a control signal, /se, for controlling the start of sensing at the sense amp SA. An output node N2 between the transistors M2 and M4 is connected to the gates of the transistors M1, M3 and M5 and the source of the transistor M7. The output node N2 provides an output signal 'out'. An output node N3 between the transistors M3 and M5 is connected to the gates of the transistors M0, M2 and M4 and the source of the transistor M6. The output node N3 provides an output signal '/out'.

The transistor M12 has a source connected to the drain of the transistor M16, a drain connected to an input node N0 between the transistors M10 and M2, and a gate connected to the drain of the transistor M14. The transistor M16 has a source connected to a certain potential V1, and a drain connected to the sources of the transistors M12 and M14. The gate of the transistor M12 and the drain of the transistor M14 receive an input signal 'in'. The gate of the transistor M14 receives an input signal '/in'.

The transistor M13 has a source connected to the drain of the transistor M17, a drain connected to an input node N1 between the transistors M11 and M3, and a gate connected to the drain of the transistor M15. The transistor M17 has a source connected to the potential V1, and a drain connected to the sources of the transistors M13 and M15. The gate of the transistor M13 and the drain and gate of the transistor M15 receive the input signal 'in'. The gates of the transistors M16 and M17 receive a control signal, /accREAD.

The transistor M18 has a source connected to the potential Vpp, and a drain connected to the potential V1. The gate of the transistor M18 is provided with a potential Vw at the time of write operation and a potential Vr at the time of read operation.

This sense amp SA decides the resistance state of a cell by comparing a cell current with a reference current. It is possible to execute fast reliable sensing even in a current comparison of several 10 nA or below.

The input stage of the sense amp SA includes a current mirror circuit composed of the transistors M12, M14 and M16, and a current mirror circuit composed of the transistors M13, M15 and M17. The input signal '/in' and the input signal 'in' contain currents configured equal. Thus, the sense amp SA allows the inflow of cell current while reflecting the variation quantity relative to the reference cell current, and executes a current comparison at the time of the inflow of this cell current. One input, in, is supplied with a flow of cell current and the other input, /in, with a flow of reference current.

The above two current mirror circuits operate on the potential V1. This potential V1 is generated by limiting the potential Vpp and the current at the transistor M18. The transistor M18 is provided with the potential Vw at the time of write operation and the potential Vr at the time of read operation. This makes it possible to switch between the potentials on bit lines BL at access operations.

Basic operation of the sense amp SA is described next.

Figure 22:
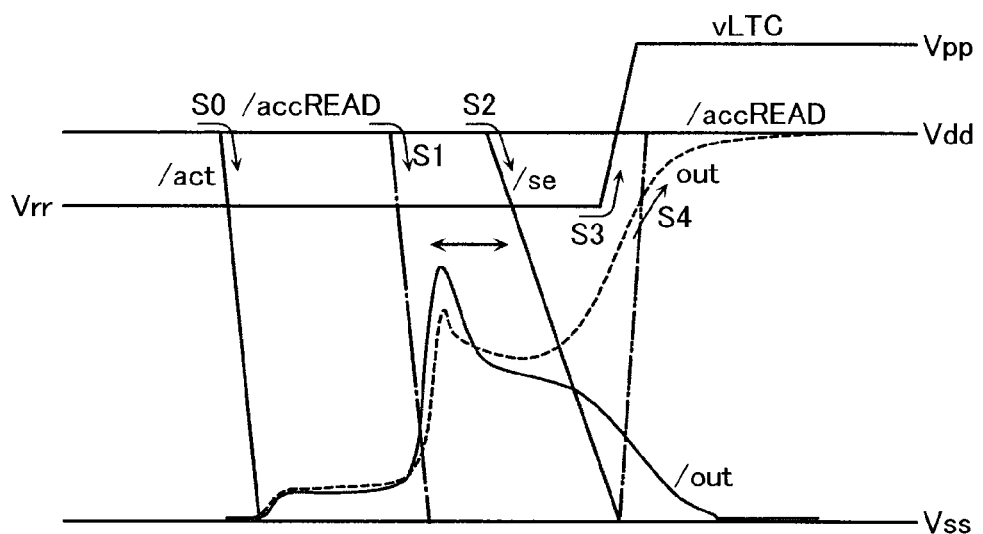
FIG. 22 is a diagram of operating waveforms in the sense amp in the memory system according to the embodiment.

FIG. 22 is a diagram of operating waveforms in the sense amp in the memory system according to the embodiment.

At the start, when the control signal, /act, is lowered from "H" to "L" in a state of a control signal, /se="H" (step S0 in FIG. 22), a pair of transistors M8 and M9 turns on. As a result, current flows in the sense amp SA.

Subsequently, the control signal, /accREAD, is lowered from "H" to "L" (step S1 in FIG. 22) to supply current into the access bit line BL and the reference bit line RBL through the inputs of input signals 'in' and '/in'. A difference between the cell current and the reference current flowing at this time is amplified as the drain voltage difference and latched by a pair of transistors M6 and M7, which are cut off after passing through the saturation region from the linear region.

Amplification of the current difference between the cell current and the reference current requires the control signal, /se, to be lowered from 'H' to 'L' (step S2 in FIG. 22). As a result, the paired transistors M6 and M7 both pass through the saturation region from the linear region and turn off. At that time, a slight difference between the cell current and the reference current causes a timing difference in transition to the saturation region, which is converted into the drain voltage. If the source potential on the transistor M6 is higher, the gate potentials on the transistors M0 and M2 become higher and accordingly the transistors M0 and M2 turn off. If the source potential on the transistor M7 is higher, on the other hand, the gate potentials on the transistors M1 and M3 become higher and accordingly the transistors M1 and M3 turn off. Thus, the drain voltage difference in the pair of transistors M6 and M7 is amplified.

A pair of transistors M10 and M11 is provided with a lowered gate potential in the initial stage of sensing to suppress the conductance, thereby reducing the sense amp current supplied from the supply potential Vdd. As a result, it reflects a cell current difference supplied via a pair of transistors M12 and M13 more strongly in accordance with the state of the sense amp SA.

In the initial stage of sensing, when the balance of the sense amp SA collapses in accordance with the current difference between the cell current and the reference current and then becomes stable, the control signal vLTC is raised from the potential Vrr to the potential Vpp higher than the supply potential Vdd (step S3 in FIG. 22). As a result, the sense amp SA is supplied with the supply voltage to fully swing the output signal 'out' to the supply potential Vdd (S4 in FIG. 22). At this time, the control signal /accREAD is raised to break the supply of the cell current and reference current to the sense amp SA.

The pairs of fine-patterned transistors contained in the sense amp SA have variations caused by fluctuations in production steps. Therefore, the variations can be cancelled if current paths are configured by serially connecting as many elements as possible. Then, the sense amp SA uses three pairs of transistors including the pair of transistors M0 and M1, the pair of transistors M8 and M9 and the pair of transistors M10 and M11 to configure the parts between the supply potential Vdd and the input nodes N0 and N1. In particular, the pair of NMOS transistors M10 and M11 suppresses the influence of variations in the pair of PMOS transistors M0 and N1 and the pair of PMOS transistors M8 and M9 contained in a feedback loop in operation of the sense amp SA. Namely, the conductance of NMOS transistors M10 and M11 is suppressed to raise the potentials on the drains and sources of PMOS transistors M0, M1, M8 and M9 located closer to the supply potential Vdd than these transistors M10 and M11, thereby raising the conductance of PMOS transistors M0, M1, M8 and M9. In a word, the conductance of PMOS transistors and NMOS transistors provides an action directing suppression of the influence of variations in respective characteristics. The gates of the pair of NMOS transistors M10 and M11 are supplied with the control signal vLTC. Accordingly, only when the control signal vLTC is amplified, this action becomes larger. Therefore, in the initial stage of sensing, the control signal vLTC is kept low. In the latter half of sensing in which data is settled, the data should be latched fast by elevating the control signal vLTC to raise the conductance of transistors. In the case of FIG. 22, the control signal vLTC is set to the potential Vrr different from the supply potential Vdd until the time immediately before latching after sensing and set to the higher potential Vpp at the time of latching.

The time difference between the fall of the control signal /accREAD (step S1 in FIG. 22) and the fall of the control signal /se (step S2 in FIG. 22) is adjusted so that the sense amp SA starts sensing after the control signal /accREAD falls and the cell current and reference current injected into the sense amp SA are sufficiently reflected on the input current.

The sense amp SA creates a control signal, fin, indicating its own activation period to external. This control signal, fin, is a signal that turns to 'H' in the case of /out='L' and /se='L'. It is utilized, for example, to separate the bit line BL from the sense amp SA.

The reference input side of the sense amp SA for discriminating multi-value levels is detailed next.

Figure 23:
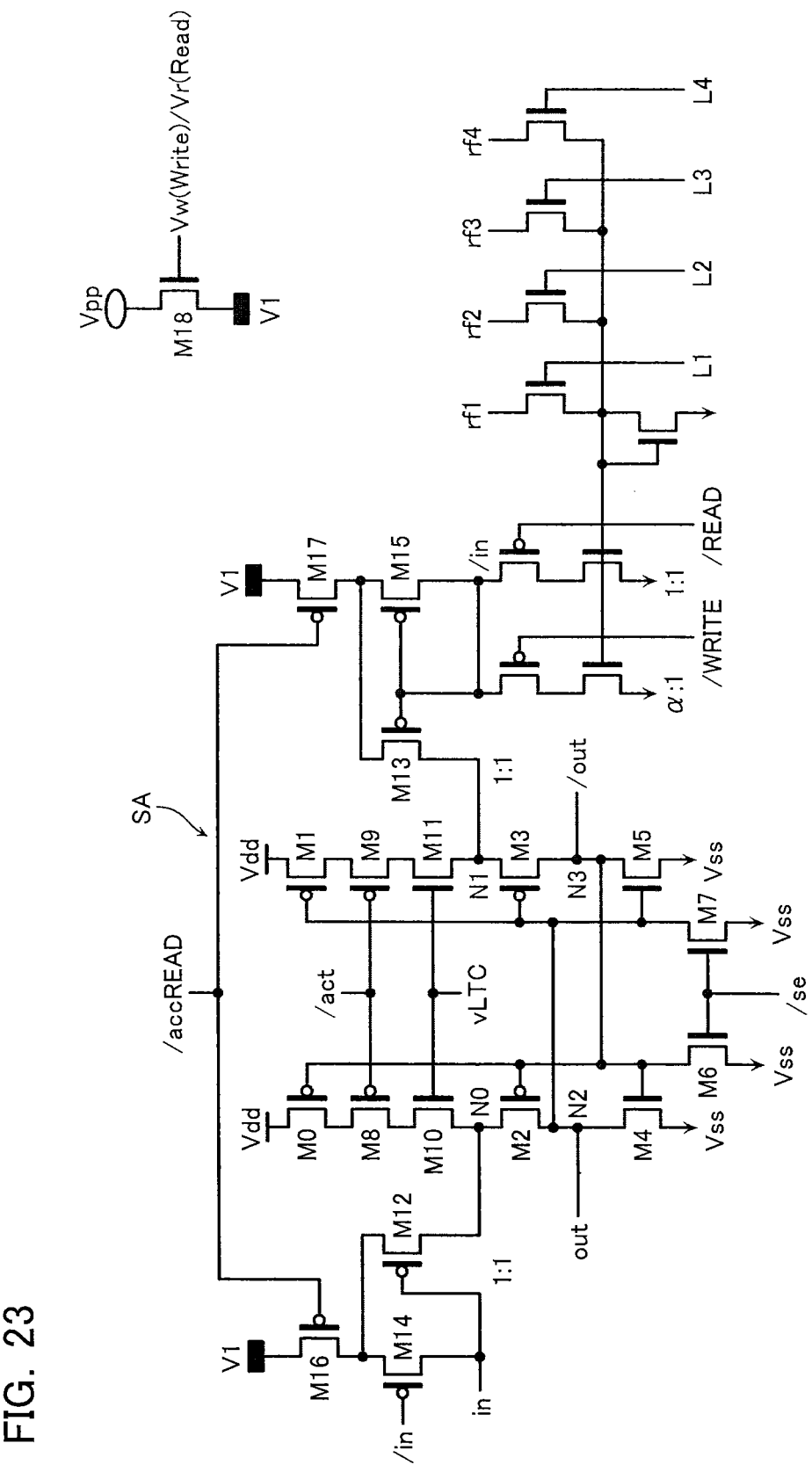
FIG. 23 is a circuit diagram showing a circuit on the reference input side of the sense amp in the memory system according to the embodiment.

FIG. 23 is a circuit diagram showing a circuit on the reference input side of the sense amp in the memory system according to the embodiment. In the case of FIG. 23, the sense amp SA is ready for 5-level/cell.

The reference input side requires comparison currents corresponding to multi-value levels (5 levels in the case of FIG. 23) as reference currents, which are appropriately switched for use at the time of monitoring the cell state. In addition, the voltage level at the time of write operation differs from that at the time of read operation. Accordingly, it is required to switch between the states of the reference input in accordance with these levels.

All the comparison currents rf1-rf4 fed into the side /in are currents flowing into the sense amp SA, which are generated at the reference bit lines RBL as described above. These comparison currents are not allowed to directly flow into the sense amp SA. The reason is as follows. The way of viewing comparison currents in the case of the sense amp SA used in write operation can be changed from that in the case of read operation. This makes it possible to prevent a cell from making a failed transition when a large voltage or current is given at the time of cell read operation. The comparison currents rf1-rf4 are selected by control signals L1-L4 and the selected current is fed to current mirrors. Current mirrors on the side /in are prepared two having different magnifications. A control signal /WRITE falls at the time of write operation and the reference current is magnified by α and fed into the sense amp SA for comparison with the cell current. A control signal /READ falls at the time of read operation and the reference current is fed at the same magnification into the sense amp SA. The meanings of magnifications at the time of write operation and at the time of read operation are as described above.

When the cell current on the side, in, becomes larger than the comparison current, that is, the cell resistance is made lower, the output signal becomes /out='L'.

An access system for selecting one word line WL and simultaneously selecting plural bit lines BL in one MAT is described next using a simple example.

Figure 24:
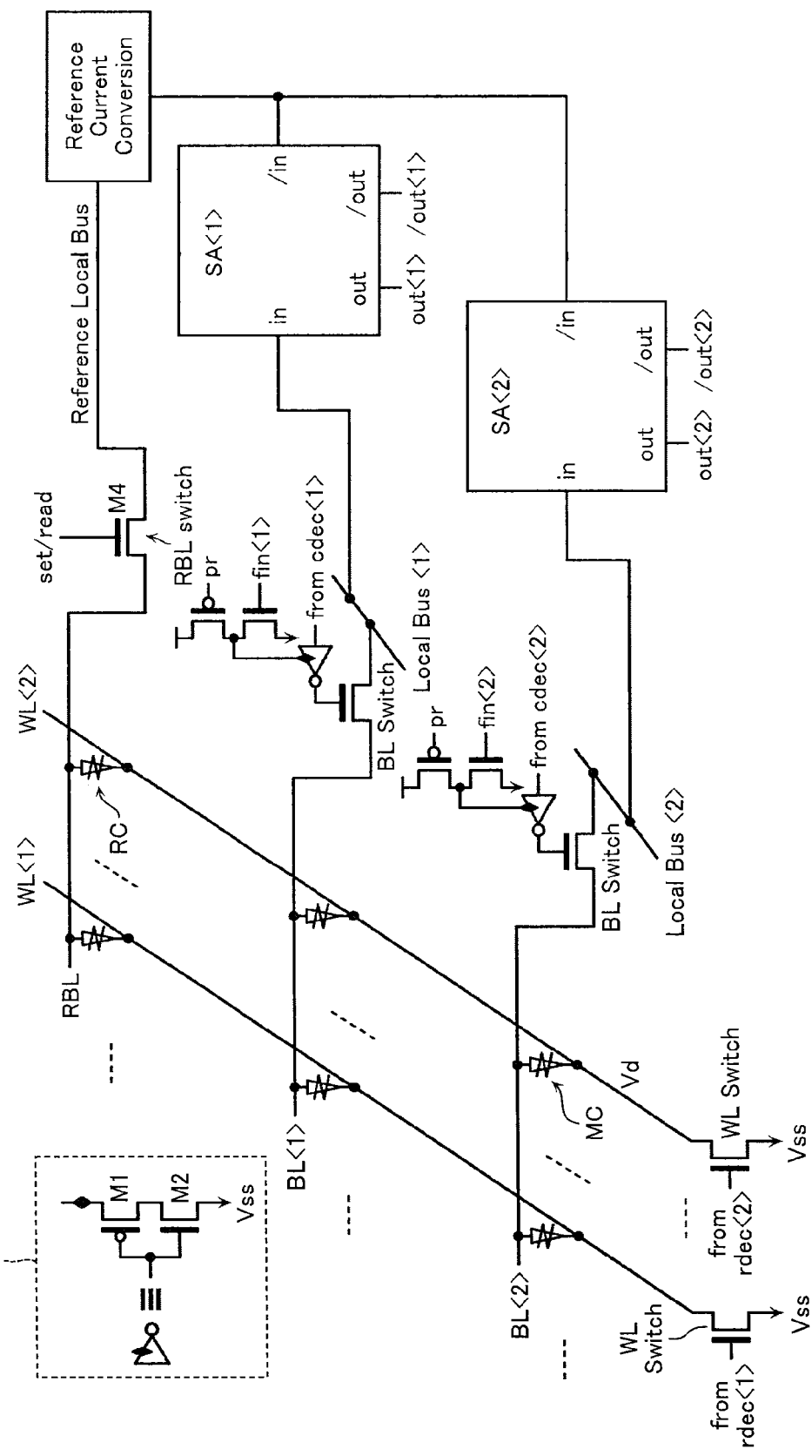
FIG. 24 is a diagram showing a configuration of a current sensing system in the memory system according to the embodiment.

FIG. 24 is a diagram showing a configuration of a current sensing system in the memory system according to the embodiment. FIG. 24 shows two word lines WL<1> and <2> and three bit lines RBL and BL<1> and <2>. Reference bit lines RBL are collectively represented by one.

A word line WL is selected when it is connected to the ground potential Vss via a WL switch controlled by the control signal, from rdec.

A bit line BL is selected by a BL switch. On/off control of the BL switch requires switching in accordance with the sense state and so forth. Therefore, a signal input to the gate of a transistor contained in the BL switch is generated through logic operation. A method of controlling the BL switch is as follows. Namely, a BL switch is always kept off by a control signal, /from cdec<m>, at 'H' when the corresponding bit line BL is to be selected. Once the bit line BL is selected as the control signal, /from cdec<m>, turns to 'L', the BL switch turns on/off in accordance with logic.

It is assumed here that the bit lines BL<1> and <2> belong to local buses <1> and <2>, respectively. The local buses <1> and <2> are connected to plural bit lines BL, and BL switches select BL<1> and <2> from those bit lines BL. The gates of transistors contained in the BL switches receive the control signals, from cdec<1> and <2>, from a column decoder via inverters, respectively. The power supplies for these inverters are connected to the inverse signals, /out<1> and <2>, of output signals, out<1> and <2>, from the sense amps SA. A circuit of the inverter is shown in A of FIG. 24.

The bit lines BL are connected to the local buses via the BL switches, which are turned on when selected by a control signal, pr. The BL switches are turned off on respective conditions in accordance with control signals, fin<m>, from the sense amps SA.

The reference bit line RBL is connected to a reference local bus via a transistor contained in a RBL switch, which is controlled by a control signal, set/read, so as to turn on at the time of cell set operation and at the time of read operation. A comparison current generated at the reference bit line RBL is converted into a comparison current for multi-values at a reference current conversion unit and fed to several sense amps SA commonly.

A sense amp SA is provided on each local bus. When the BL switch is cut off by the output signal, out, from the sense amp SA, it can stop writing to the bit line BL that has reached a certain current value.

The following description is given to a structure of a memory system including a three-dimensionally structured cell array capable of effectively utilizing the memory system described above.

BL switches, WL switches, sense amps SA and so forth are provided on a semiconductor substrate beneath a MAT (cell array).

Selection lines in a MAT of the cross-point type are led out alternately from the opposite sides of the MAT to relieve the pitch of MAT peripheral circuits. When transistors are formed in the vicinity of the surface of the semiconductor substrate, however, an increase in the number of stacked MATs proportionally increases the formation area of peripheral circuits. The reason is as follows. If the pitch of MAT selection lines cannot be relieved and the peripheral circuits are laid out elongated in the extending direction of selection lines, the peripheral circuits are required by the number of stacked MATs to be accessed individually.

Then, the following description is given to one of methods of solving the problem about the layout of the peripheral circuits.

Figure 25:
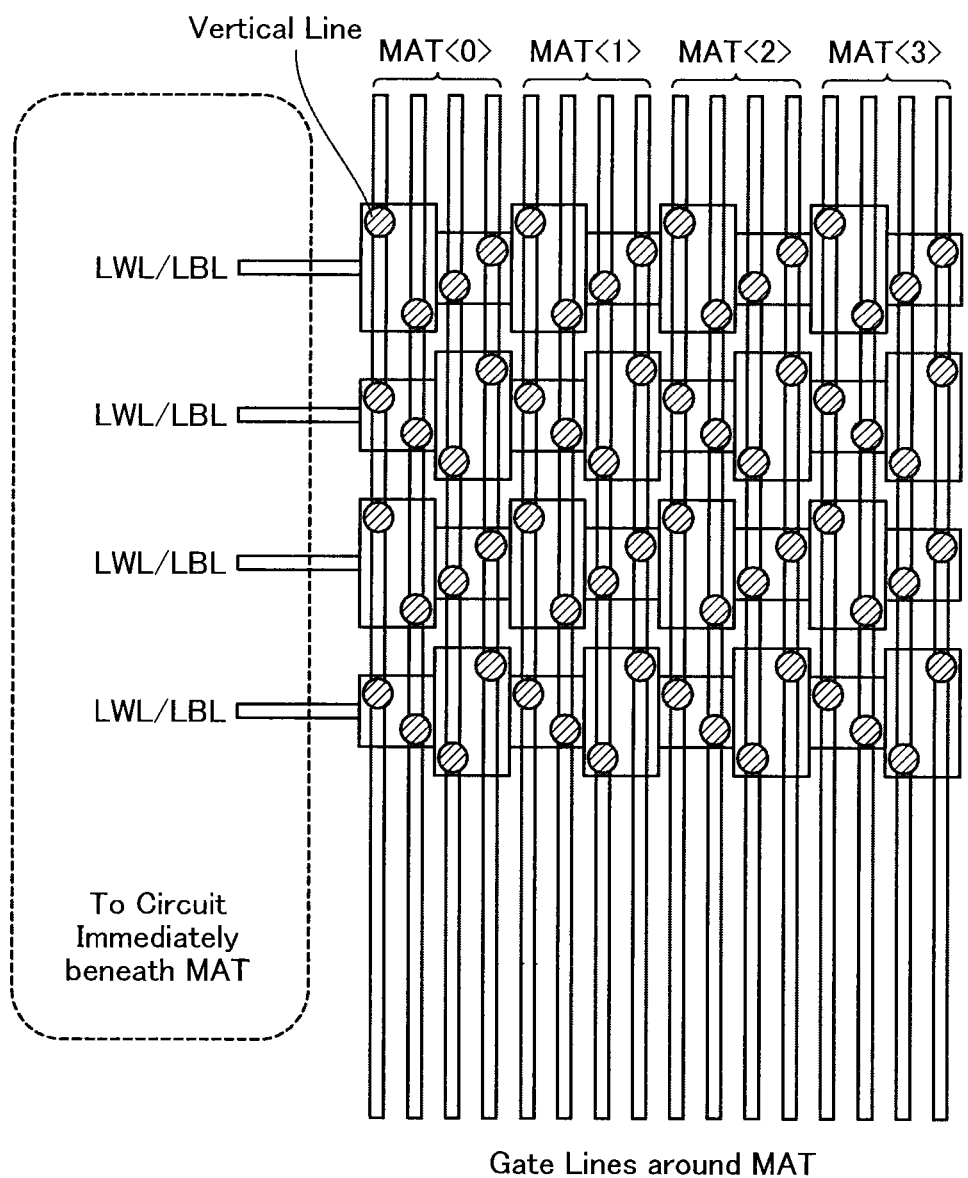
FIG. 25 is a diagram showing a layout of arrangement regions of vertical lines in a cell array seen from the stacking direction in the memory system according to the embodiment.

FIG. 25 is a diagram showing a layout of arrangement regions of vertical lines in a cell array seen from the stacking direction in the memory system according to the embodiment.

The layout described here utilizes no transistors formed on the surface of the semiconductor substrate but utilizes transistors formed three-dimensionally instead. This transistor is a SGT (Surrounding Gate Transistor) having a gate surrounding a conduction channel, or a TFT (Thin Film Transistor) having a conduction channel sandwiched between gates. Poly-Si or an oxide semiconductor such as InGaZn-Oxide formed on the surface of the semiconductor substrate is configured as the conduction channel. The transistors stand in pillar shapes around MATs in large numbers.

Figure 26:
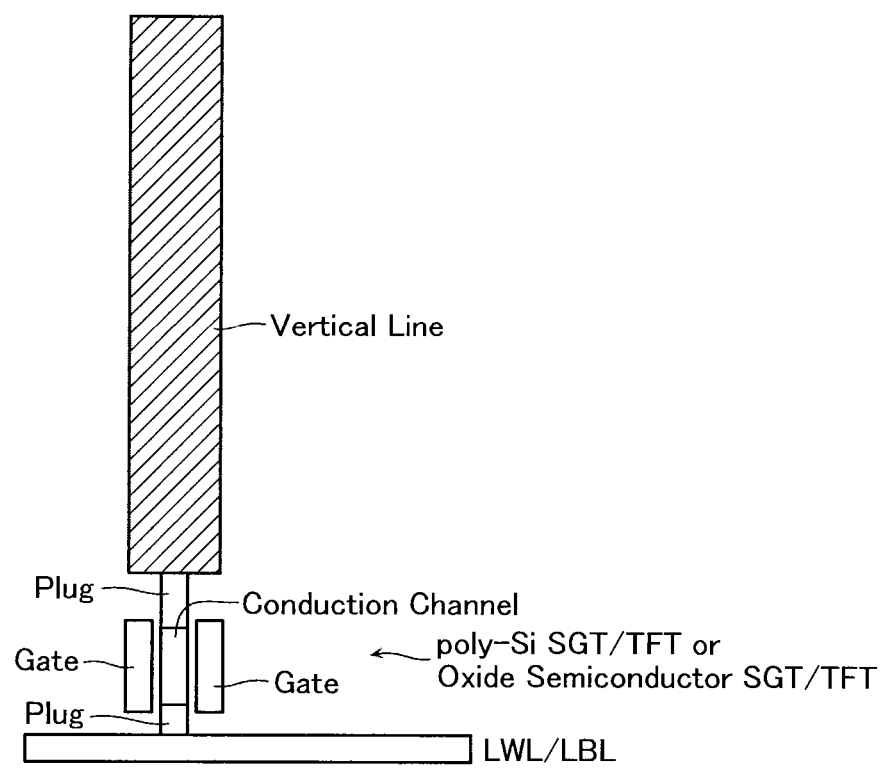
FIG. 26 is a cross-sectional view of a transistor in the stacking direction in the memory system according to the embodiment.

FIG. 26 is a diagram showing a cross-section of a transistor in the stacking direction in the memory system according to the embodiment.

The lowermost part of the structure shown in FIG. 26 is a layer of conductor running parallel to the surface of the semiconductor substrate, which is turned to local word lines LWL/local bit lines LBL. A plug is raised on the local word line LWL/local bit line LBL, and a gate-controlled, short pillar-shaped conduction channel is further formed thereon. Around the conduction channel, a conduction layer turned to a gate is formed with an insulator layer sandwiched therebetween. The conduction layer is formed by linking plural gates as a bus of gate lines around MATs along the sides of MATs as shown in FIG. 25. Plural conduction layers are formed and plural conduction layers extend in parallel. On the pillar-shaped conduction channel, a plug is formed. This plug is connected to a pillar-shaped conduction layer serving as a vertical line arranged around the upper MAT. This vertical line is connected to a selection line in a specific MAT of plural stacked MATs.

FIG. 25 shows an example of SGT/TFT conduction channels arranged as even as possible. Plural MATs are stacked from MAT<0> in the lowermost layer in order of MAT<1>, <2>, <3>. Selection lines in each MAT are connected to vertical lines closer to the MAT in order from selection lines in the lower MAT so as not to collide with vertical lines. In the layout of FIG. 25, four selection lines in each MAT are connected to one local word line/local bit line LWL/LBL selectively. The local word line/local bit line LWL/LBL corresponds to the local bus <m> shown in FIG. 24 and so forth. If it is assumed here that plural MATs are not selected simultaneously, the local word line/local bit line LWL/LBL is a common line to all MATs. It is connected to an individual bit line BL or word line WL in a MAT in accordance with a signal level supplied to gate lines around the MAT. The same local word line/local bit line LWL/LBL is connected to four selection lines. As described above, selection lines are led out alternately from the opposite sides in each MAT. Accordingly, eight selection lines on a MAT are narrowed down to one selection line by the layout shown in FIG. 25 and connected to the local word line/local bit line LWL/LBL immediately beneath the MAT. This makes it possible to relieve the pitch of local buses immediately beneath the MAT, thereby facilitating the layout of peripheral circuits such as sense amps SA.

The above description has been given to the cell array that has a structure of stacked cell array layers (MATs) in which intersecting word lines WL and bit lines WL are arranged in parallel with the principal plane of the semiconductor substrate. The following description is given to an example of a MAT (cell array) having a structure of bit lines BL extending vertically relative to the semiconductor substrate. Hereinafter, sometimes, a structure of memory cell layers stacked is referred to as a "stacked structure", a bit line extending in the vertical direction relative to the semiconductor substrate is represented by a "VBL", and a structure of a cell array having bit lines VBL is called a "VBL structure".

Figure 27:
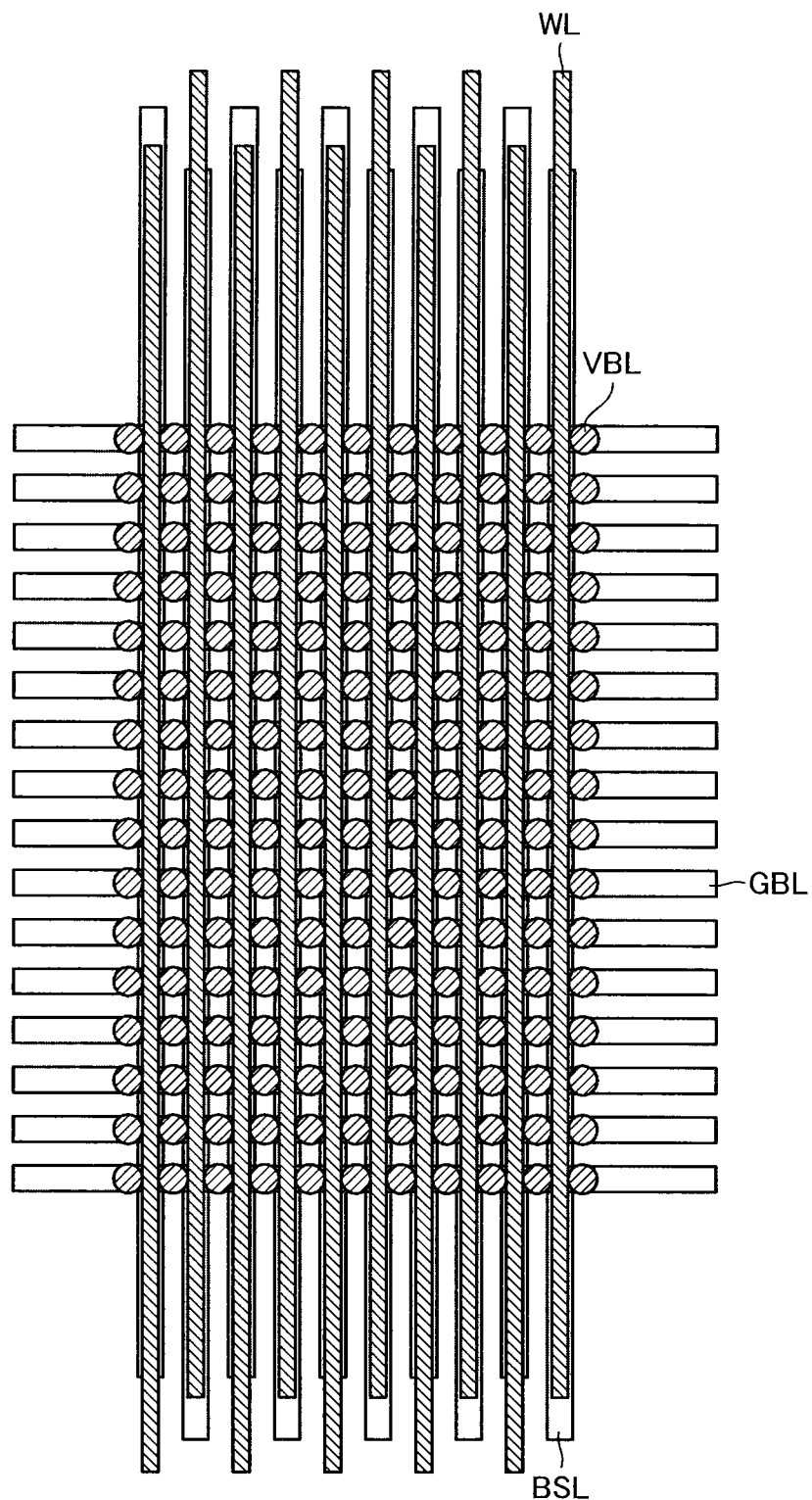
FIG. 27 is a diagram showing a layout of the cell array in the memory system according to the embodiment.
Figure 28:
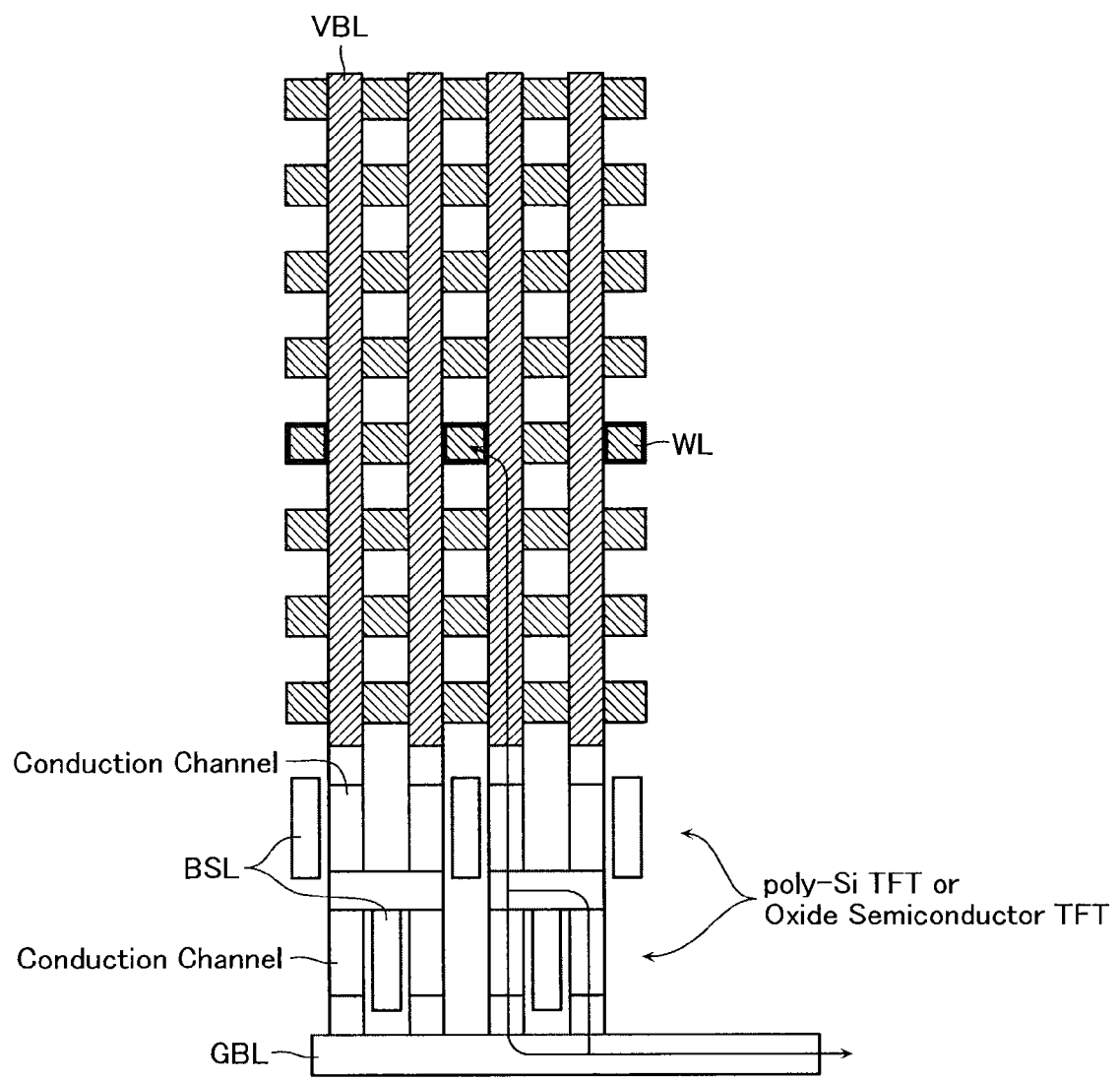
FIG. 28 is a diagram showing a layout of the cell array in the memory system according to the embodiment.
Figure 29:
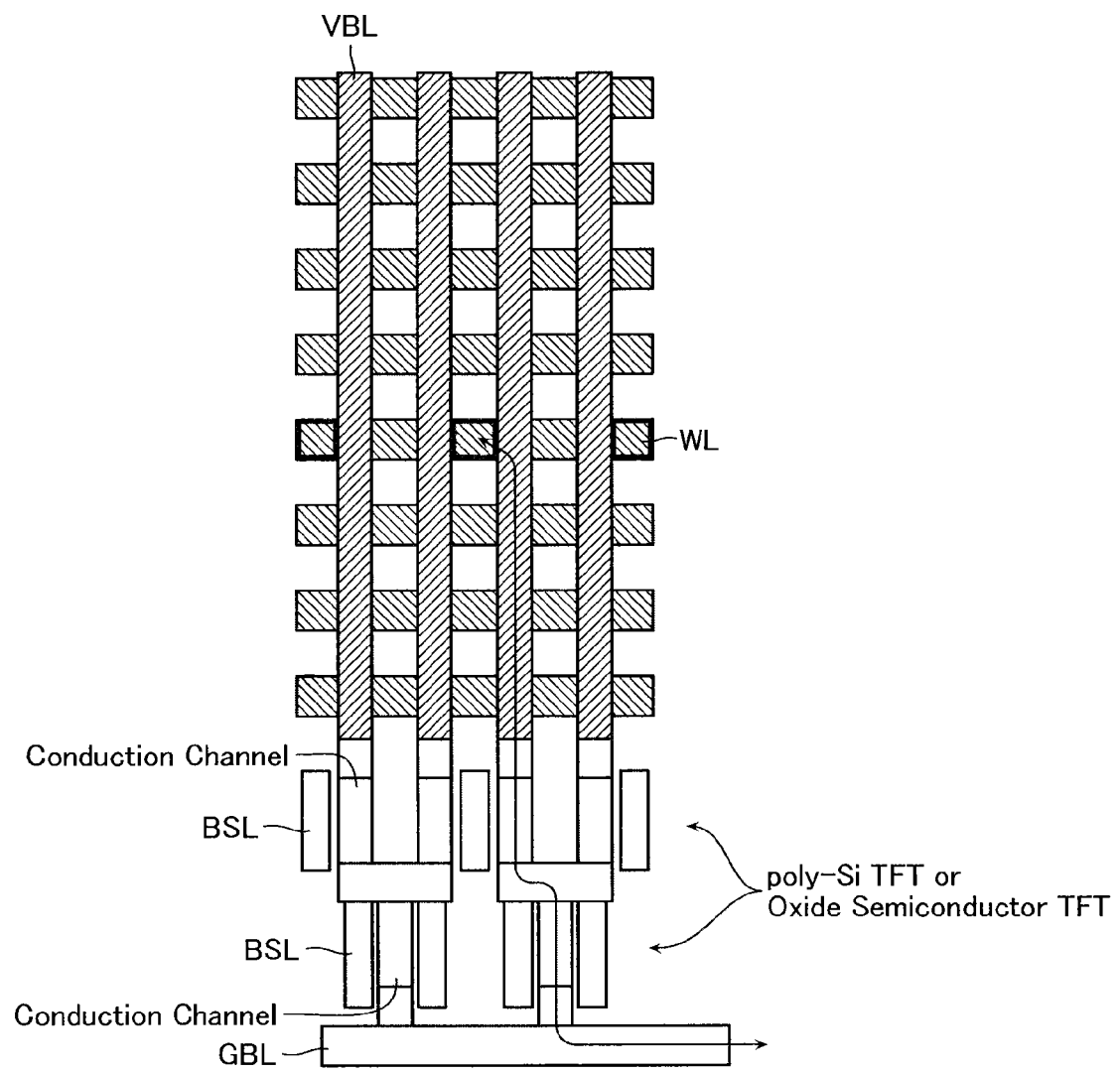
FIG. 29 is a diagram showing a layout of the cell array in the memory system according to the embodiment.

FIGS. 27-29 are diagrams showing layouts of the cell array in the memory system according to the embodiment. FIG. 27 shows a layout seen from the stacking direction, and FIGS. 28 and 29 are cross-sectional views in the vertical direction. In addition, a word line (second line) indicated with a thick frame in FIGS. 28 and 29 is a driven word line.

The VBL-structured MAT allows an arrangement of selection-line driver circuits immediately beneath the MAT. Therefore, it is possible to solve the increase in driver circuits around the MAT in accordance with the number of stacked cell array layers, which becomes a problem in a stacked structure. Namely, an arrangement of bit lines VBL (first line) in the vertical direction (third direction) relative to the semiconductor substrate can form driver circuits in a certain layout independent of the number of stacked cell array layers. In the case of the VBL structure, bit lines VBL are arranged vertically relative to the semiconductor substrate. Therefore, the cell structure greatly differs from that in the case of a stacked structure including bit lines BL arranged in parallel with a semiconductor substrate.

In the case of the VBL structure, TFT layers are provided in two layers on the semiconductor substrate immediately beneath the stacked MATs, and conduction paths composed of AND-structured transistors are formed in the vertical direction at bit lines VBL. In the VBL structure, bit lines VBL extending in the vertical direction are formed in pillar shapes and, as orthogonally intersecting therewith, word lines WL are stacked in the direction (first direction) running parallel with the principal plane of the semiconductor substrate. For one bit line VBL, one word line WL is selected at each memory cell layer. Further, even-numbered word lines WL and odd-numbered word lines WL aligned in each memory cell layer are arranged so that they can be selected alternately from the opposite sides of the cell array layer. In each memory cell layer, word lines WL are not selected individually. Accordingly, the area of word-line driver circuits can be reduced to that extent in comparison with the cell array having the stacked structure. Therefore, the area of selection-line driver units can be reduced greatly in comparison with the cell array having the stacked structure. A cell MC is formed at an intersection of a bit line VBL and a word line WL and driven by a voltage/current applied between the bit line VBL and the word line WL. A MAT includes plural TFT layers (transistor layers) stacked between the semiconductor substrate and the formation region of bit lines BL. In each TFT layer, plural TFTs are formed. A bit line VBL is selected by an AND circuit (logic circuit) composed of these TFTs. The selected bit line VBL is connected to a global bit line GBL (third line) extending in the direction (second direction) running parallel with the principal plane of the semiconductor substrate and orthogonally intersecting the extending direction of the word line WL. In the AND circuit composed of TFTs, control signals BSL in two layers for selecting the bit line BL are arranged to form the gate of each TFT in the AND circuit. As shown in FIG. 28, if the same number of TFTs are formed in two TFT layers (transistor layers) immediately beneath the cell array layer, selection of a pair from control signals BSL in two TFT layers makes it possible to select a row of bit lines VBL aligned in the extending direction of word lines WL. In addition, if TFTs are formed fewer in the first-layer TFT layer than those in the second-layer TFT layer, as shown in FIG. 29, the first-layer TFT layer makes it possible to configure the channel width by both surfaces of the TFT and form the gates on both sides. Thus, the first-layer TFT layer makes it possible to form TFTs having larger conductivity than those in the second-layer TFT layer, thereby obtaining larger conductance. A combination of selections of a logic circuit and a word line WL makes it possible to select a row of cells MC along the extending direction of the word line WL. These selected cells MC are driven by a global bit line GBL. Selective driving of the global bit line GBL makes it possible to control the number of cells MC simultaneously selected and write operation/read operation. Also in the case of the VBL structure, for control of the global bit line GBL, the same system for multi-value write operation and read operation as that in the case of the stacked structure can be applied to realize multi-valuing of a memory system having a three-dimensional structure.

The TFT having a gate supplied with the control signal BSL is formed of an oxide semiconductor. The TFT gate width cannot be made larger structurally and accordingly cells are desirable if they are of the voltage-driven type and resistance variable.

In a word, the VBL structure is more suitable for the voltage-driven ion memory and so forth than NT cells and so forth requiring current for phonons as is said. In the case of the use of the ion memory, the center of the pillar-shaped bit line VBL can be formed of a metal serving as an ion source, for example, Ag.

In the case of the VBL structure, cell MC groups along bit lines VBL are different in characteristic little by little from each other. Accordingly, variations arise in the conditions of setting multi-value levels at cells MC. Therefore, the above-described data storage on a pair-cell basis becomes effective.

Figure 30:
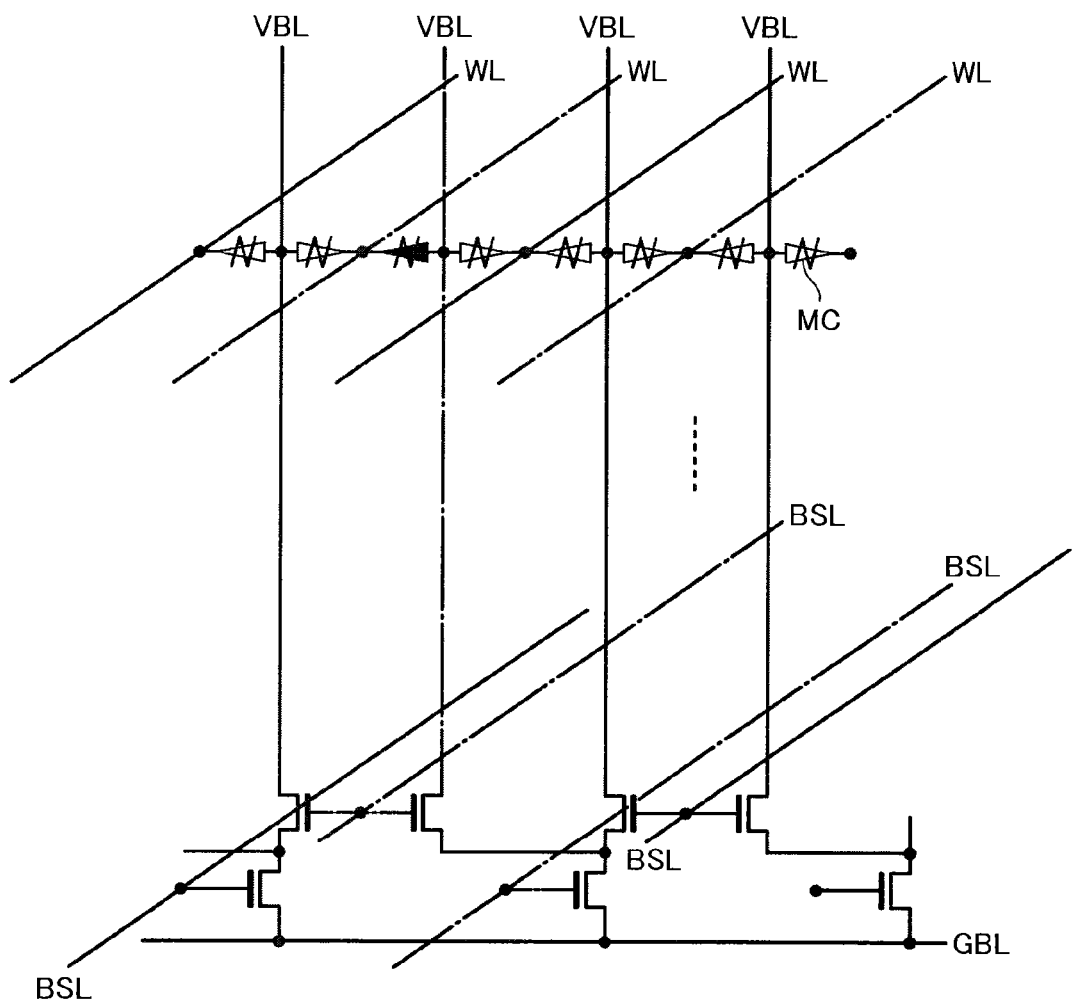
FIG. 30 is an equivalent circuit diagram of a VBL-structured cell array in the memory system according to the embodiment.

FIG. 30 is an equivalent circuit diagram of a VBL-structured cell array in the memory system according to the embodiment. In FIG. 30, TFTs are used as transistors.

As shown in FIG. 30, when the bit line VBL is driven by the control signal BSL and the word line WL shown with chain lines, the cell MC is electrically connected to the global bit line GBL. In the stacked TFTs, the number of nodes is reduced every time passing through logic, and accordingly the number of TFTs can be changed at every TFT layer. In the case of FIG. 30, the number of TFTs in the lower-layer TFT layer closer to the global bit line GBL is designed to become lower so as to increase the effective size of TFTs in the lower-layer TFT layer to gain lager conductance. Depending on the convenience of the design, the number of TFTs in the upper-layer TFT layer may be reduced.

The above description has been given to raising the information density by cell multi-valuing and the configuration of the corresponding specific memory system. In such the memory system, error correction becomes important in the presence of failed setting of a multi-value level. Then, the following description is given to ECC processing using an LMC capable of processing the error correction strongly and fast.

Figure 31:
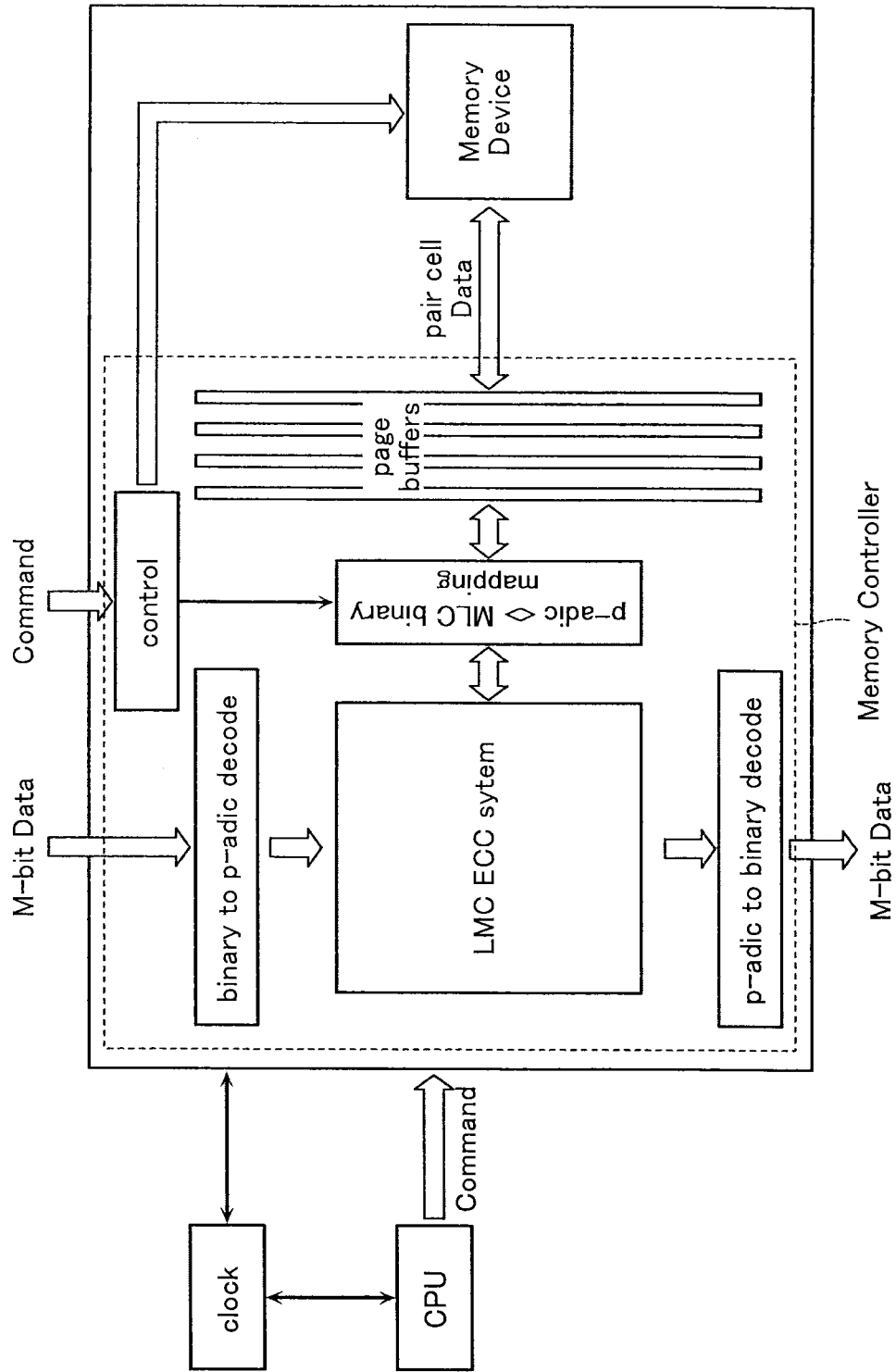
FIG. 31 is a functional block diagram of the memory system according to the embodiment.

FIG. 31 is a functional block diagram of the memory system according to the embodiment.

This memory system comprises a CPU, a memory controller, and a memory device composed of multi-value storable cells and so forth. In FIG. 31, the memory controller is a separate chip from the memory device though it may be mounted on the same chip as that for the memory device. The CPU sends a command to the memory controller. The memory controller receives this command and sends the corresponding command to the memory device to control the memory device. The CPU, the memory controller and the memory device are controlled by clocks. The clocks can be supplied to the CPU, the memory controller and the memory device commonly though they may be supplied via the CPU and the memory controller to the control-targeted memory device.

M bits of binary data input to the memory controller via the data bus are converted into the quantity in a finite field Zp, that is, a data processing system in the memory controller. Batch-processed binary data, in the presence of a relation $2^{h-1}<p<2^h$ and in the presence of a relation $2^{g-1}<q<2^g$ with successive primes q and p (p<q), becomes a set of M bits that satisfies qg≤M<ph. This is a restriction determined by LMC processing, and the relations among specific M, p and so forth are detailed later.

Binary data is processed at every M bits in the memory controller. At the start, binary data is converted into a p-adic expression in Zp at a 'binary to p-adic decode' circuit block. Then, the values on digits of the p-adic expression are applied to create an LMC. At that time, binary data is regarded as a $2^h$-adic number divided by h bits and converted into a p-adic number.

ECC processing is executed in an 'LMC ECC system' circuit block.

Subsequently, coded elements in Zp are related to levels of a multi-valued cell composed of a pair cell in the memory device and subjected to data conversion so that Lee metrics in Zp correspond to distances between cell levels. This conversion is executed in a 'p-adic <> MLC binary mapping' circuit block. In this 'p-adic <> MLC binary mapping' circuit block, elements in Zp are converted into pieces of data corresponding to multi-values of a cell and stored in a page buffer. When the page buffer is filled with data, these pieces of data are transferred from the memory controller to the memory device and written in pair cells. These operations are controlled by a command sent from a 'control' circuit block to the memory device in accordance with the command input to the memory controller. The page buffer is configured reflecting the relation between multi-value levels of a cell and pages. The elements in Zp are stored as multi-value levels of a cell after data is transferred from the page buffer to the memory device.

In reading data from the memory device, data corresponding to the multi-value level of the cell is read out in accordance with the command received from the memory controller, and this data is transferred to a page buffer in the memory controller and held therein. The data held in the page buffer is converted into a numeral in Zp at the 'p-adic <> MLC binary mapping' circuit block. The converted data is subject to error correction at the 'LMC ECC system' circuit block and restored to the correct LMC, and then converted into data expressed in a p-adic number. Thereafter, the data expressed in a p-adic number is converted into M bits of binary data at the 'p-adic to binary decode' circuit block and provided to external from the memory controller.

In the above ECC processing, simplification of computation processing at the 'LMC ECC system' circuit block and the computation speed become important. Then, the following description is given to one of methods for making simpler the computation process of ECC processing.

At the start, an LMC is briefly described.

Symbols of a code C are representative elements in $Z_p$, or integers $c_j$ of 0 to p−1, as shown in Expression 1.

$c_j \in GF(p) = Zp,\ 0 \le c_j < p$ [Expression 1]

The metrics of these integers are represented by Lee metrics $|c_j|$, and all Lee metrics $|c_j|$ are represented by integers of p/2 or below. Lee metrics $|c_j|$ are defined as in Expression 2.

$0 \le c_j < p/2:\ |c_j| = c_j$ $p/2 < c < p:\ |c_j| = p - c_j$ [Expression 2]

As the code C can be considered a row of n=p−1 symbols $c_j$, it can be represented by C=($c_1, c_2, \ldots, c_{p-1}$). A metric w(C) of the code C can be defined as the sum of Lee metrics $|c_j|$ of the symbols as in Expression 3.

$w(C) = |c_1| + |c_2| + \ldots + |c_{p-1}|$ [Expression 3]

The distance between codes can be defined by the sum of Lee metrics of the differences between the symbols corresponding to the codes. Here, two symbols c and y have a difference (Lee distance) $d_L$ (c, y), which is given in Expression 4.

$d_L(c,y) = w(c-y)$ [Expression 4]

In this case, the LMC is such a code that has the minimum distance of $2\overset{3}{\gamma}$ between codes having a generator matrix G and a syndrome matrix H shown in Expression 5 and that can correct $\gamma-1=\epsilon$ or lower Lee metric errors.

$$G = \begin{bmatrix} 1 & 2 & \ldots & (p-1) \\ 1^2 & 2^2 & \ldots & (p-1)^2 \\ & & \ddots & \\ 1^k & 2^k & \ldots & (p-1)^k \end{bmatrix}$$ [Expression 5]

$$H = \begin{bmatrix} 1 & 2 & \ldots & (p-1) \\ 1^1 & 2^1 & \ldots & (p-1)^1 \\ & & \ddots & \\ 1^{\gamma-1} & 2^{\gamma-1} & \ldots & (p-1)^{\gamma-1} \end{bmatrix}$$

When the word length of the code C is denoted with n and the word length of data is denoted with k, then $\gamma=n-k$ where $\gamma$ represents the redundant word length contained in the code C. If $\gamma=n-k=3$, then $d_L(C)\geq 2\gamma=6$, which makes it possible to obtain a code capable of correcting the variation total sum of Lee metrics if it is equal to $\gamma-1=\epsilon=2$ or below.

For the purpose of generating the LMC thus configured, input-converted data is represented by a k-digit, p-adic number. Numerals on digits of this p-adic number correspond to the elements in Zp and therefore can be used as a data word X of LMC to obtain the code C through an operation C=XG using the generator matrix G. The obtained code is stored in the memory. Information about the error caused in the numeral in Zp stored is used as a code Y of LMC read out of the memory to obtain a syndrome through an operation $S=YH^t$ ($H^t$ is a transpose of H) so that the position and quantity of the error can be computed to correct the error.

The data word X is obtained as $X=CG^{-1}$ from the error-corrected code expression C where $G^{-1}$ is generally as in Expression 6.

$$G^{-1} = (p-1) \begin{bmatrix} 1^{-1} & 1^{-2} & \ldots & 1^{-k-1} & 1^{-k} \\ 2^{-1} & 2^{-2} & \ldots & 2^{-k-1} & 2^{-k} \\ \vdots & \vdots & \ldots & \vdots & \vdots \\ (p-2)^{-1} & (p-2)^{-2} & \ldots & (p-2)^{-k-1} & (p-2)^{-k} \\ (p-1)^{-1} & (p-1)^{-2} & \ldots & (p-1)^{-k-1} & (p-1)^{-k} \end{bmatrix}$$ [Expression 6]

In the case of $\epsilon=2$, G and H are as in Expression 7.

$$G = \begin{bmatrix} 1 & 2 & \ldots & (p-2) & (p-1) \\ 1^2 & 2^2 & \ldots & (p-2)^2 & (p-1)^2 \\ & & \ddots & & \\ 1^{p-4} & 2^{p-4} & \ldots & (p-2)^{p-4} & (p-1)^{p-4} \end{bmatrix}$$ [Expression 7]

$$H = \begin{bmatrix} 1 & 1 & \ldots & 1 & 1 \\ 1^1 & 2^1 & \ldots & (p-2)^1 & (p-1)^1 \\ 1^2 & 2^2 & \ldots & (p-2)^2 & (p-1)^2 \end{bmatrix}$$

From a data word A composed of k=p−4 elements in Zp, a syndrome created by the code C=AG is created through $S=YH^t$.

The following description is given to a relational expression required for a specific circuit in the case of $\gamma=\epsilon+1=3, \epsilon=2$.

The binary data of the code C held in the memory device includes a collection of p−1 symbols. The code symbols themselves cause variations when suffer various disturbances. Then, the code C is restored from the code Y in decoding. Prior to the decoding, a syndrome is sought at the start. Each symbol is represented by h bits as binary-expressed data.

The syndrome can be sought as elements $S_0, S_1, S_2$ shown in Expression 8 through an operation $S=YH^t$ using a syndrome matrix H where $y_j=a_j+e_j$.

$$\sum_{j=1}^{p-1}(j)^l c_j =$$ [Expression 8]

$$\sum_{i=1}^{k} a_{i-1} \sum_{j=1}^{p-1}(j)^{l+i} = 0 \Rightarrow S_1 = \sum_{j=1}^{p-1}(j)^l y_j = \sum_{j=1}^{p-1}(j)^l e_j,$$

$$S_0 = \sum e_j$$

The generator matrix G and the syndrome matrix H are configured to satisfy $GH^t=0 \pmod p$. Accordingly, a substitution of Y=C+E yields $S=EH^t$. If $E=(e_1, e_2, \ldots, e_{p-1})$, then a syndrome $S_0$ corresponds to the total sum of errors in code symbols as can be found. Only the syndromes S provide information on errors and, on the basis of the syndromes S, the correct code C is restored as follows.

Subsequently, the principle of decoding is described. Here, n=p−1 error symbols are classified into two sets $J_+$ and $J_-$ as in Expression 9.

$$J_+ = \{j \in (1,2,\ldots,p-1); e_j < p/2\}$$

$$J_- = \{j \in (1,2,\ldots,p-1); e_j > p/2\}$$ [Expression 9]

Namely, they are classified into $J_+$ that is an arrangement of the positions j of the code symbols $c_j$ in the case of the symbol error quantity $e_j<p/2$, and $J_-$ that is an arrangement of the positions j of the code symbols $c_j$ in the case of the symbol error quantity $e_j>p/2$. Polynomials $\Lambda(x), V(x)$ in the Galois field GF(p) are configured as in Expression 10 on the basis of these sets.

$$\Lambda(x) = \prod_{j \in J_+}(1-jx)^{e_j}$$ [Expression 10]

$$V(x) = \prod_{j \in J_-}(1-jx)^{p-e_j}$$

Thus, the polynomial $\Lambda(x)$ is a polynomial that has a reciprocal number of the position j of an error symbol in $J_+$ as a root and that has a Lee metric $e_j$ of that code symbol as the multiplicity of the root. On the other hand, the polynomial V(x) is a polynomial that has a reciprocal number of the position j of an error code word symbol in $J_-$ as a root and that has a Lee metric, $p-e_j$, of that code symbol as the multiplicity of the root. Decoding is a process of finally configuring these polynomials only from the information on the syndrome $S_1$ and solving them, thereby obtaining information on errors. In a word, it is required to seek a relation among these polynomials $\Lambda(x), V(x)$ and the syndrome $S_1$.

Subsequently, as shown in Expression 11, when it is configured with a series polynomial having each syndrome $S_1$ on a coefficient of the corresponding degree, it is represented by a rational polynomial having the error quantity $e_j$, the position j and the value of the symbol.

$$S(x) = \sum_{l=1}^{\infty} S_l x^l = \sum_{j=1}^{p-1} e_j \sum_{l=1}^{\infty} (jx)^l = \sum_{j=1}^{p-1} e_j \frac{jx}{1-jx} \quad \text{[Expression 11]}$$

From Expression 11, a relational equation shown in Expression 12 can be established among the polynomials $\Lambda(x)$, $V(x)$ and the syndrome $S(x)$.

$$\left(\frac{\Lambda(x)}{V(x)}\right)S(x) = -x\left(\frac{\Lambda(x)}{V(x)}\right)' \quad \text{[Expression 12]}$$

Subsequently, the relational equation shown in Expression 12 is utilized to seek the polynomials $\Lambda(x)$, $V(x)$ from the syndrome $S(x)$.

The syndrome $S(x)$ is used to find a polynomial $\Psi(x)$ at a degree of $(\gamma-1)$ or lower shown in Expression 13.

$$\Psi(x)S(x) = -x\Psi'(x)(\mathrm{mod}\, x^3) \quad \text{[Expression 13]}$$
$$\Psi(x) = 1 + \sum_{l=1}^{} \psi_l x^l, \psi_j = -\frac{1}{j}\sum_{i=1}^{j}\psi_{j-i}S_i$$

In an expansive expression of the polynomial $\Psi(x)$, a coefficient $\psi_j$ can be sought, from a comparison between the coefficients at the homogeneous degree on both sides of the expression shown in Expression 13, through an iterative method using the syndrome $S_i$ and an already-determined coefficient $\psi_{j-1}$. The coefficients $\psi_0$–$\psi_2$ of the polynomial $\Psi(x)$ are sought from the syndrome $S=(S_0, S_1, S_2)$. The results are shown in Expression 14.

$\psi_0 = 1$ $\psi_1 = -S_1$ $\psi_2 = -(\psi_1 S_1 + \psi_0 S_2)/2 = (S_1^2 - S_2)/2$ [Expression 14]

This polynomial $\Psi(x)$ is a polynomial equivalent to $\Lambda(x)/V(x)$ while the polynomials $\Lambda(x)$, $V(x)$ are given key conditions shown in Expression 15. Therefore, they can be sought through a Euclid iterative method applied to $x^3$ and the polynomial $\Psi(x)$ to remove constant multiples.

$V(x)\Psi(x) \equiv \Lambda(x)(\mathrm{mod}\, x^3)$ $\deg \Lambda(x) + \deg V(x) < 3$ $\Lambda(x)$ and $V(x)$ are irreducible $\deg \Lambda(x) - \deg V(x) \equiv S_0 (\mathrm{mod}\, p)$ [Expression 15]

Therefore, if the polynomial $\Psi(x)$ can be configured from the syndrome $S=(S_0, S_1, S_2)$, the syndrome $S_0$ can be used as the stop condition on the iterative method to seek the polynomials $\Lambda(x)$, $V(x)$. Namely, the iterative method is applied to seek the polynomials $\Lambda(x)$, $V(x)$ from a set of $(S_0, \Psi(x))$.

A Euclid iterative method applicable to $x^3$ and $\Psi(x)$ is described next.

The following description is given to a method for deriving polynomials $\lambda(x)$ and $v(x)$ that satisfy a congruence equation, $v(x)\Psi(x) \equiv \lambda(x)(\mathrm{mod}\, x^3)$, using the Euclidean iterative method, in accordance with the stop condition, $\deg \lambda(x) - \deg v(x) \equiv S_0(\mathrm{mod}\, p)$. Of the polynomials $\lambda(x)$ and $v(x)$ derived, one that satisfies $\deg \lambda(x) + \deg v(x) < 3$ is the error searching polynomial.

The Euclidean iterative method is a method for deriving functions $f_0, f_1, \ldots, f_n$ in turn using divisions of polynomials. These quantities have relations shown in Expression 16.

$$f_0 = k_0 f_1 + f_2, f_1 = k_1 f_2 + f_3, \ldots, \quad \text{[Expression 16]}$$
$$f_n = k_n f_{n+1} + f_{n+2} \quad p_{-1} = 0, p_0 = 1,$$
$$p_n = k_{n-1} p_{n-1} + p_{n-2} \quad q_0 = 0, q_1 = 1,$$
$$q_n = k_{n-1} q_{n-1} + q_{n-2}$$

$$p_n f_n + p_{n-1} f_{n+1} = (k_{n-1} p_{n-1} + p_{n-2}) f_n + p_{n-1} f_{n+1}$$
$$= p_{n-1}(k_{n-1} f_n + f_{n+1}) + p_{n-2} f_n$$
$$= p_{n-1} f_{n-1} + p_{n-2} f_n$$
$$\vdots$$
$$= p_0 f_0 + p_{-1} f_1 = f_0$$

$$q_n f_n + q_{n-1} f_{n+1} = (k_{n-1} q_{n-1} + q_{n-2}) f_n + q_{n-1} f_{n+1}$$
$$= q_{n-1}(k_{n-1} f_n + f_{n+1}) + q_{n-2} f_n$$
$$= q_{n-1} f_{n-1} + q_{n-2} f_n$$
$$\vdots$$
$$= q_1 f_1 + q_0 f_2 = f_1$$

$$f_0 = p_n f_n + p_{n-1} f_{n+1},$$
$$f_1 = q_n f_n + q_{n-1} f_{n+1}$$

$$\begin{vmatrix} p_n & p_{n-1} \\ q_n & q_{n-1} \end{vmatrix} =$$
$$\begin{vmatrix} k_{n-1} p_{n-1} & p_{n-1} \\ k_{n-1} q_{n-1} & q_{n-1} \end{vmatrix} = \begin{vmatrix} p_{n-1} & p_{n-2} \\ q_{n-1} & q_{n-2} \end{vmatrix} \rightarrow p_n q_{n-1} -$$
$$p_{n-1} q_n (-1)^{n-1}(p_1 q_0 - p_0 q_1) = (-1)^n$$

$$f_n = (-1)^n (q_{n-1} f_0 - p_{n-1} f_1)$$

$$\therefore f_n \equiv (-1)^{n+1} p_{n-1} \Psi(\mathrm{mod}\, x^3),$$

$$f_0 = x^3, f_1 = \Psi$$

In this case, increases in n inevitably find $f_n$ having a smaller degree than the previous degrees at a certain n as shown in Expression 16. This fact leads to the condition indicating the presence of the possibility of deriving a solution that satisfies the stop condition in the Euclidean iterative method.

In particular, with sequential introductions of $p_n$ and $q_n$ from the quotient polynomials $k_n$ obtained in the process of divisions, these polynomials can satisfy simple relations. Therefore, $f_n$ can be represented by $f_0$, $f_1$, $p_{n-1}$ and $q_{n-1}$. Namely, $f_n = (-1)^n (q_{n-1} f_0 - p_{n-1} f_1)$ is established such that the degrees of $p_{n-1}$ and $q_{n-1}$ increase as the degree of $f_n$ decreases. Because the degree of $p_{n-1}$ increases as the degree of $f_n$ decreases in this way, the difference between degrees decreases inevitably to satisfy the stop condition.

Generally, in the Euclidean iterative method, $f_n = k_n f_{n+1} + f_{n+2}$ utilizes the sequential decreases in degree in relation to divisions while $k_n$ assumes a first- or zero-degree equation here and accordingly the degree cannot decrease always. Rather, the degree may increase but cannot exceed the degree of $f_0$. In any way, if the relation about the factorization of the above polynomial $\Psi(x)$ is established, the relation shown in Expression 16 can be established. Therefore, it is possible to finally lower the degree to satisfy the stop condition on the iteration.

When substitutions of $f_0=x^3$, $f_1=\Psi(x)$ are made to create a congruence equation at $x^3$, the stop condition on the iteration comes to $\deg f_n - \deg p_{n-1} \equiv S_0 \pmod{13}$. With respect to n that satisfies this stop condition, if $\deg f_n + \deg p_{n-1} < 3$, then substitutions of $\lambda(x)=f_n$, $V(x)=p_{n-1}$ are possible.

On the other hand, if it is not possible to achieve such the degree relation, it means the occurrence of an error that cannot satisfy the error-correctable condition.

The use of the above-described Euclid iterative method makes $\Psi(x)$ become a second-order polynomial in the case of $\epsilon=2$. As the polynomial of $\Psi(x)$ has a smaller degree in this way, it is possible to compute operation results of $\Psi(x)$ for the coefficients of a specific easy general polynomial. The results are shown in Expression 17.

[Expression 17]

$\psi_2 \neq 0 \quad \psi_2 \neq \psi_1^2$ $f_0 = x^3$ $f_1 = \psi_2 x^2 + \psi_1 x + 1$ $f_2 = \{(\psi_1^2 - \psi_2)/\psi_2^2\}x + \psi_1/\psi_2^2$ $f_3 = \psi_2^2/(\psi_1^2 - \psi_2)^2$ $f_4 = 0$ $p_{-1} = 0$ $p_0 = 1$ $p_1 = (1/\psi_2)x - \psi_1/\psi_2^2 x + 1$ $p_2 = \{\psi_2/(\psi_1^2 - \psi_2)\}x^2 - \{\psi_1\psi_2/(\psi_1^2 - \psi_2)^2\}x + \psi_2/(\psi_1^2 - \psi_2)^2$ $p_3 = \{(\psi_1^2 - \psi_2)^2/\psi_2^2\}x^3$    Case 1:

$\psi_2 \neq 0 \quad \psi_2 = \psi_1^2$ $f_0 = x^3$ $f_1 = \psi_2 x^2 + \psi_1 x + 1$ $f_1 = \psi_2 x^2 + \psi_1 x + 1$ $f_3 = 0$ $p_{-1} = 0$ $p_0 = 1$ $p_1 = (1/\psi_2)x - \psi_1/\psi_2^2$ $p_2 = \{\psi_2^2/\psi_1\}x^3$    Case 2:

$\psi_1 \neq 0 \quad \psi_2 = 0$ $f_0 = x^3$ $f_1 = \psi_1 x + 1$ $f_2 = -1/\psi_1^2$ $f_3 = 0$ $p_{-1} = 0$ $p_0 = 1$ $p_1 = (1/\psi_1)x^2 - (1/\psi_1^2)x + 1/\psi_1^3$ $p_2 = -\psi_1^3 x^3$    Case 3:

$\psi_1 = 0, \psi_2 = 0$ $f_0 = x^3$ $f_1 = 1$ $f_2 = 0$ $p_{-1} = 0$ $p_0 = 1$ $p_1 = x^2$    Case 4:

When substitutions of $f_0 = x^3$, $f_1 = \Psi(x) = 1 + \psi_1 x + \psi_2 x^2$ are made to seek polynomials using the Euclidean iterative method, four cases shown in Expression 17 arise in accordance with the conditions on coefficients of $\Psi(x)$. The conditions in these cases depend on the presence/absence of divisions by zero. From the polynomials obtained at computation processes in the cases, a pair of f(x) and p(x) that satisfies the key condition shown in Expression 15 is selected to seek $\lambda(x)$ and $v(x)$. A specific method for selecting a pair of f(x) and p(x) is described later.

The same method as the above-described one can be applied to seek a fourth-degree and a third-degree polynomial in the case of $\epsilon=3$ or a polynomial in the case of a higher $\epsilon$ as well. In this case, however, as the case classification and so forth are complicated, the complexity becomes equal to that in the case of the clock-operated circuit system that realizes the conventional Euclid iterative method as it is. Therefore, the above-described method is useful as fast direct computations in the case of $\epsilon=2$.

The above description has been given to the LMC, the ECC processing, and the generation of the error searching polynomial using the Euclid method in the case of $\epsilon=2$ in relation to the embodiment. Then, the subsequent description is given to the conversion at the entrance of a p-adic Zp world in ECC processing, encoding of data input to the memory system as Zp data, decoding of the code read from the memory system, and the conversion at the exit of the p-adic Zp world. It is also given to a specific example of the circuit for realizing these processing.

A "binary world" is an environment for processing an operation and so forth with binary-expressed data while a "p-adic Zp world" is an environment for processing an operation and so forth with data expressed by numerals in Zp.

Figure 32:
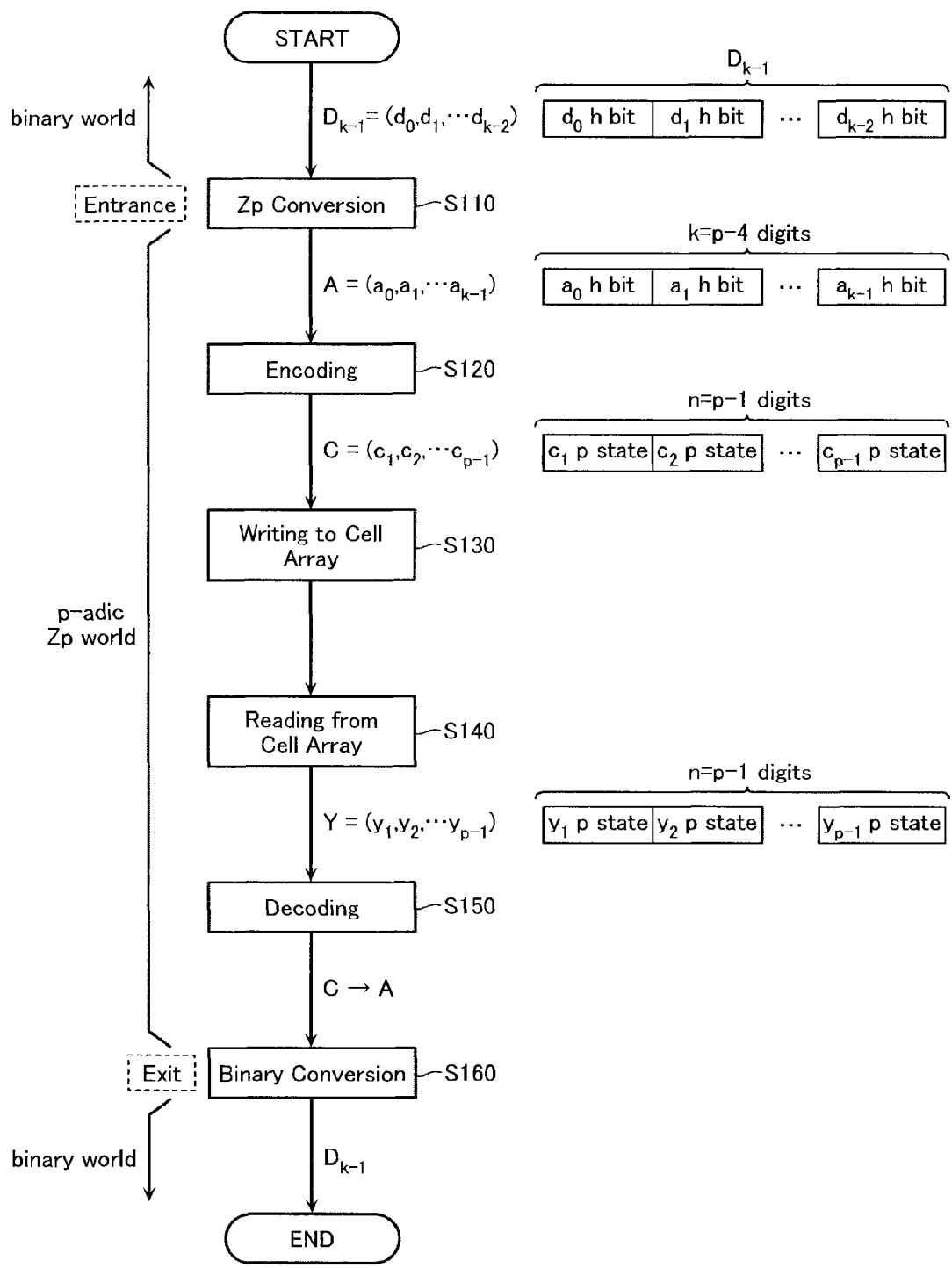
FIG. 32 is a flow chart of data processing in the memory system according to the embodiment.

FIG. 32 is a flow chart of data processing in the memory system according to the embodiment.

A Zp-determining prime is denoted with p. The minimum number of bits required for a binary expression of p is denoted with h. The number of digits in a $2^h$-adic number expression of batch-processed data in the binary world is denoted with k−1. The total quantity of Lee metrics of correctable errors is denoted with $\epsilon=\gamma-1=2$. In addition, n=p−1, k=n−γ=p−4 are given, and (k−1)h bits of data are subject to ECC processing in batch.

At the start, at the entrance of the p-adic Zp world in step S110, data $D_{k-1}=(d_0, d_1, \ldots, d_{k-2})$ expressed in a (k−1)-digit, $2^h$-adic number is converted into data $A=(a_0, a_1, \ldots a_{k-1})$ expressed by k=p−4 elements in Zp. $D_{k-1}$ is composed of k−1 pieces of h-bit data. The maximum number expressed by h bits is equal to max(h)=$2^h$−1. When the number of multi-value levels of a cell is denoted with L, a relation can be established as max(h−1)+1≤p≤max(h)≤L.

Subsequently, at step S120, $A=(a_0, a_1, \ldots a_{k-1})$ composed of k=p−4 numerals $a_0$ to $a_{p-5}$ in Zp is multiplied by a generator matrix G to generate a code C composed of n=p−1 code symbols $c_1$ to $c_{p-1}$. A code symbol $c_j$ is as shown in Expression 18.

$$C_j = \sum_{i=0}^{p-5} (j)^{i+1} a_i \quad \text{[Expression 18]}$$

Subsequently, at step S130, the code C is written in a cell array such that the code symbols $c_1$ to $c_{p-1}$ are associated with multi-value levels of a cell.

Subsequently, at step S140, the code stored and held in the cell array is read out. The read data is a code Y derived from the code C possibly having any error.

Subsequently, at step S150, the code Y is decoded. In decoding, an LMC-using ECC is applied to correct the error in the code Y to restore the code C. Thereafter, based on $A=CG^{-1}$, data A is restored from the code C. The process of error correction of the code Y is detailed later.

Finally, at the exit of the p-adic Zp world in step S160, binary-expressed data $D_{k-1}$ is derived from the data A.

Next, decoding at step S150 shown in FIG. 32 is detailed.

In decoding, ECC processing for correction of errors in an LMC is executed mainly.

Figure 33:
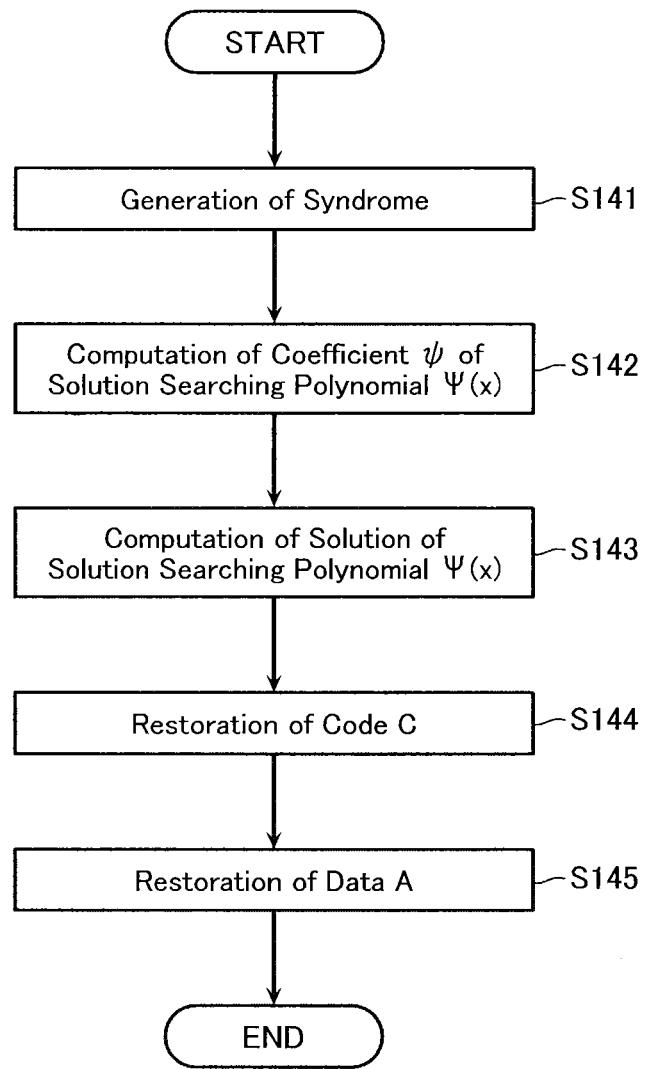
FIG. 33 is a flow chart of decoding in the memory system according to the embodiment.

FIG. 33 is a flow chart of decoding in the memory system according to the embodiment.

As described above, at step S140, the code Y is read from the cell array. When the error contained in the code Y=($y_1$, $y_2$, ..., $y_{p-1}$) is denoted with E=($e_1$, $e_2$, ... $e_{p-1}$), the code Y can be represented by Y=C+E.

In decoding, at the start, at step S141, from the code Y=($y_1$, $y_2$, ..., $y_{p-1}$) and $S=YH^t$, a syndrome $S=(S_0, S_1, S_2)$ is computed. A syndrome component $S_1$ is as in Expression 19.

$$S_1 = \sum_{j=1}^{p-1} (j)^1 y_j = \sum_{j=1}^{p-1} (j)^1 e_j \quad \text{[Expression 19]}$$

Here, as $S_0 = \Sigma e_j$, in the case of $S \neq 0$ and $|S_0|>2$, errors have the total quantity of Lee metrics equal to 3 or more and are uncorrectable. Therefore, this case is processed as no solution. The case of S=0 is processed as no error. In other cases, the flow goes to subsequent step S142.

Subsequently, at step S142, for the upper limit, $\epsilon=2$, of the number of correctable code symbols, a solution searching polynomial $\Psi(x)=(1, \psi_1, \psi_2)$ is derived from syndrome components $S_0, S_1$ and $S_2$ obtained at step S141. $\Psi(x)$ is as shown in Expression 20.

$$\Psi(x) = 1 + \sum_{j=1}^{2} \psi_j x^j = 1 + \psi_1 x + \psi_2 x^2 \quad \text{[Expression 20]}$$

$$\psi_0 = 1$$

$$\psi_1 = -S_1$$

$$\psi_2 = -(\psi_1 S_1 + \psi_0 S_2)/2 = (S_1^2 - S_2)/2$$

Subsequently, at step S143, it is diverged based on $\psi_1$ and $\psi_2$ into three cases matching to the solution searching polynomial $\Psi(x)$ obtained through the Euclid method and the key conditions, and further diverged in each case based on $S_0$ to obtain a solution. Three cases are as shown in Expression 21.

[Expression 21]

$S_0=2: f_1=\psi_2 x^2+\psi_1 x+1=0$ $S_0=0: f_2=\{(\psi_1^2-\psi_2)/\psi_2^2\}x+\psi_1/\psi_2^2=0, p_1=(1/\psi_2)x-\psi_1/\psi_2^2=0$ $S_0=-2:$ $p_2=\{\psi_2^2/(\psi_1^2-\psi_2)\}x^2-\{\psi_1\psi_2^2/(\psi_1^2-\psi_2)^2\}x+\psi_2^2/(\psi_1^2-\psi_2)^2=0$    Case 1:

$\psi_2 \neq 0 \; \psi_2 = \psi_1^2$ $S_0=2: f_1=\psi_2 x^2+\psi_1 x+1=0$ $S_0=-1: p_1=(1/\psi_2)x-\psi_1/\psi_2^2=0$    Case 2:

$\psi_1 \neq 0 \; \psi_2=0$ $S_0=1: f_1=\psi_1 x+1=0$ $S_0=-2: p_1=(1/\psi_1)x^2-(1/\psi_1^2)x+1/\psi_1^3=0$    Case 3:

At step S143, if the condition of divergences is not applicable, or if the diverged solution searching polynomial $\Psi(x)$ has no solution, it is not possible to find any solution at $\epsilon=2$. In this case, errors are uncorrectable, and accordingly decoding is stopped.

Subsequently, at step S144, a solution r obtained at step S143 is used to restore the correct code C. When the position of a component y of the error-containing code Y is denoted with $t=r^{-1}$, and the error quantity is denoted with $e_t$, the correct code C can be restored from $c_t=y_t-e_t$.

Finally, at step S145, the right inverse matrix $G^{-1}$ of the generator matrix G is used to derive an element $a_j$ in Zp from $A=CG^{-1}$. Thus, data A=(a0, a1, ..., $a_{k-1}$) is restored as k=p−4 symbols.

Next, ECC processing in the case of $\epsilon=2$ is described. A system described herein can be mounted on a chip by processing ECC asynchronously to realize fast processing and simplification.

Figure 34:
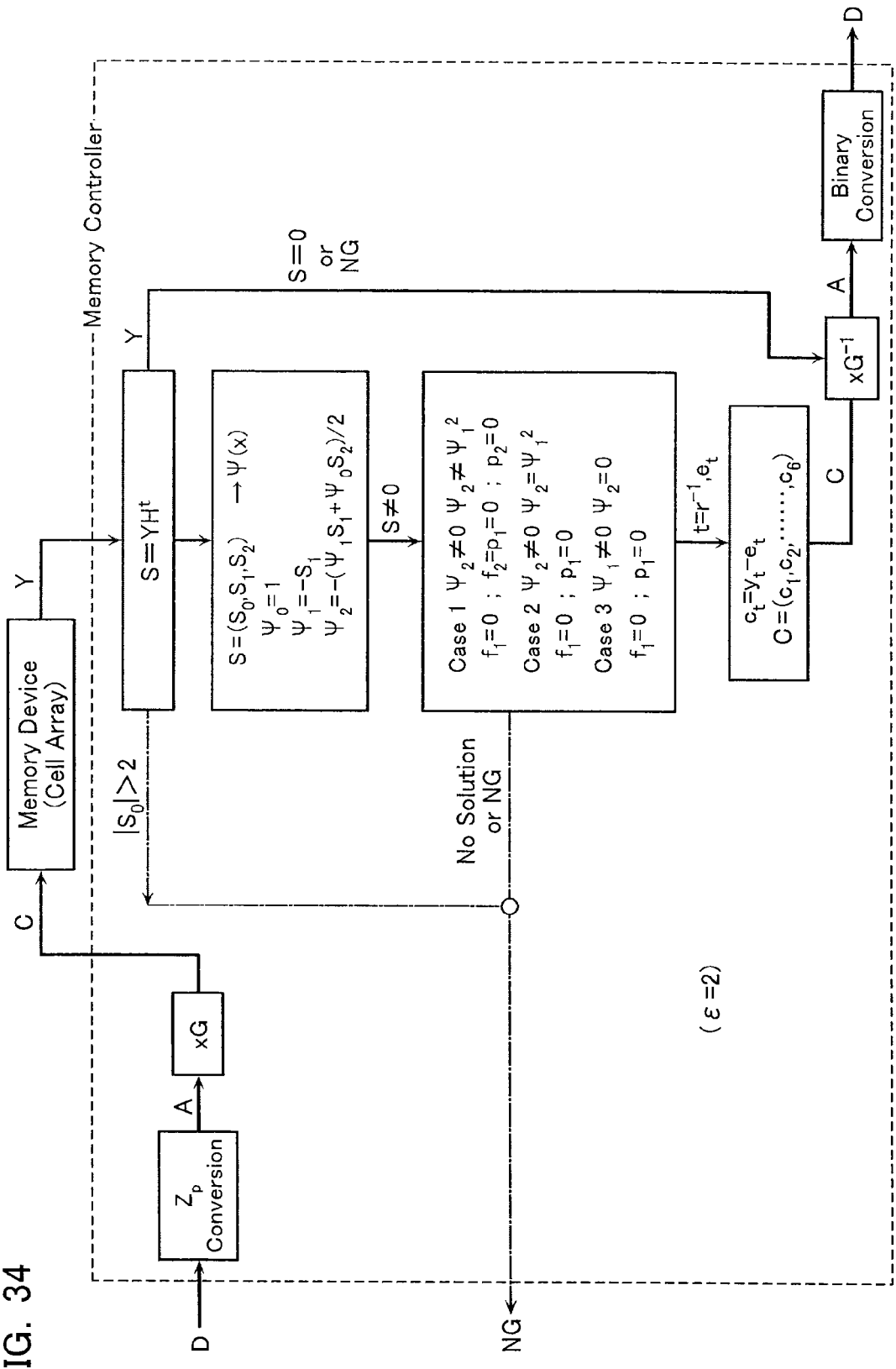
FIG. 34 is a block diagram of ECC processing in the memory system according to the embodiment.

FIG. 34 is a block diagram of ECC processing in the memory system according to the embodiment.

Data input to the controller is binary data D having sets of M=h(k−1)=h(p−5) bits. A M-bit, binary-expressed number is converted at a Zp conversion block into data A having digits composed of elements in Zp. The data A is converted at a ×G block into an LMC code C and written in a multi-valued memory device (cell array) from the memory controller.

The data read from the memory device is an LMC code Y, which contains errors caused by failed identification of multi-value levels. The code Y is restored at the following processing blocks to an errorless LMC and further restored to binary data D finally.

At the start, operation processing at an $S=YH^t$ block is applied to derive a syndrome from the code Y. If the Lee metric of $S_0$ derived at this operation processing is larger than 2, there are 3 or more individual error code components surely. In this case, error correction may not be achieved through the method of solving in the case of $\epsilon=2$. Therefore, an NG signal is provided to external and an error-uncorrected code Y is sent directly to the output side.

In addition, if the syndrome vector is S=0, no error arises. Accordingly, the code Y is sent directly to the output side as expected.

In the case of other syndromes, the polynomials $\lambda(x)$ and $v(x)$, which can be derived from the polynomial $\Psi(x)$ and $x^3$ through the Euclid iteration method, are directly derived by case classification of conditions on coefficients of $\Psi(x)$ regardless of the iteration method. Therefore, the polynomial Ψ(x) is computed from the syndrome S=(S$_0$, S$_1$, S$_2$) to obtain a solution in accordance with the case classification of conditions.

The process of deriving a solution of the equation is diverged based on ψ$_1$ and ψ$_2$ into three cases as shown in Expression 21, and further diverged based on the value of S$_0$ at every case. If no solution is found in each case, there are errors other than ϵ=2. This case is processed as no solution or NG, and an NG signal is provided. In this case, the code Y is sent directly to the output side as expected.

If solutions of the equation can be found, on the other hand, the position of the error component and the error quantity are derived from these solutions. Namely, if it is possible to obtain a root r and the multiplicity n, the position t=r$^{-1}$ and the error e$_t$ can be derived. Then, the derived error e$_t$ is used in c$_t$=y$_t$−e$_t$ to restore the code C.

The restored code C is converted at a ×G$^{-1}$ block into elements in Zp on digits of a p-adic number, and further converted at a binary conversion block into binary data D, which is provided to external.

Next, a specific computation process is shown and described along the flow of ECC processing described with reference to FIG. 34.

The process of creating data to be written in a cell array includes computations for creating a code C from symbols of data A. A specific example thereof is shown in Expressions 22-25.

$$m^{2k} \equiv (p-m)^{2k} \bmod p \quad \text{[Expression 22]}$$
$$m^{2k+1} \equiv -(p-m)^{2k+1} \bmod p$$

$$C = AG \quad \text{[Expression 23]}$$

$$G = \begin{bmatrix} 1 & 2 & \cdots & (p-2) & (p-1) \\ 1^2 & 2^2 & \cdots & (p-2)^2 & (p-1)^2 \\ & & \ddots & & \\ 1^{p-4} & 2^{p-4} & \cdots & (p-2)^{p-4} & (p-1)^{p-4} \end{bmatrix}$$

$$C_j = \sum_{i=0}^{p-5}(j)^{i+1}a_i = \sum_{i=0}^{p-5}{}_e(j)^{i+1}a_i + \sum_{i=1}^{p-4}{}_o(j)^{i+1}a_i \quad \text{[Expression 24]}$$

$$q_j = \sum_{i=0}^{p-5}{}_e(j)^{i+1}a_i$$

$$q_{p-j} = \sum_{i=0}^{p-5}{}_e(p-j)^{i+1}a_i = -\sum_{i=0}^{p-5}{}_e(j)^{i+1}a_i = -q_j$$

$$r_j = \sum_{i=1}^{p-6}{}_o(j)^{i+1}a_i$$

$$r_{p-j} = \sum_{i=1}^{p-6}{}_o(p-j)^{i+1}a_i = \sum_{i=1}^{p-6}{}_o(j)^{i+1}a_i = r_j$$

$$j < p/2 \quad \text{[Expression 25]}$$
$$c_j = q_j + r_j$$
$$c_{p-j} = -q_j + r_j$$

As shown in Expression 22, an even-power of an element m in Zp is congruent with an even-power of a Lee metric while an odd-power of the element m in Zp is equal to a minus element of an odd-power of the Lee metric. This relation is utilized in the above computations to reduce by half the computational complexity for the element.

The computation of code symbols derived from the relation C=AG shown in Expression 23 is decomposed into an even sum Σ$_e$ and an odd sum Σ$_o$ as shown in Expression 24, which are denoted with q$_j$ and r$_j$, respectively. In this case, symbols of a calculation code up to j<p/2 can be derived as c$_j$=q$_j$+r$_j$, c$_{p-j}$=−q$_j$+r$_j$ as shown in Expression 25. Therefore, a decoding table of powers of elements can be used to simplify computations.

Specific computation blocks are described next.

Figure 35:
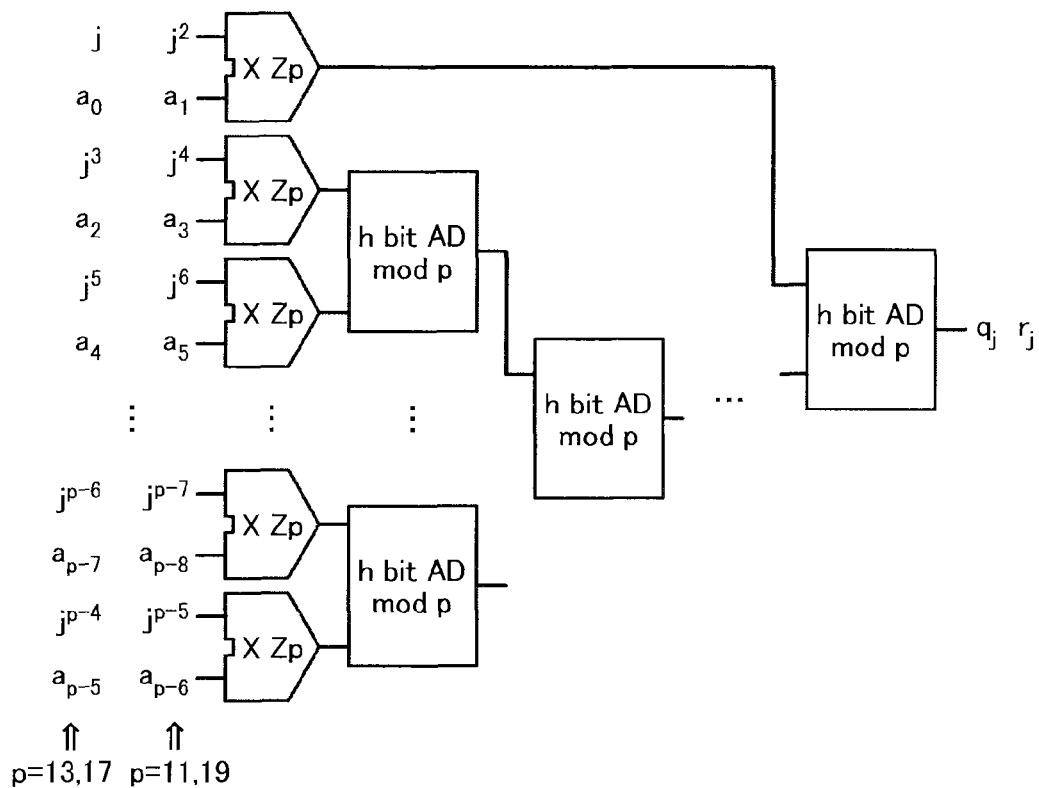
FIG. 35 is a circuit diagram of a computation block in the memory system according to the embodiment.
Figure 36:
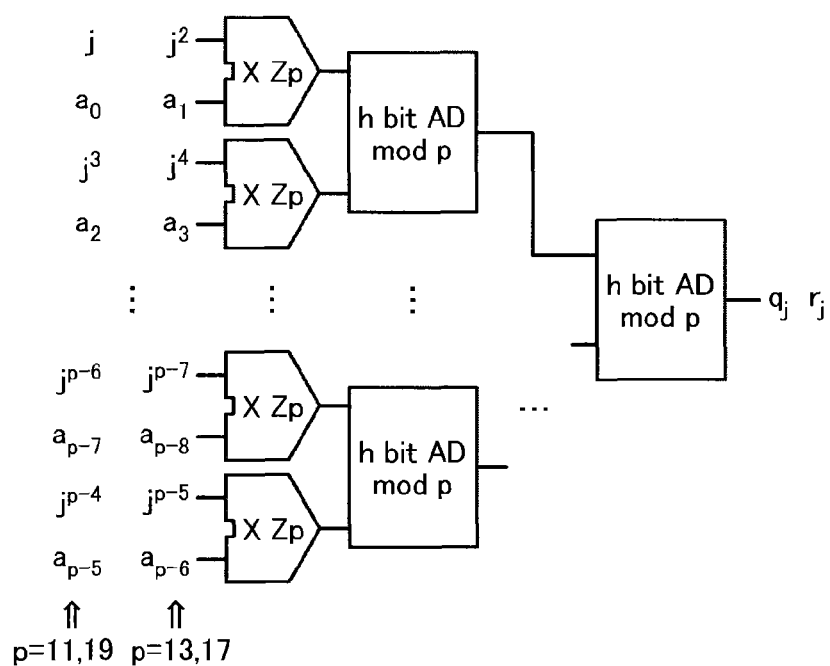
FIG. 36 is a circuit diagram of a computation block in the memory system according to the embodiment.

FIGS. 35 and 36 are circuit diagrams of computation blocks in the memory system according to the embodiment. FIGS. 35 and 36 show code symbol component computation blocks for deriving components q$_j$ and r$_j$ of a code symbol c$_j$ to be stored in a cell. In the shown case, primes are p=11, 13, 17, and 19.

As shown in FIGS. 35 and 36, in the case of the code symbol component computation blocks, the number of circuit blocks and the number of stages thereof vary in accordance with the value of a prime p. The reason is as follows. In the code symbol component computation blocks, the numbers of even components and odd components alternate in accordance with the prime p as the product of elements in Zp is executed two by two.

For example, q$_j$ at p=13 can be obtained using the inputs on the left side of the code symbol component computation block shown in FIG. 35. FIGS. 35 and 36 show general cases while the inputs and the number of stages of 'h bit AD mod p' circuit blocks can be determined specifically in accordance with the prime p. All circuit blocks contained in the code symbol component computation block are static circuits, which require no clock synchronization and of which outputs are decided when the inputs are decided.

As described above, the code symbol c$_j$ can be derived from the sum of q$_j$ and r$_j$ and the difference therebetween. Besides, the computation processing in the embodiment frequently uses computations for deriving differences. The following description is given to a circuit block for executing the sum and difference computations.

FIG. 37 is a diagram showing a block symbol of an 'h bit AD mod p' circuit block in the memory system according to the embodiment.

The 'h bit AD mod p' circuit block is a circuit operative to add the elements A and B in Zp together.

The 'h bit AD mod p' circuit block executes operation processing using numerical formulae shown in Expression 26.

$$A+B+FP0 \cdot p^* = A+B \bmod p$$

$$FP0=1 (\text{if } p \leq A+B)$$

$$FP0=0 (\text{if } A+B < p)$$

$$p^* = \mathrm{inv}(p)+1 \quad \text{[Expression 26]}$$

Namely, if the sum of binary expressions of the numerals A and B is smaller than the binary-expressed prime p, then FP0=0, and if larger, then FP0=1. From the sum of binary expressions of the numerals A and B, FP0·p is subtracted to yield an element in Zp.

FIG. 38 is a circuit diagram of a computation block operative to derive a difference in the memory system according to the embodiment.

Subtraction of A from B requires obtaining −A in Zp at the start. −A is an element that becomes congruent with zero when A is added thereto. An operation of obtaining −A and the operation in the Zp world differ from each other in the condition of subtracting p for seeking the complement of A as an h-bit number. Therefore, an 'h bit AD($2^h$) mod p' circuit block is required as a new circuit block.

This 'h bit AD($2^h$) mod p' circuit block executes operation processing using numerical formulae shown in Expression 27.

$$\text{inv}(A)+(p+1)+FP1 \cdot p^* = A^* + p + FP1 \cdot p^* = A \bmod p$$

$$FP1 = 1 \,(\text{if } p \leq A^* + p \bmod 2^h)$$

$$FP1 = 0 \,(\text{if } A^* + p < p \bmod 2^h)$$

$$p^* = \text{inv}(p)+1 \quad \text{[Expression 27]}$$

Namely, if the sum in binary of a prime p and the complement of A in h-bit binary is smaller than p, as a numeral within a range of h bits, that is, a numeral modulo $2^h$, then FP=0, and if larger, then FP1=1. FP1·p is subtracted to obtain the complement −A of A as an element in Zp.

Further, the operation processing in the embodiment frequently uses powers of elements in Zp. The powers of elements in Zp can be simply obtained by using a table when p is smaller, for example, p=13.

FIGS. 39-42 are power correspondence tables of elements in Zp in the memory system according to the embodiment. FIG. 39 shows an instance of p=11, FIG. 40 shows an instance of p=13, FIG. 41 shows an instance of p=17, and FIG. 42 shows an instance of p=19.

If decoders are configured on the basis of the power correspondence tables of elements in Zp shown in FIGS. 39-42, it is possible to obtain the powers of elements in Zp without using any computation circuit. According to the nature of elements in Zp, even-powers of an element in the case of an element m are equal to those in the case of p-m while odd-powers of an element in the case of an element m are different in sign from those in the case of p-m. Therefore, there is room for simplifying the configuration of the decoder though FIGS. 39-42 show all except those becoming obvious one. In addition, even-powers of p-m are underlined.

The following description is given to a computation process for generating a syndrome S from a code Y read from a cell.

Expressions 28-32 show a specific example of computations for generating the syndrome S from data Y in the case of $\epsilon=2$.

$$A = YH^t \quad \text{[Expression 28]}$$

$$H = \begin{bmatrix} 1 & 1 & \cdots & 1 & 1 \\ 1^1 & 2^1 & \cdots & (p-2)^1 & (p-1)^1 \\ 1^2 & 2^2 & \cdots & (p-2)^2 & (p-1)^2 \end{bmatrix} \quad \text{[Expression 29]}$$

-continued $$S_0 = \sum_{j=1}^{p-1} y_j = \sum_{j=1}^{p-1} e_j \quad \text{[Expression 30]}$$

$$S_1 = \sum_{j=1}^{p-1} (j)^1 y_j = \sum_{j=1}^{p-1} (j)^1 e_j$$

$$S_1 = \sum_{j=1}^{p-1} (j)^1 y_j = \sum_{j=1}^{(p-1)/2} (j)^1 y_j + \sum_{j=(p-1)/2+1}^{p-1} (j)^1 y_j$$

$$\sum_{j=(p-1)/2+1}^{p-1} (j)^1 y_j =$$

$$\sum_{j=1}^{(p-1)/2} (p-j)^1 y_{(p-j)} = (-1)^1 \sum_{j=-}^{(p-1)/2} (j)^1 y_{-j}$$

$$S_1 = \sum_{j=1}^{(p-1)/2} (j)^1 (y_j + (-1)^1 y_{-j})$$

$$u_1 = \sum_{j=1}^{(p-1)/2} (j)^1 y_j \quad \text{[Expression 31]}$$

$$v_1 = \sum_{j=1}^{(p-1)/2} (j)^1 y_{-j}$$

$$S_{0,2} = u_{0,2} + v_{0,2} \quad \text{[Expression 32]}$$

$$S_1 = u_1 - v_1$$

In the case of $\epsilon=2$, a matrix H is of 3 rows and p−1 columns as shown in Expression 29. When the sum of elements in Zp is divided by (p−1)/2, as mentioned in the description with reference to FIGS. 39-42, even-powers of an element in the case of an element j are equal to those in the case of p-j while odd-powers of an element in the case of an element j are different in sign from those in the case of p-j. Therefore, the syndrome component $S_1$ can be divided into two parts as shown in Expression 30. In addition, when $u_1$ and $v_1$ are defined as shown in Expression 31, syndrome components $S_0$ and $S_2$ can be represented by the sum of $u_1$ and $v_1$, and the syndrome component $S_1$ can be represented by the difference between $u_1$ and $v_1$.

The following description is given to a specific example of computation blocks for $u_1$ and $v_1$ shown in Expression 31.

Figure 43:
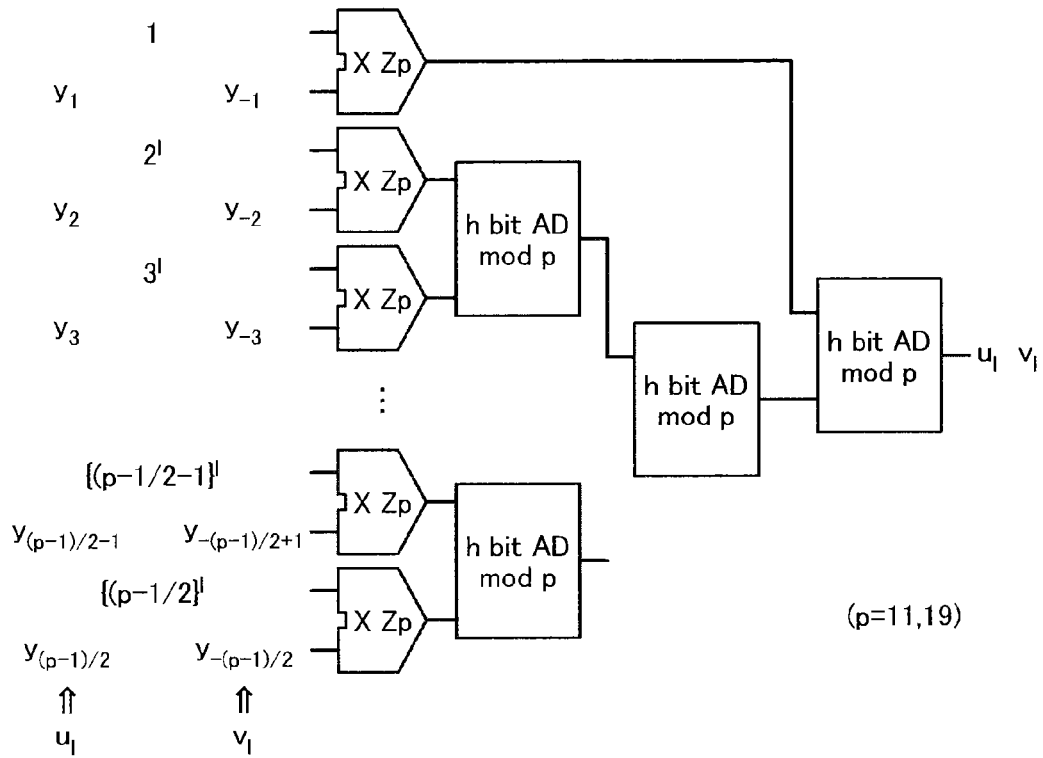
FIG. 43 is a circuit diagram of a computation block in the memory system according to the embodiment.
Figure 44:
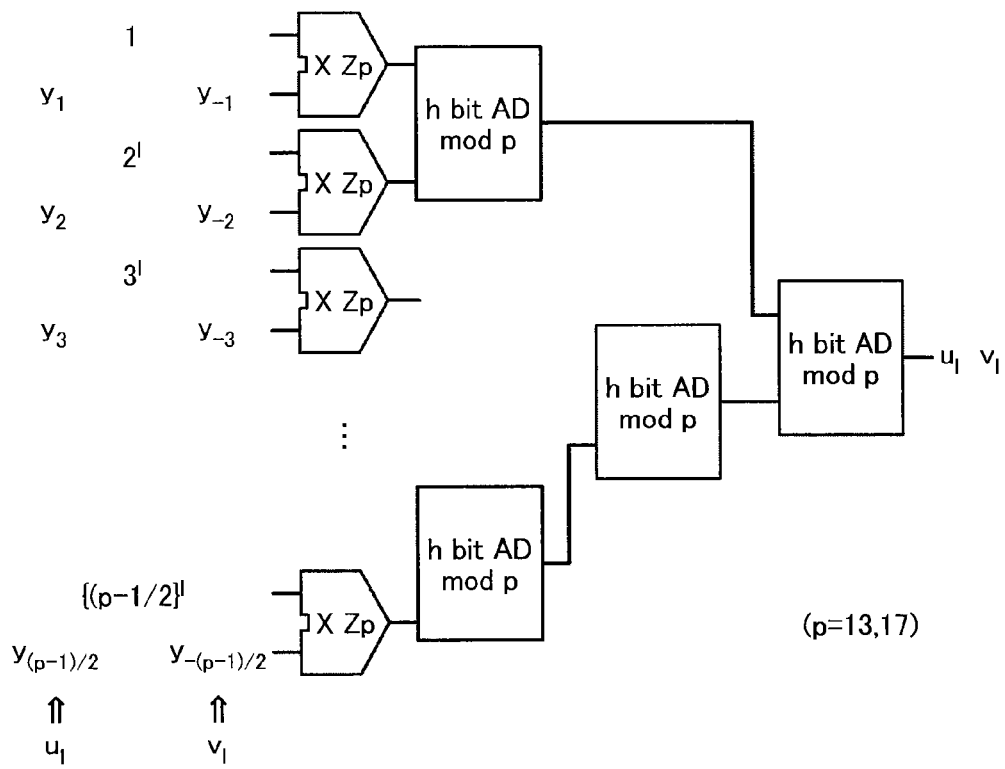
FIG. 44 is a circuit diagram of a computation block in the memory system according to the embodiment.

FIGS. 43 and 44 are circuit diagrams of computation blocks in the memory system according to the embodiment. In the shown case, primes are p=11, 13, 17 and 19. FIG. 43 shows an instance of p=11 and 19, and FIG. 44 shows an instance of p=13 and 17.

The product of elements in Zp is executed two by two. Therefore, depending on the cases of even and odd (p−1)/2, the number of 'x Zp' circuit blocks for product operation is changed so that the configuration of the computation block varies.

For example, in the case of p=13, the inputs on the left side of FIG. 44 are used to obtain $u_1$. In addition, the inputs shown on the right side of FIG. 44 are used to obtain $v_1$. All 1-powered inputs in Zp are identical.

FIGS. 43 and 44 show general cases while the inputs and the number of stages of 'h bit AD mod p' circuit blocks can be determined specifically in accordance with the prime p. All circuit blocks contained in a $u_1/v_1$ computation block are static circuits, which require no clock synchronization and of which outputs are decided when the inputs are decided.

Hereinafter, an error searching process using a syndrome is described.

First, a polynomial that matches the key condition obtained through the Euclid method is used. Substitution of $\lambda(x)=0$ and $V(x)=0$ is made and a common constant factor is factored out from the above polynomial. The remaining polynomial is shown in FIG. 45.

FIG. 45 is a table showing divergences and syndromes of a searching equation of Zp in the memory system according to the embodiment.

When a solution that satisfies the polynomial shown in FIG. 45 is derived in the case of each divergence, the place of the occurrence of an error and the magnitude of the error can be obtained. In accordance with the conditions for $\psi_1$ and $\psi_2$, there are three cases including cases 1-3 as shown in FIG. 45. Each case further diverges in accordance with the value of $S_0$. A $J_+$ row in each $S_0$ row corresponds to $\lambda(x)$. When errors e are +1 or +2, they each are +1 in the case of a single root and +2 in the case of double roots. A $J_-$ in each $S_0$ row corresponds to $V(x)$. When errors e are −1 or −2, they each are −1 in the case of a single root and −2 in the case of double roots.

As the condition-diverged polynomial is a quadratic equation at the maximum, the following description is given to a general method of solving this quadratic equation in Zp.

When a general quadratic equation is represented by $x^2+Ax+B=0$, and $x=y-\alpha$, $\alpha=A/2$, $D=(\alpha^2-A\alpha+B)=\alpha_2-B$ are given, $y^2=D$ is established. This equation can be solved if Zp has a quadratic residue D. When one of solutions of $y^2=D$ is y ($<p/2$), p-y is also a solution. Thus, a quadratic equation of x has roots obtained as $r1=y-\alpha$ and $r2=-y-\alpha$. If D is not a quadratic residue, $y^2=D$ has no solution, and the corresponding error is not equivalent to that in the case of $\epsilon=2$.

The number of possible values of D in Zp is equal to p. Even in the case of p=19, it is sufficient to execute decoding for p/2 or lower elements of the elements in Zp. Therefore, only nine decoders are required to obtain solutions.

The use of the solutions of $y^2=D$ obtained above makes it possible to decide the positional quantities of error components depending on whether the divergence is $J_+$ or $J_-$.

Namely, when a quadratic equation has solutions $r_1$, $r_2$ and a linear solution has a solution s, the error symbol position and the error quantity in the case of $J_+$ are as in Expression 33.

$S_0=2$:

$t_1=r_1^{-1}, t_2=r_2^{-1}: e=1$ $t_1=t_2: e=2$ $S_0=1$:

$t=s^{-1}: e=1$ [Expression 33]

In addition, the error symbol position and the error quantity in the case of $J_-$ are as in Expression 34.

$S_0=2$:

$t_1=r_1^{-1}, t_2=r_2^{-1}: e=-1$ $t_1=t_2: e=-2$ $S_0=1$:

$t=s^{-1}: e=-1$ [Expression 34]

The following description is given to the forms of condition-diverged equations and solutions thereof in specific examples, and the major quantities required in computation processes thereof.

A syndrome before divergence and the basic quantity obtained therefrom are as in Expression 35.

$\underline{S_0}, \underline{S_1}=-\psi_1$, $\underline{S_2} \rightarrow \underline{a}=2\psi_2=S_1^2-S_2$, $\underline{b}=2(\psi_1^2-\psi_2)=S_1^2+S_2$ [Expression 35]

The condition-diverged equations are given divergence numbers (s−1) to (s−6) and shown in Expressions A36-41, respectively.

(s−1):

$\psi_2 x^2+\psi_1 x+1=0 \rightarrow x^2-(2S_1/a)x+(2/a)=0$ $\underline{\alpha}=-S_1/a$ $\underline{A}=\alpha^2-(2/a)$ $r_1=A^{1/2}-\alpha, r_2=-A^{1/2}-\alpha$ [Expression 36]

(s−2):

$x^2+\{\psi_1/(\psi_1^2-\psi_2)\}x+1/(\psi_1^2-\psi_2)=0 \rightarrow x^2+(2S_1/b)x+(2/b)=0$ $\underline{\beta}=S_1/b$ $\underline{B}=\beta^2-(2/b)$ $r_1=B^{1/2}-\beta, r_2=-B^{1/2}-\beta$ [Expression 37]

(s−3):

$x^2-(1/\psi_1)x+1/\psi_1^2=0 \rightarrow x^2+(1/S_1)x+(1/S_1^2)=0$ $\gamma=1/(2S_1)$ $C=\gamma^2-(1/S_1^2)=-3\gamma^2$ $r_1=C^{1/2}-\gamma=\gamma\{(p-3)^{1/2}-1\}, r_2=-C^{1/2}-\gamma=\gamma\{-(p-3)^{1/2}-1\}$ $p=11: r_1=\gamma\{(8)^{1/2}-1\}, r_2=\gamma\{-(8)^{1/2}-1\}(8)^{1/2}=$ no solution $p=13: r_1=\gamma\{(10)^{1/2}-1\}=5\gamma, r_2=\gamma\{-(10)^{1/2}-1\}=6\gamma(10)^{1/2}=6,7$ $p=17: r_1=\gamma\{(14)^{1/2}-1\}, r_2=\gamma\{-(14)^{1/2}-1\}(14)^{1/2}=$ no solution $p=19: r_1=\gamma\{(16)^{1/2}-1\}=3\gamma, r_2=\gamma\{-(16)^{1/2}-1\}=14\gamma(16)^{1/2}=4,15$ [Expression 38]

(s−4):

$\psi_1 x+1=0 \rightarrow -S_1 x+1=0$ $s=1/S_1=2\gamma$ [Expression 39]

(s−5):

$(\psi_1^2-\psi_2)x+\psi_1=0 \rightarrow (b/2)x-S_1=0$ $s=2S_1/b=2\beta$ [Expression 40]

(s−6):

$x-\psi_1/\psi_2=0 \rightarrow x+2S_1/a=0$ $s=-2S_1/a=2\alpha$ [Expression 41]

In the case of (s−1), as shown in Expression 36, $\alpha=-S_1/a$ and $A=\alpha^2-(2/a)$ are required, and two roots are determined.

In the case of (s−2), as shown in Expression 37, $\beta=S_1/b$ and $B=\beta^2-(2/b)$ are required, and two roots are determined.

In the case of (s−3), as shown in Expression 38, $\gamma=1/(2S_1)$ is required. Roots are decided by p, and two roots are determined. In the case of p=11, 17, however, no corresponding quadratic residue exists and accordingly no solution exists.

In the cases of (s–4) to (s–6), a linear equation is applied.

In the case of (s–4), as shown in Expression 39, one root is determined by s=2γ.

In the case of (s–5), as shown in Expression 40, one root is determined by s=2β.

In the case of (s–6), as shown in Expression 41, one root is determined by s=2α.

The underlines in Expressions 35-41 indicate the important quantities required at the time of seeking the positions of errors.

The following description is given to a computation process for obtaining the quantities from the syndrome $S_0, S_1, S_2$ in turn, and a computation process for obtaining the final error position and quantity from the polynomials diverged on the basis of the obtained quantities.

Computation procedures of elements are shown in Expression 42, and solutions of the diverged searching equations are shown in Expression 43.

$S_0, S_1, S_2$ $\Rightarrow a = S_1^2 - S_2, \; b = S_1^2 + S_2$ $\Rightarrow -\alpha = S_1 a^{-1}, \; \beta = S_1 b^{-1}, \; 2a^{-1}, \; 2b^{-1}$ $\Rightarrow A = \alpha^2 - 2a^{-1}, \; B = \beta^2 - 2b^{-1}$ $\Rightarrow$ Case 1, Case 2, Case 3  [Expression 42]

[Expression 43]

$a \neq 0, \; b \neq 0$ $S_0 = 2$:

(s–1)

$t_1 = r_1^{-1} = (A^{1/2} - \alpha)^{-1} e_{t_1} = 1$ $t_2 = r_2^{-1} = (-A^{1/2} - \alpha)^{-1} e_{t_2} = 1$ $S_0 = 0$:

(s–5)

$t_1 = s^{-1} = (2\beta)^{-1} e_{t_1} = 1$ (s–6)

$t_2 = s^{-1} = (2\alpha)^{-1} e_{t_2} = -1$ $S_0 = -2$:

(s–2)

$t_1 = r_1^{-1} = (B^{1/2} - \alpha)^{-1} e_{t_1} = -1$ $t_2 = r_2^{-1} = (-B^{1/2} - \alpha)^{-1} e_{t_2} = -1$   Case 1:

$a \neq 0, \; b = 0$ $S_0 = 2$:

(s–1)

$t_1 = r_1^{-1} = (A^{1/2} - \alpha)^{-1} e_{t_1} = 1$ $t_2 = r_2^{-1} = (-A^{1/2} - \alpha)^{-1} e_{t_2} = 1$ $S_0 = -1$:

(s–6)

$t = s^{-1} = (2\alpha)^{-1} e_t = -1$   Case 2:

$S_1 \neq 0, \; a = 0$ $S_0 = 1$:

(s–4)

$t = s^{-1} = (2\gamma)^{-1} = S_1 e_t = 1$ $S_0 = -2$:

(s–3)

$p = 13$ $t_1 = (5\gamma)^{-1} = 8\gamma^{-1} = 3 S_1 e_{t_1} = -1$ $t_2 = (6\gamma)^{-1} = 11\gamma^{-1} = 9 S_1 e_{t_2} = -1$ $p = 19$ $t_1 = (3\gamma)^{-1} = 13\gamma^{-1} = 7 S_1 e_{t_1} = -1$ $t_2 = (14\gamma)^{-1} = 15\gamma^{-1} = 11 S_1 e_{t_2} = -1$   Case 3:

As shown in Expression 42, at the start, a and b are computed. Subsequently, $-\alpha, \beta, 2a^{-1}, 2b^{-1}$ are computed from a and b. Subsequently, A and B are computed from $-\alpha, \beta, 2a^{-1}, 2b^{-1}$. In the computation process up to now, the inverse element of a zero element is used as a zero element for convenience to advance the computation.

Subsequently, based on the obtained a, b, they are diverged into cases 1-3 shown in Expression 43, and further diverged into groups of solutions corresponding to $S_0$ among the divergences. Through the above computation processes, the positions $t_1, t_2, t$ of error symbols and the quantities of the errors can be obtained.

The following description is given to correspondence relations among elements in Zp, and inverse elements and square roots thereof present in methods of solving a searching equation of Zp.

FIGS. 46-49 are correspondence tables of elements in Zp, and inverse elements, squares and square roots thereof in the memory system according to the embodiment. FIG. 46 shows an instance of p=11, FIG. 47 shows an instance of p=13, FIG. 48 shows an instance of p=17, and FIG. 49 shows an instance of p=19.

With respect to the squares of elements in Zp, as an element m equal to or below p/2 corresponds to an element p-m, only the correspondence table of elements of 1 to p/2 is sufficient. In FIGS. 44-47, elements above p/2 are underlined. As for the inverse elements of elements in Zp, a zero element has no meaning though it is related to zero for convenience of computation to prevent a failure of computation. At the time of divergence, however, a computation result of division by such zero is excluded so as not to exert an influence on the process of solution searching. As for square roots of elements in Zp, they only exist in elements that are quadratic residues in Zp. Accordingly, FIGS. 46-49 show them with '–'. In the absence of square roots for elements in Zp, it is not possible to execute a root computation of the equation. Accordingly, solution searching is finished at that time. This corresponds to the case where an NG signal is provided to external from the memory controller.

The following description is given to computation blocks operative to compute the major quantities present in computation processes for deriving solutions of searching equations.

Figure 50:
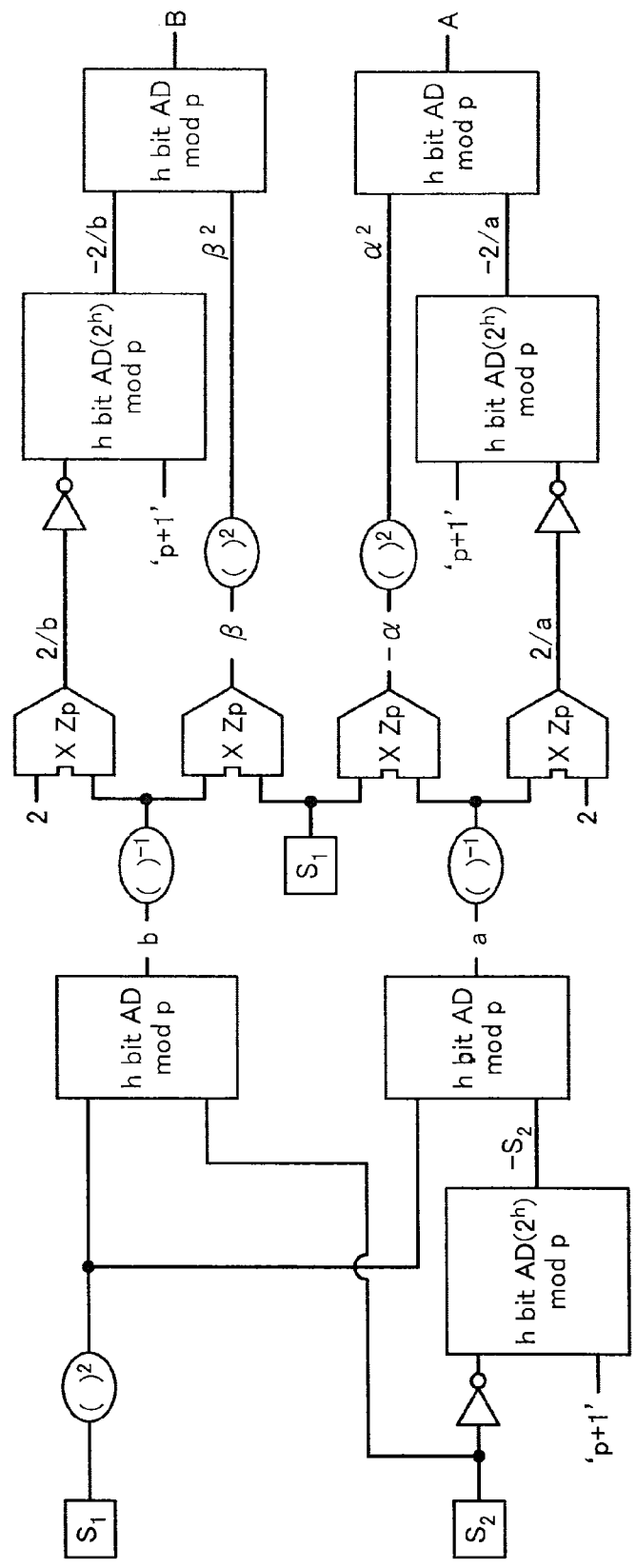
FIG. 50 is a circuit diagram of a computation block in the memory system according to the embodiment.

FIG. 50 is a circuit diagram of a computation block in the memory system according to the embodiment. The computation block shown in FIG. 50 is operative to compute A and B from syndrome elements $S_1$ and $S_2$. A circuit block shown with an ellipse in FIG. 50 is a decoder based on the correspondence table of an element shown in ( ) and a power thereof. The computation block further includes inverters, circuit blocks for seeking the sum, and circuit blocks for seeking the product.

All circuit blocks contained in the computation block are static circuits, and processing by the computation block proceeds in asynchronous with clocks. Based on the quantities herein obtained, computations for seeking solutions diverge.

The divergences include comparisons of quantities and switching of computation paths, which can be assembled by logics of asynchronous circuits. Hereinafter, individual circuit blocks after divergence are described.

The following description is given to circuit blocks operative to compute $t_1$, $t_2$ and t representative of the positions of error-caused symbols in accordance with divergences.

Figure 51:
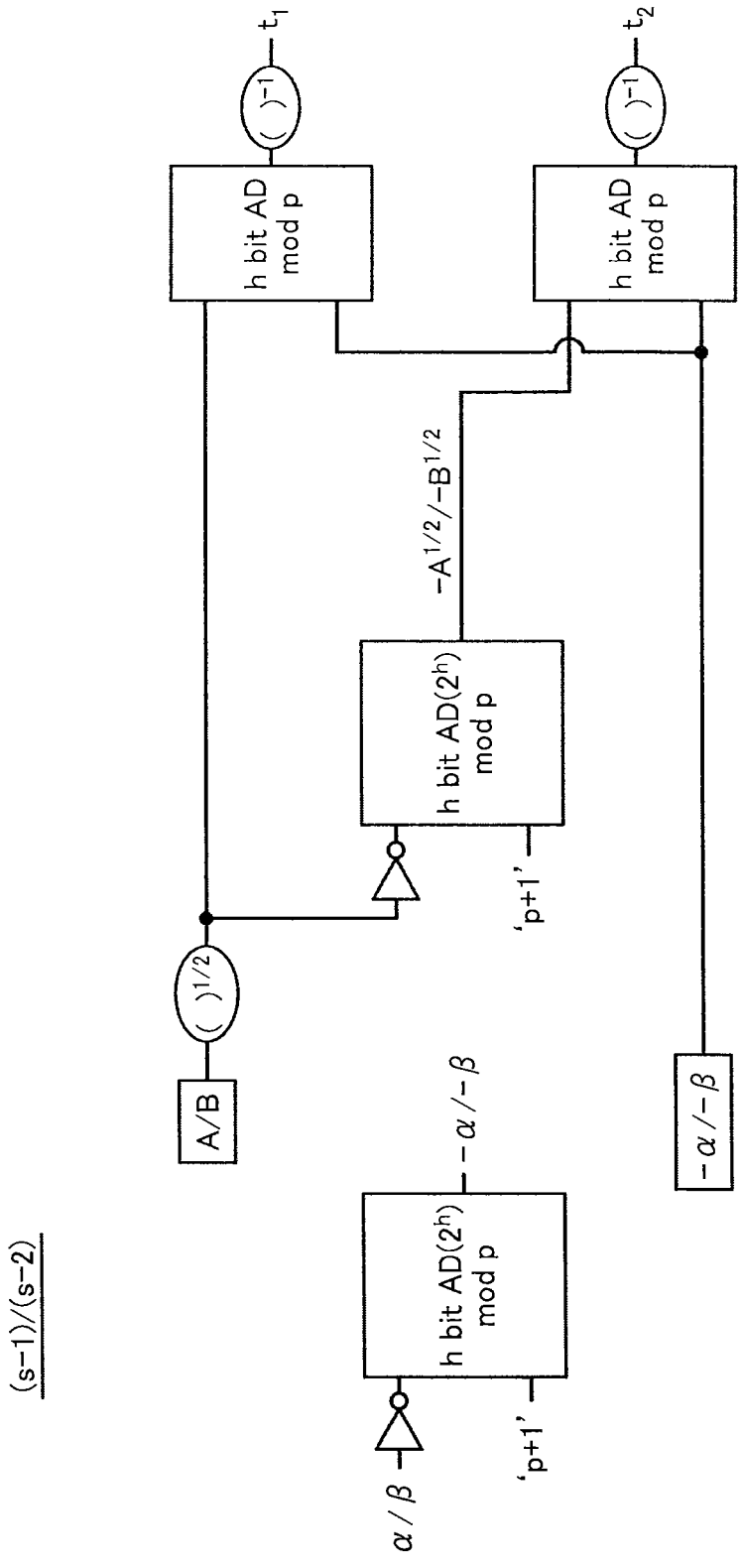
FIG. 51 is a circuit diagram of a computation block in the memory system according to the embodiment.
Figure 52:
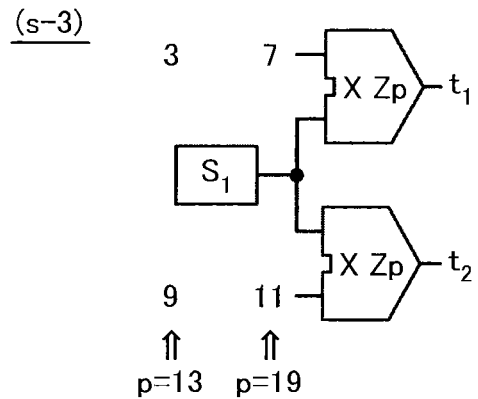
FIG. 52 is a circuit diagram of a computation block in the memory system according to the embodiment.
Figure 53:
FIG. 53 is a circuit diagram of a computation block in the memory system according to the embodiment.
Figure 54:
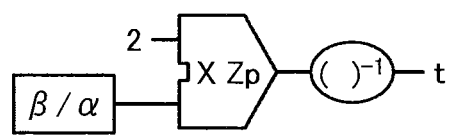
FIG. 54 is a circuit diagram of a computation block in the memory system according to the embodiment.

FIGS. 51-54 are circuit diagrams of computation blocks in the memory system according to the embodiment. FIG. 51 shows an instance of (s-1) or (s-2) shown in Expression 43, FIG. 52 shows an instance of (s-3) shown in Expression 43, FIG. 53 shows an instance of (s-4) shown in Expression 43, and FIG. 54 shows an instance of (s-5) or (s-6) shown in Expression 43. Part of circuit blocks in FIG. 51 is given '/'. The value ahead of '/' is a value used in the case of (s-1) while the value behind '/' is a value used in the case of (s-2). Similarly, part of circuit blocks in FIG. 54 is given '/'. The value ahead of '/' is a value used in the case of (s-5) while the value behind '/' is a value used in the case of (s-6).

These computation blocks can be used before and after divergence. In a word, before divergence, the results computed previously using these computation blocks are selected in accordance with the divergence conditions. On the other hand, after divergence, divergences of (s-1) to (s-6) are executed in advance and a computation block corresponding to each divergence is used in computation to obtain a result. When these computation blocks are used before divergence, no corresponding element may exist in the computation process. Accordingly, ready for such the case, each computation block prepares an output circuit for providing an NG signal to the outside of the memory controller. In addition, as for α and β, sign-different quantities (complements in Zp) are required. Accordingly, circuits for obtaining these quantities are provided.

As the error quantities are determined in accordance with respective divergences, they can be obtained with no computation. In the case of $t_1 = t_2$, however, double roots exist. Therefore, the error quantities become ±2 depending on divergences. This point should be noted.

The following description is given to a process of converting an LMC code C into symbols of data A in Zp after error correction. Relational equations used in this conversion process are shown in Expressions 43-47. In Expressions 46 and 47, a suffix 'rev(m)' indicates an inverse element of an element m in Zp.

$$A = CG^{-1} \quad \text{[Expression 43]}$$

$$G^{-1} = (p - 1) \begin{bmatrix} 1^{-1} & 1^{-2} & \ldots & 1^{-p+3} & 1^{-p+4} \\ 2^{-1} & 2^{-2} & \ldots & 2^{-p+3} & 2^{-p+4} \\ \vdots & \vdots & \ldots & \vdots & \vdots \\ (p-2)^{-1} & (p-2)^{-2} & \ldots & (p-2)^{-p+3} & (p-2)^{-p+4} \\ (p-1)^{-1} & (p-1)^{-2} & \ldots & (p-1)^{-p+3} & (p-1)^{-p+4} \end{bmatrix} \quad \text{[Expression 44]}$$

$$a_i = (p-1)\sum_{j=1}^{p-1}(j)^{-i-1}c_j = (p-1)\sum_{j=1}^{p-1}(j^{-1})^{i+1}c_j \quad \text{[Expression 45]}$$

$$a_i = (p-1)\sum_{m=1}^{p-1}(m)^{i+1}c_{rev(m)} = (p-1) \quad \text{[Expression 46]}$$

$$\left\{ \sum_{m=1}^{(p-1)/2}(m)^{i+1}c_{rev(m)} + \sum_{m=(p-1)/2+1}^{p-1}(m)^{i+1}c_{rev(m)} \right\}$$

$$\sum_{m=1}^{p-1}(m)^{i+1}c_{rev(m)} = \sum_{m=1}^{(p-1)/2}(p-m)^{i+1}c_{rev(p-m)} =$$

$$(-1)^{i+1}\sum_{m=1}^{(p-1)/2}(m)^{i+1}c_{rev(-m)}$$

$$a_i = (p-1)\sum_{m=1}^{(p-1)/2}(m)^{i+1}(c_{rev(m)} + (-1)^{i+1}c_{rev(-m)})$$

$$Q_i = \sum_{m=1}^{(p-1)/2}(m)^{i+1}c_{rev(m)} \quad R_i = \sum_{m=1}^{(p-1)/2}(m)^{i+1}c_{rev(-m)} \rightarrow \quad \text{[Expression 47]}$$

i:odd
$$a_i = (p-1)(Q_i + R_i)$$
i:even
$$a_i = (p-1)(Q_i + R_i)$$

A right inverse matrix $G^{-1}$ of the generator matrix G is as shown in Expression 44. In addition, a symbol $a_i$ of data is the sum of certain powers of all inverse elements of the elements in Zp as shown in Expression 45.

All inverse elements are equal to all elements, and an inverse element of p-m is equal to an element that corresponds to an inverse element of m but has a minus sign. Accordingly, through the rearrangement of the sum and the division by the sum of m=1 to (p-1)/2, each $a_i$ becomes the sum of Qi and Ri and the difference therebetween as shown in Expression 47. Qi and Ri are the sum of the products of powers of (p-1)/2 from code components and components l in Zp. As shown in Expression 47, $a_i$ is the sum of Qi and Ri if i is odd while $a_i$ is the difference between Qi and Ri if i is even.

Computation circuits of Qi and Ri are described next.

Figure 55:
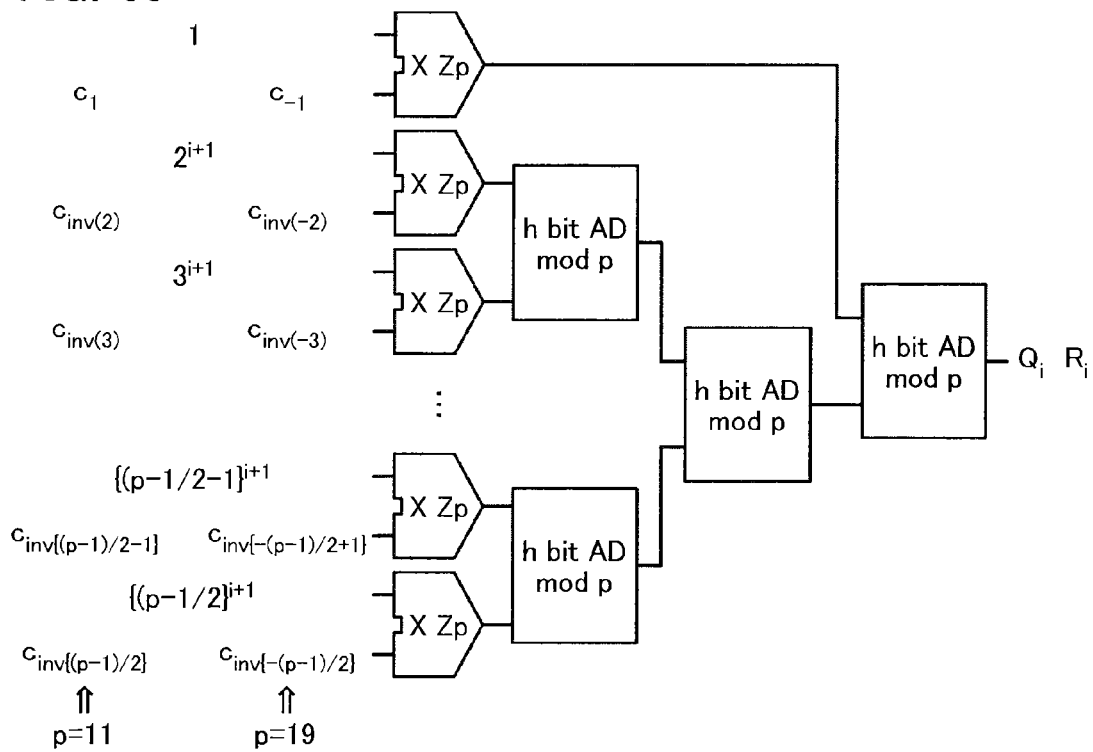
FIG. 55 is a circuit diagram of a computation block in the memory system according to the embodiment.
Figure 56:
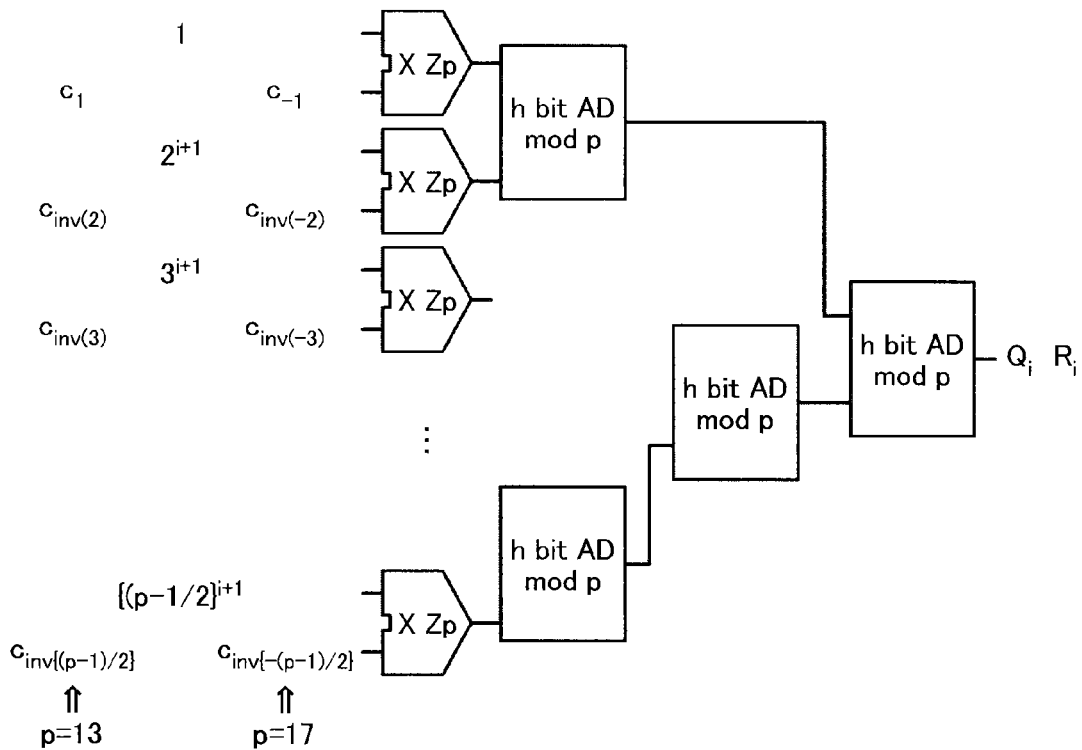
FIG. 56 is a circuit diagram of a computation block in the memory system according to the embodiment.

FIGS. 55 and 56 are circuit diagrams of computation blocks in the memory system according to the embodiment. FIGS. 55 and 56 both show computation blocks for deriving Qi and Ri. FIG. 55 shows instances of p=11 and 19, and FIG. 56 shows instances of p=13 and 17.

As the product of elements in Zp is executed two by two, the number of 'X Zp' circuit blocks for product operation varies depending on whether (p-1)/2 is even or odd, and the circuitry of the computation block varies correspondingly.

In FIGS. 55 and 56, two quantities are shown for certain inputs. The order of these two quantities corresponds to the order of two quantities shown in the output. For example, in the case of p=13, $Q_i$ can be obtained using the inputs on the left side in FIG. 55 while $R_i$ can be obtained using the inputs on the right side in FIG. 56. All (i+1)-powered inputs in Zp are identical.

FIGS. 55 and 56 show general cases while specific inputs and the number of stages of 'h bit AD mod p' circuit blocks can be determined in accordance with the prime p. The computation blocks shown in FIGS. 55 and 56 are static circuits, which require no clock synchronization and of which outputs are decided when the inputs are decided.

As from the above, the present embodiment makes it possible to construct a memory system of the three-dimensional cross-point type having a higher cell share.

[Others]

While the embodiments of the present invention have been described, these embodiments are presented by way of example and are not intended to limit the scope of the invention. These novel embodiments can be implemented in a variety of other forms, and various omissions, substitutions and changes can be made without departing from the spirit of the invention. These embodiments and variations thereof would fall within the scope and spirit of the invention and also fall within the invention recited in claims and equivalents thereof.

What is claimed is:

1. A memory system having three mutually intersecting directions defined as a first direction, a second direction, and a third direction, comprising;
    a semiconductor substrate having a principal plane extending in the first direction and the second direction; and
    a cell array including plural first lines extending in the third direction, plural second lines extending in the first direction, plural third lines extending in the second direction and provided between said semiconductor substrate and a formation region of said plural first lines, and plural cells formed at intersections of said plural first lines and said plural second lines and having three or more settable physical quantity levels, wherein
    said cell array includes plural transistor layers stacked in the third direction and provided between said plural first lines and said plural third lines,
    said plural transistor layers include plural transistors operative to electrically connect said plural first lines selectively to one of said plural third lines,
    said plural transistors each include a conduction channel composed of polysilicon or an oxide semiconductor and have a gate length extending in the third direction,
    said cell array includes a logic circuit containing plural transistors and operative to connect between said first lines and said third lines, and
    said plural transistors contained in said logic circuit are formed dispersedly in a first and a second transistor layer adjacent in the third direction of the plural transistor layers.

2. The memory system according to claim 1, wherein the number of transistors formed in said first transistor layer is smaller than the number of transistors formed in said second switch layer.

3. The memory system according to claim 1, wherein the conductance of said transistor formed in said first transistor layer is larger than the conductance of said transistor formed in said second transistor layer.

4. The memory system according to claim 1, wherein the number of transistors belonging to said first transistor layer is smaller than the number of transistors belonging to said second transistor layer among said plural transistors contained in said logic circuit.

5. The memory system according to claim 1, wherein said transistor has a pillar-shaped conduction channel extending in the third direction and two gates formed so as to sandwich said conduction channel therebetween.

6. The memory system according to claim 1, wherein said plural cells each include a variable resistance element having a resistance variable in accordance with filament formation by metal ions.

* * * * *